(12) United States Patent
Stoddart et al.

(10) Patent No.: US 11,560,644 B2
(45) Date of Patent: Jan. 24, 2023

(54) SUPRAMOLECULAR TESSELLATION OF RIGID TRIANGULAR MACROCYCLES

(71) Applicants: NORTHWESTERN UNIVERSITY, Evanston, IL (US); King Abdulaziz City for Science and Technology, Riyadh (SA)

(72) Inventors: James Fraser Stoddart, Evanston, IL (US); Yassine Beldjoudi, Whelling, IL (US)

(73) Assignees: Northwestern University, Evanston, IL (US); King Abdulaziz City for Science and Technology (KACST), Riyadh (SA)

( * ) Notice: Subject to any disclaimer, the term of this patent is extended or adjusted under 35 U.S.C. 154(b) by 57 days.

(21) Appl. No.: 17/006,031

(22) Filed: Aug. 28, 2020

(65) Prior Publication Data

US 2021/0062365 A1 Mar. 4, 2021

Related U.S. Application Data

(60) Provisional application No. 62/892,741, filed on Aug. 28, 2019.

(51) Int. Cl.
| | | |
|---|---|---|
| C30B 29/68 | (2006.01) | |
| C30B 7/06 | (2006.01) | |
| C30B 29/54 | (2006.01) | |
| C30B 29/66 | (2006.01) | |

(52) U.S. Cl.
CPC ............... *C30B 29/68* (2013.01); *C30B 7/06* (2013.01); *C30B 29/54* (2013.01); *C30B 29/66* (2013.01)

(58) Field of Classification Search
CPC ......... C30B 29/68; C30B 29/54; C30B 29/66; C30B 7/06
See application file for complete search history.

(56) References Cited

U.S. PATENT DOCUMENTS

| | | |
|---|---|---|
| 5,700,298 A | 12/1997 | Shi |
| 9,546,169 B2 | 1/2017 | Stoddart |
| 10,745,418 B2 | 8/2020 | Stoddart |
| 2016/0130271 A1 | 5/2016 | Stoddart |
| 2016/0276669 A1 | 9/2016 | Chen |
| 2019/0016738 A1 | 1/2019 | Stoddart |
| 2019/0077804 A1 | 3/2019 | Stoddart |

FOREIGN PATENT DOCUMENTS

| | | |
|---|---|---|
| WO | 2013004677 A1 | 1/2013 |
| WO | 2014067574 A1 | 5/2014 |
| WO | 2012121145 A1 | 7/2014 |
| WO | 2019144074 A1 | 7/2019 |

OTHER PUBLICATIONS

Shechtman, D. et al. Metallic Phase with Long-Range Orientational Order and No. Translational Symmetry. Phys. Rev. Lett. 1984, 53, 1951-1953.

(Continued)

*Primary Examiner* — Robert M Kunemund
(74) *Attorney, Agent, or Firm* — Quarles & Brady LLP

(57) ABSTRACT

Disclosed herein are crystalline compositions comprising tessellated rigid triangular macrocycles in a two-dimensional plane and methods of making the same.

19 Claims, 29 Drawing Sheets

(56) References Cited

OTHER PUBLICATIONS

Sheldrick, G., SHELXT—Integrated Space-Group and Crystal-Structure Determination. Acta. Cryst. A 2015, 71, 3-8.
Sheldrick, G.M. (1996). SADABS. Program for Empirical Absorption Correction. University of Gottingen, Germany.
Shen, Y. et al. Triangular-Shaped Molecular Random Tiling and Molecular Rotation in Two-Dimensional Glassy Networks. Nanoscale 2014, 6, 7221-7225.
Shukla, D. et al. Thin-Film Morphology Control in Naphthalene-Diimide-Based Semiconductors: High Mobility n-Type Semiconductor for Organic Thin-Film Transistors. Chem. Mater. 2008, 20, 7486-7491.
Song et al., Polymer-graphene nanocomposites as ultrafast-charge and -discharge cathodes for rechargeable lithium batteries. Nano Lett. May 9, 2012;12(5):2205-11.
Spruell, J. M. et al. Highly Stable Tetrathiafulvalene Radical Dimers in [3]Catenanes. Nat. Chem. 2010, 2, 870-879.
Talapin, D. V. et al. Quasicrystalline Order in Self-Assembled Binary Nanoparticle Supedattices. Nature 2009, 461, 964-967.
Tayi, A. S. et al. Room-Temperature Ferroelectricity in Supramolecular Networks of Charge-Transfer Complexes. Nature 2012, 488, 485-489.
Tsai, A. P. et al. Highly Active Quasi-Crystalline Al—Cu—Fe Catalyst for Steam Reforming of Methanol. Appl. Catal. A. 2001, 214, 237-241.
Tschierske, C. Liquid Crystal Engineering—New Complex Mesophase Structures and Their Relations to Polymer Morphologies, Nanoscale Patterning and Crystal Engineering. Chem. Soc. Rev. 2007, 36, 1930-1970.
Ueda, K. et al. Photonic Band Structure Calculations of Two-Dimensional Archimedean Tiling Patterns. Phys. Rev. B. 2007, 75, 195122.
Umland, T. C. et al. Relation Between Geometry and Charge Transfer in Low-Dimensional Organic Salts. J. Phys. Chem. 1988, 92, 6456.
Wartelle, C. et al. First Signals of Electrochemically Oxidized Species of TTF and TTM-TTF: A Study by in situ Spectroelectrochemical FTIR and DFT Calculations Phys Chem Chem. 2003, 5, 4672-4679.
Wu, Y., et al. "Charge and spin transport in an organic molecular square." Angewandte Chemie International Edition 54.41 (2015): 11971-11977.
Wu, Y., et al. Spin frustration in the triradical trianion of a naphthalenediimide molecular triangle. J. Am. Chem. Soc. 139, 2948-2951 (2017).
Wu, Z. H et al. 4,5,9,10-Pyrene Diimides: A Family of Aromatic Diimides Exhibiting High Electron Mobility and Two-Photon Excited Emission. Angew. Chem., Int. Ed. 2017, 56, 13031-13035.
Wurthner, F. et al. Naphthalene and Perylene Diimides for Organic Transistors. Chem. Common. 2011, 47, 5109-5115.
Xia, F. et al. Two-Dimensional Material Nanophotonics, Nat. Photonics 2014, 8, 899-907.
Xiufeng, S. et al. Two-Dimensional Semiconductors: Recent Progress and Future Perspectives. J. Mater. Chem. C 2013, 1, 2952-2969.
Xu, S.-Q. et al. Diversity of Covalent Organic Frameworks (COFs): A 2D COF Containing Two Kinds of Triangular Micropores of Different Sizes. ACS Macro Lett. 2016, 5, 99-102.
Yamada, J.-I. et al. New Trends in the Synthesis of p-Electron Donors for Molecular Conductors and Superconductors. Chem. Rev. 2004, 104, 5057-5084.
Yamamoto, S. et al. Nanopore-Induced Host—Guest Charge Transfer Phenomena in a Metal—Organic Framework. Chem. Sci 2018, 9, 3282-3289.
Yu, L. et al. Graphene/MoS2 Hybrid Technology for Large-Scale Two-Dimensional Electronics. Nano Lett. 2014, 14, 3055-3063.
Zhan, X. et al. Rylene and Related Diimides for Organic Electronics. Adv. Mater. 2011, 23, 268-284.
Zhang, F. et al. Complex Archimedean Tiling Self-Assembled from DNA Nanostructures. J. Am. Chem. Soc. 2013, 135, 7458-7461.
Zhang, F. et al. Self-Assembly of Complex DNA Tessellations by Using Low-Symmetry Multi-Arm DNA Tiles. Angew. Chem. Int. Ed. 2016, 128, 9006-9009.
Zhang, J. et al. Novel Multi-Stimuli Responsive Molecules Based on Photochromic Bithienylethenes Containing the Tetrathiafulvalene Unit. RSC Adv. 2016, 6, 16598-16601.
Girlando, A. et al. Charge Fluctuations and Electron-Phonon Coupling in Organic Charge-Transfer Salts with Neutral-Ionic and Peierls Transitions Synth. Met. 2004, 141, 129-138.
Zhao, Y-L. et al. A Bistable Pretzelane. Chem. Commun. 2009, 4844-4846.
Akinwande, D. et al. Two-Dimensional Flexible Nanoelectronics. Nat. Commun. 2014, 5, 5678.
Al Kobaisi, M. et al. Functional Naphthalene Diimides: Synthesis, Properties, and Applications. Chem. Rev. 2016, 116, 11685-11796.
Asari, T. et al. Archimedean Tiling Structures from ABA/CD Block Copolymer Blends Having Intermolecular Association with Hydrogen Bonding. Macromolecules 2006, 39, 2232-2237.
Au-Yeung, H. Y., et al. "Templated amplification of a naphthalenediimide-based receptor from a donor—acceptor dynamic combinatorial library in water." Chemical communications 4 (2009): 419-421.
Bain, G. A. et al. Diamagnetic Corrections and Pascal's Constants, J. Chem. Educ., 2008, 85, 532-536.
Barnes, J. C. et al. Semiconducting Single Crystals Comprising Segregated Arrays of Complexes of C60. J. Am. Chem. Soc., 2015, 137, 2392-2399.
Beldjoudi, Y. et al. Supramolecular Tessellation of Rigid Naphthalene Diimide Triangle. Abstract presented at ACS National Meeting. Apr. 2019. Orlando, Florida. One page.
Beldjoudi, Y. et al. Supramolecular Tessellation of Rigid Naphthalene Diimide Triangle. Poster presented at ACS National Meeting. Apr. 2019. Orlando, Florida. One page.
Bochevarov, A. D., et al. (2013). Jaguar: A high-performance quantum chemistry software program with strengths in life and materials sciences. International Journal of Quantum Chemistry, 113(18), 2110-2142.
Cai, S-L. et al. Tunable Electrical Conductivity in Oriented Thin Films of Tetrathiafulvalene-Based Covalent Organic Framework. Chem. Sci. 2014, 5, 4693-4700.
Cao, D. et al. Probing Donor-Acceptor Interactions and Co-Conformational Changes in Redox Active Desymmetrized [2]Catenanes. J. Am. Chem. Soc. 2010, 132, 1110-1122.
Chavey, D. Tilings by Regular Polygons 2. A Catalog of Tilings. Comput Math Appl. 1989, 17, 147-165.
Chen, D., et al. "A Rigid Naphthalenediimide Triangle for Organic Rechargeable Lithium-Ion Batteries." Advanced Materials 27.18 (2015): 2907-2912.
Chen, J., et al. "PPN (poly-peri-naphthalene) film as a narrow-bandgap organic thermoelectric material." Journal of Materials Chemistry A 5.20 (2017): 9891-9896.
Destoop, I. et al. Solvent-Induced Homochirality in Surface-Confined Low-Density Nanoporous Molecular Networks. J. Am. Chem. Soc. 2012, 134, 19568-19571.
Dolomanov, O. V., et al. "OLEX2: a complete structure solution, refinement and analysis program." Journal of applied crystallography 42.2 (2009): 339-341.
Efiekhari, A. Tungsten Dichalcogenides (WS2, WSe2, and WTe2): Materials Chemistry and Applications. J. Mater. Chem. A 2017, 5, 18299-18325.
Egli, M. et al. Stereoelectronic Effects of Deoxyribose O4' on DNA Conformation. Proc. Natl. Acad. Sci. U. S. A. 1995, 92, 180-184.
Fang, X. et al. Cooperative Lone Pair-p and Coordination Interactions in Naphthalene Diimide Coordination Networks. CrystEngComm. 2014, 16, 9090-9095.
Ferraris, J. P. et al. Synthesis of the Highly Conducting Organic Salt: Tetramethyltetrathiofulvalenium—Tetracyano—Quinodimethanide. Tetrahedron Lett. 1973, 14, 2553-2556.
Gu, P.-Y. et al. Synthesis, Physical Properties, and Sensing Behaviour of a Novel Naphthalenediimide Derivative Dyes. Pigm. 2016, 131, 224-230.
Guinonneau, P. et al. Determining the Charge Distribution in BEDT-TTF Salts. Synth. Met. 1997, 86, 1973.

(56) References Cited

OTHER PUBLICATIONS

Guo, Z. et al. Lowering Band Gap of an Electroactive Metal—Organic Framework via Complementary Guest Intercalation. ACS Appl. Mater. Interfaces 2017, 9, 32413-32417.

Han, Y. et al. Recent Progress in 2D Materials for Flexible Supercapacitors. J. Energy Chem. 2018, 27, 51-T2..

Hoger, S. "Shape-persistent macrocycles: from molecules to materials." Chemistry—A European Journal 10.6 (2004): 1320-1329.

Hong, J. et al. All-Small-Molecule Solar Cells Incorporating NDI-Based Acceptors: Synthesis and Full Characterization. ACS Appl. Mater. Interfaces 2017, 9, 44667-44677.

Horiuchi, S. et al. Ionic Versus Electronic Ferroelectricity on Donor-Acceptor Molecular Sequence. Chem. Lett. 2014, 43, 26-35.

Horiuchi, S. et al. Organic Ferroelectrics. Nat. Mater. 2008, 7, 357-366.

Iritani, K. et al. Hexagonal Molecular Tiling by Hexagonal Macrocycles at the Liquid/Solid Interface: Structural Effects on Packing Geometry. Langmuir 2017, 33, 12453-12462.

Jaguar, version 9.8; Schrodinger Inc.: New York, 2017.

Jones, B. A. et al. Tuning Orbital Energetics in Arylene Diimide Semiconductors. Materials Design for Ambient Stability of n-Type Charge Transport. J. Am. Chem. Soc. 2007, 129, 15259-15278.

Kagawa, F. et al. Electric-Field Control of Solitons in a Ferroelectric Organic Charge-Transfer Salt. Phys. Rev. Lett. 2010, 104, 227602.

Kobayashi, K. et al. Electronic Ferroelectricity in a Molecular Crystal with Large Polarization Directing Antiparallel to Ionic Displacement. Phys. Rev. Lett. 2012, 108, 237601.

Kumar, M., et al. "Supramolecular charge transfer nanostructures." Physical Chemistry Chemical Physics 16.4 (2014): 1300-1313.

La Porte. N. T. et al. Photoexcited Radical Anion Super-Reductants for Solar Fuels Catalysis. Coord. Chem. Rev. 2018, 361, 98-119.

Levine, D. et al. Quasicrystals: A New Class of Ordered Structures. Phys. Rev. Lett. 1984, 53, 2477-2480.

Liu, Z., et al. "Assembly of supramolecular nanotubes from molecular triangles and 1, 2-dihalohydrocarbons." Journal of the American Chemical Society 136.47 (2014): 16651-16660.

Lu, C. et al. Rational Design of Two-Dimensional Covalent Tilings Using a C6-Symmetric Building Block via On-Surface Schiff Base Reaction. Chem. Commun. 2019, 55, 1326-1329.

Matsuzaki, S. et al. Raman Spectra of Conducting TCNQ Salts; Estimation of the Degree of Charge Transfer from Vibrational Frequencies. Solid State Commun. 1980, 33, 403-405.

Matthies, M. et al. Triangulated Wireframe Structures Assembled Using Single-Stranded DNA Tiles. ACS Nano. 2019, 13, 1839-1848.

Mercier, N. et al. (TTF)2[TTF(CO2H)2(CO2)2]: A Wholly TTF Material Containing TTF Radical Cations and TTF Derived Anions. Chem. Commun. 2001, 2722-2723.

Millan, J. A. et al. Self-Assembly of Archimedean Tilings with Enthalpically and Entropically Patchy Polygons. ACS Nano. 2014, 8, 2918-2928.

Mizuno, A., et al. "Discovery of the K 4 Structure Formed by a Triangular p Radical Anion." Journal of the American Chemical Society 137.24 (2015): 7612-7615.

Montoro, T. et al. Sigma-Hole?Pi and Lone Pair?Pi Interactions in Benzylic Halides. Org. Biomol. Chem. 2015, 13, 6194-6202.

Mukhopadhyay, P. et al. Spontaneous Colorimetric Sensing of the Positional Isomers of Dihydroxynaphthalene in a 1D Organogel Matrix. Angew. Chem. Int. Ed. 2006, 45, 1592-1595.

Ng, C.-F et al. Organic Molecular Tessellations and Intertwined Double Helices Assembled by Halogen Bonding. CrystEngComm. 2019, 21, 1130-1136.

Novoselov, K. S. Electric Field Effect in Atomically Thin Carbon Films. Science. 2004, 306, 666-669.

Ostroverkhova, O. Organic Optoelectronic Materials: Mechanisms and Applications. Chem. Rev. 2016, 116, 13279-13412.

Ramirez, A. P. Strongly Geometrically Frustrated Magnets. Annu. Rev. Mater. Sci. 1984, 24, 453-480.

Schneebeli, S. T., et al. "Electron sharing and anion-pi recognition in molecular triangular prisms." Angewandte Chemie International Edition vol. 52 (2013) pp. 13338-13342.

Segregated D/A stack in 1D

Neutral state     Ionic state

Mixed D/A stack in 1D

Neutral state     Ionic state

Tiling through
[π...π] interactions

Tiling through
CT interactions

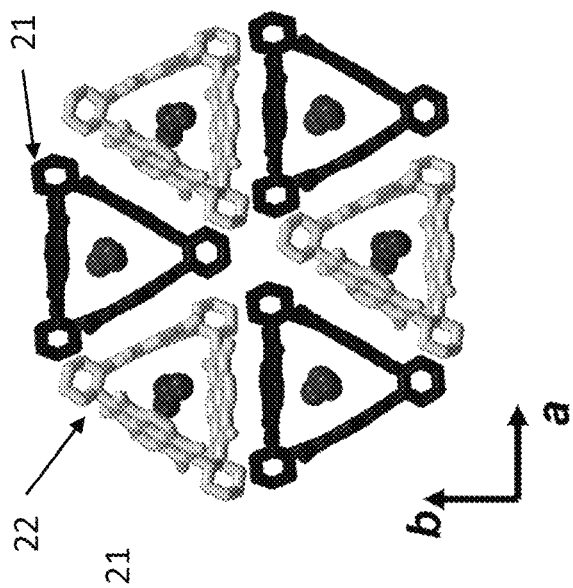
FIG. 6A
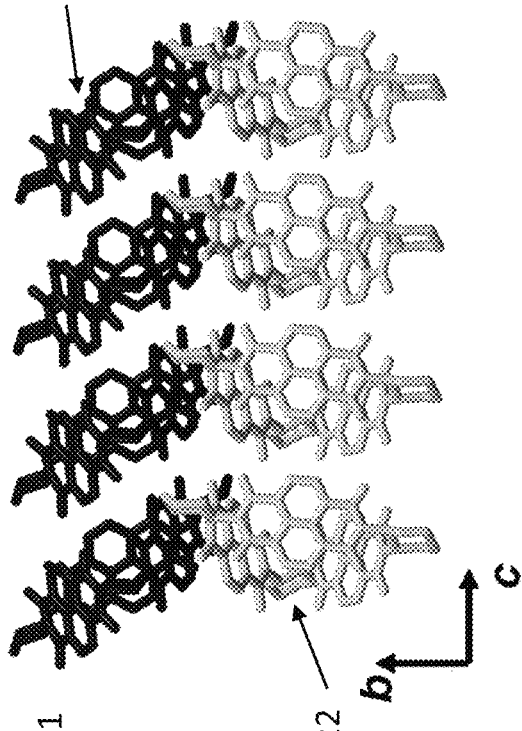
FIG. 6B
FIG. 6C
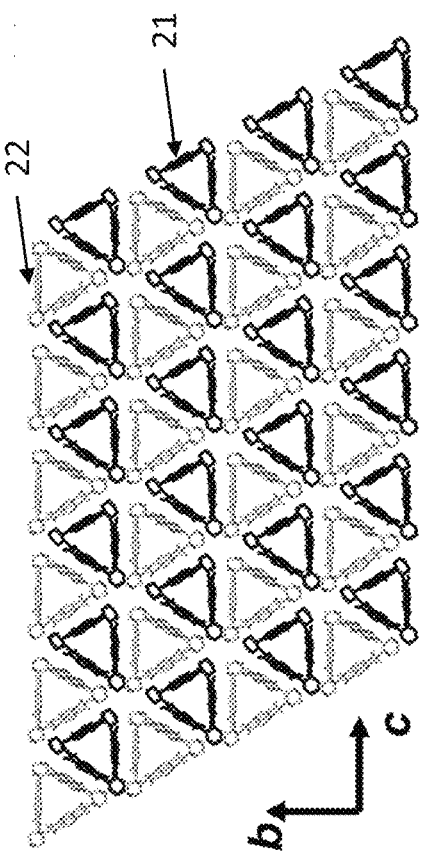
FIG. 6D
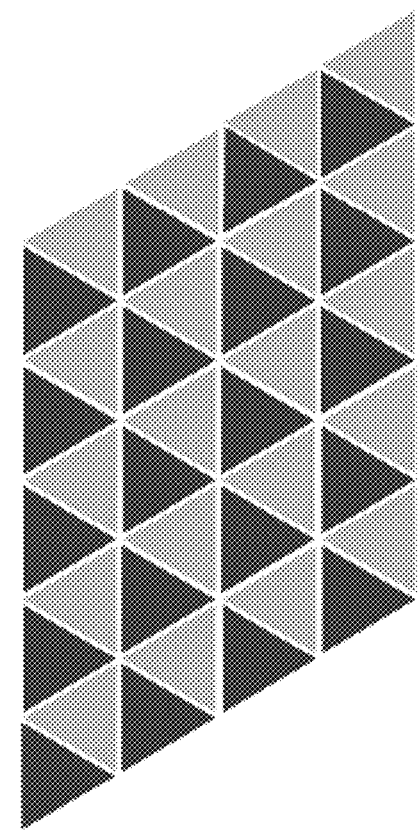
FIG. 6E ○ MeCN
● Et₂O

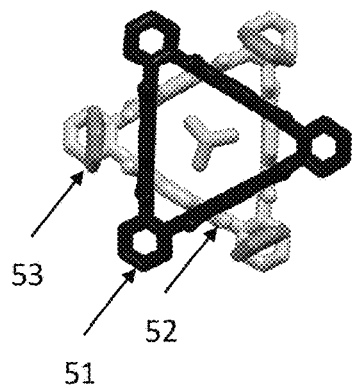
FIG. 9A
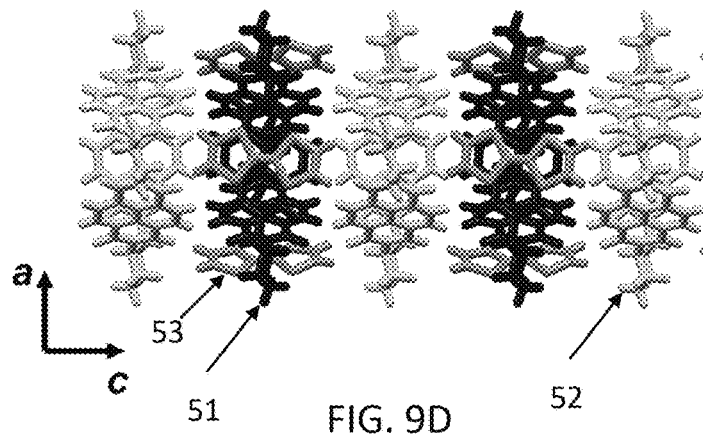
FIG. 9B
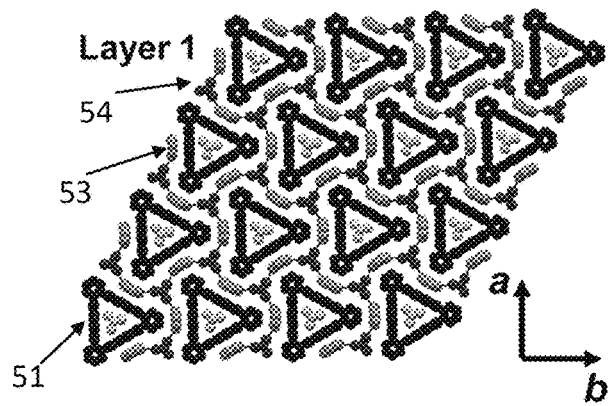
FIG. 9C
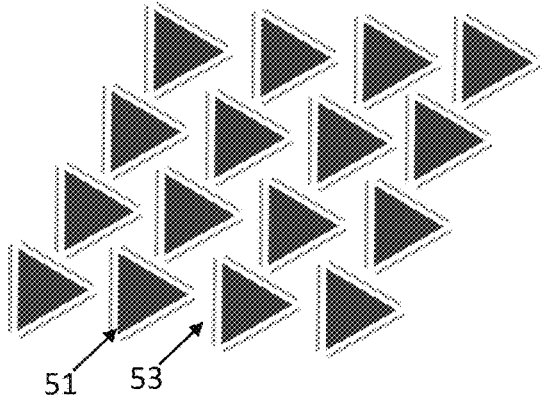
FIG. 9D
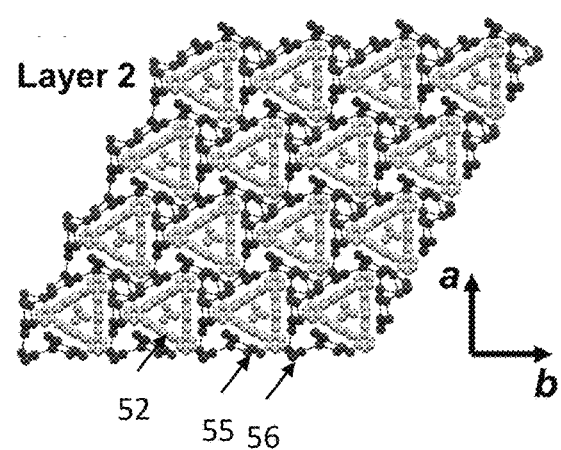
FIG. 9E
FIG. 9F FIG. 33
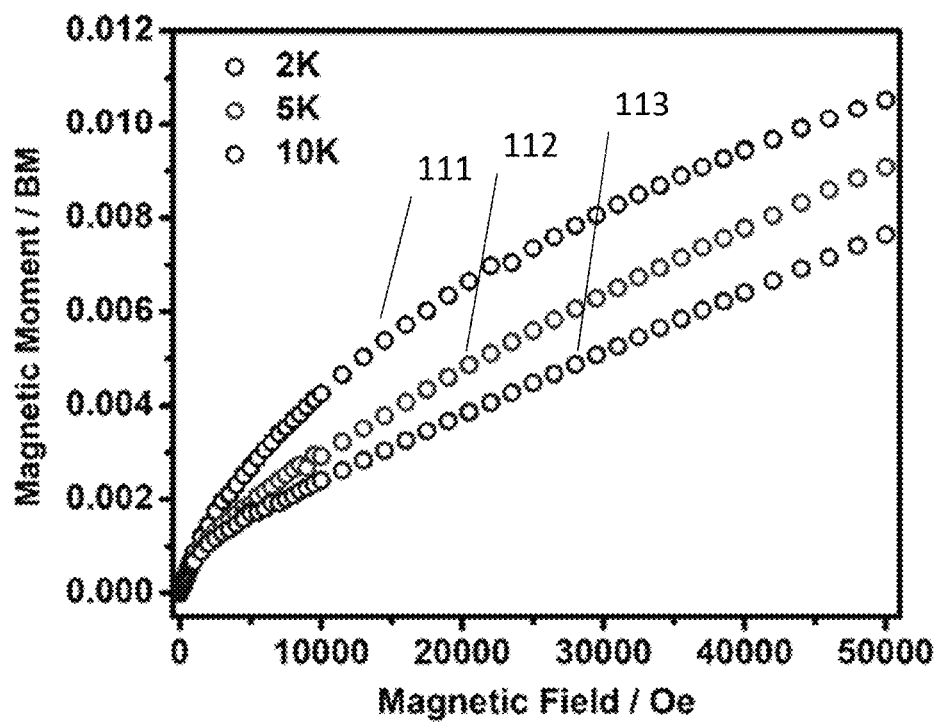
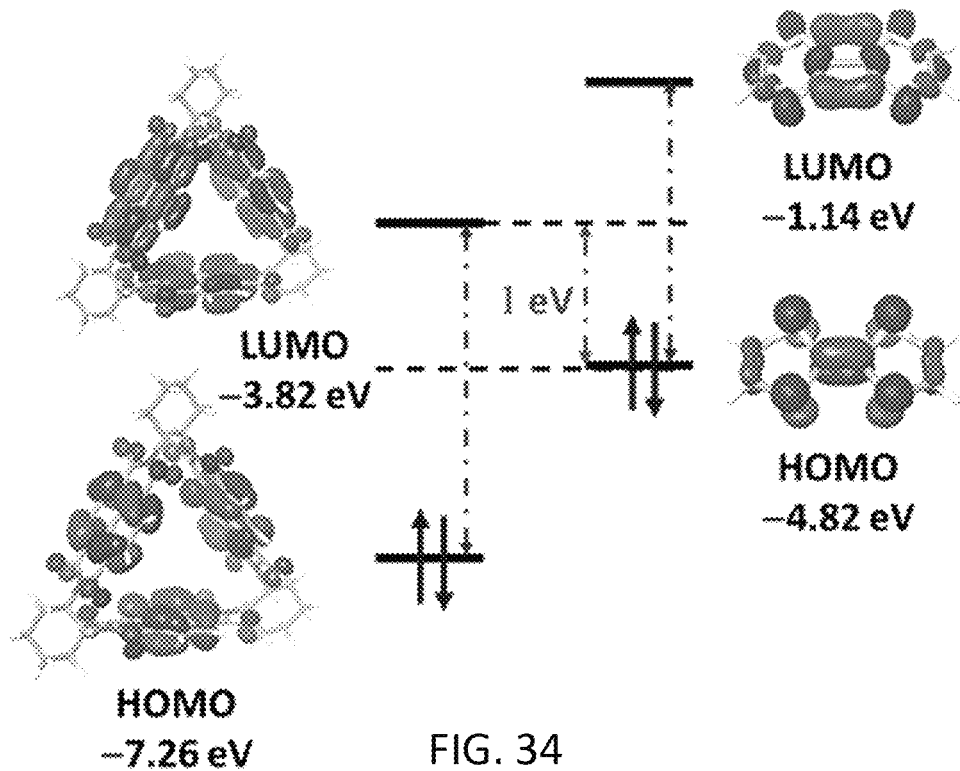
FIG. 34

SUPRAMOLECULAR TESSELLATION OF RIGID TRIANGULAR MACROCYCLES

FIELD OF THE INVENTION

The disclosed technology is generally directed to crystal engineering. More particularly the technology is directed to supramolecular tessellation of rigid triangular macrocycles.

BACKGROUND OF THE INVENTION

Tessellation or tiling is a process of arranging polygons in a plane in order to cover a surface entirely without gaps or overlaps, and in so doing, generate uniform or irregular two-dimensional (2D) patterns. Tessellation has been used[1] to tile regular polygons for decoration in art since antiquity. The mathematical treatment of tiling regular polygons, however, was first reported in 1619 by Kepler,[2] who identified 11 types of Archimedean tilings. At the molecular level, a growing interest has emerged in the past decades in 2D tiling of semi-regular Archimedean Tilings[3] (ATs) and quasi-crystalline superstructures[4] (QCs) on account of their potential optical,[5] magnetic[6] and catalytic[7] properties. Molecular tessellations are often discovered serendipitously, and the mechanisms by which specific molecules can be tiled seamlessly to form periodic structures remain unclear. In addition, molecular tessellations using organic polygons fabricated on a metal surface have been observed with 2D spectroscopic and microscopic techniques, but detailed 3D structural information derived from X-ray crystallographic studies of tessellated materials is still lacking. Noteworthy, tessellations with shape-persistent polygons through $\pi\ldots\pi$ and charge transfer (CT) interactions, leading to the construction of 2D networks, is not well explored because of synthetic difficulties in accessing such macrocyclic structures. Moreover, the design of organic Donor/Acceptor CT complexes are so far limited to the one-dimensional arrays of Donor/Acceptor stacks.

BRIEF SUMMARY OF THE INVENTION

Disclosed herein are crystalline compositions comprising tessellated rigid triangular macrocycles and methods of making the same. One aspect of the invention is a crystalline composition comprising a rigid triangular macrocycle. In some embodiments, each rigid triangular macrocycle of the crystalline composition interacts via face-to-face $[\pi\ldots\pi]$ interactions with at least two other rigid triangular macrocycles. In certain embodiments, each rigid triangular macrocycle of the crystalline composition interacts via face-to-face $[\pi\ldots\pi]$ interactions with three other rigid triangular macrocycles. Suitably, the rigid triangular macrocycle is NDI-Δ. In particular embodiments, the crystalline composition is β-NDI-Δ or γ-NDI-Δ.

Another aspect of the invention is a crystalline composition comprising a rigid triangular macrocycle and a π-electron donor. In some embodiments, the rigid triangular macrocycle and the π-electron donor form a host-guest inclusion complex. In some embodiments, the crystalline composition has two crystallographically distinct rigid triangular macrocycles. In certain embodiments, the crystalline composition has (i) a first layer comprising the rigid triangular macrocycle and the π-electron donor and (ii) a second layer comprising the rigid triangular macrocycle and lacking the π-electron donor. In some embodiments, the crystalline composition comprises a supramolecular triangle formed from π-electron donors. In certain embodiments, the three π-electron donors of the supramolecular triangle have mixed-valence character. Suitably, the rigid triangular macrocycle is NDI-Δ and the π-electron donor is TTF. In particular embodiments, the crystalline composition is CT-A, CT-B or CT-C.

Another aspect of the invention is methods for preparing crystalline composition. In some embodiments, the method comprises providing a solution comprising a rigid triangular macrocycle and a solvent; and diffusing a precipitant or evaporating the solvent under conditions sufficient for the formation of the crystalline composition. In some embodiments, the method comprises providing a solution comprising a rigid triangular macrocycle, a π-electron donor, and a solvent; and diffusing a precipitant or evaporating the solvent under conditions sufficient for the formation of the crystalline composition. Suitably, the methods capable of preparing the crystalline compositions described herein.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

(FIG. 1B) Alternately stacked D/A molecules in a mixed-stacked CT assembly.

(FIG. 2A) Expected tiling of the NDI-Δ 1 through $[\pi\ldots\pi]$ interactions and (FIG. 2B) tiling of the NDI-Δ 1:TTF 2 co-crystal through CT interactions.

(FIG. 5B) Hydrogen bonding [C=O . . . H] between the NDI-Δ propagating along the a-axis 11 b-axis 12 to form zig-zag chains.

FIGS. 6A-6E. Crystal superstructure of β-NDI-Δ showing the symmetry equivalence between the different moieties 21, 22. Hydrogen atoms are removed for the sake of clarity. (FIG. 6A) Two molecules (dimer) in the asymmetric unit interacting through $[\pi\ldots\pi]$ interactions. (FIG. 6B) Hydrogen bonding [C=O . . . H] between the NDI-Δ propagating along the a-axis to form tubular superstructures. (FIG. 6C) Top view of six triangles around a vertex, 121212, leading a hexagonal superstructure. (FIG. 6D) Triangular tiling of the two symmetrically non-related NDI-Δ in the bc-plane. (FIG. 6E) Schematic representation of a semi-regular Archimedean triangular alternating tiling.

(FIG. 7B) Schematic representation of hex-NDI-Δ. (FIG. 7C) Hexagonal tiling of the hexagonal superstructure hex-NDI-Δ in the ab-plane with the P6m symmetry in the Archimedean hexagonal tilings. MeCN 32 solvent forms a hexagonal shell surrounding the hex-NDI-Δ.

(FIG. 8B) Side view of the disordered TTF inside the (NDI-Δ)$_2$. (FIG. 8C) Packing of the NDI-Δ and TTF in plane leading to a layer-like superstructure in the cb-plane. TTF-2 and TTF-3 show symmetry equivalence. Hydrogen atoms are removed for the sake of clarity.

FIGS. 9A-9F. Crystal superstructure of CT-B showing (FIG. 9A) the two crystallographically distinct NDI-Δ macrocycles 51, 52 interacting with three TTF molecules 53. Hydrogen atoms are removed for the sake of clarity. Shading illustrates the symmetry equivalence. (FIG. 9B) Hydrogen bonding [C=O . . . H] between the NDI-Δ 51, 52 propagating along the c-axis to form a tubular superstructure. (FIG. 9C) The arrangement of NDI-Δ 51, TTF 53 and CHCl$_3$ 54 molecule in the ab-plane with TTF 53 and CHCl$_3$ 54 interconnected through a 2D network of close [Cl . . . S] contacts. (FIG. 9D) Schematic representation of the vertex-to-edge packing of the NDI-Δ 51:TTF 53 to form a 2D superstructure (Layer 1). (FIG. 9E) Two symmetrically distinct CHCl$_3$ molecules 55, 56 are connected through a set of [Cl . . . Cl] contacts forming a supramolecular CHCl$_3$ triangles (CHCl$_3$-Δ). These supramolecular CHCl$_3$-Δ are arranged in hexagonal fashion to form a 2D hexagonal grid in which the NDI-Δ is tessellated. (FIG. 9F) Schematic representation of the vertex-to-edge packing of the NDI-Δ 52 to form a 2D superstructure (Layer 2).

(FIG. 10B) Close S . . . S interactions between the crystallographically distinct TTF 62 molecules generating supramolecular isoscele triangles (TTF-Δ). (FIG. 10C) Packing of the NDI-Δ 61 and TTF-Δ 62 in the ab-plane to offer a layer-like superstructure with CT interactions propagating in the 2D plane. (FIG. 10D) Hexagonal arrangement of TTF-Δ 62 as the result of the perpendicular rotation (C$_3$-fold symmetry) of two NDI-Δ along the b-axis. (FIG. 10E) Schematic representation of the irregular Archimedean triangular tiling of two different triangles (NDI-Δ 61 and TTF-Δ 62) in a 2D network of CT interactions. (FIG. 10F) Schematic representation of the arrangement of two layers of NDI-Δ and TTF-Δ showing the Asterix shape of the (NDI-Δ)$_2$ surrounded by hexagonal packing the TTF-Δ.

(FIG. 11A) Absorption spectra of a 1:1 mole ratio of NDI-Δ:TTF mixture in different solvents: CHCl$_3$ 71, CH$_2$Cl$_2$ 72, and MeCN 73. Absorption spectra of pure TTF 74 and NDI-Δ 75 in MeCN are recorded as references. (FIG. 11B) Absorption spectra of NDI-Δ·TTF measured at 20° C. 76 and −5° C. 77.

(FIG. 17A) $^1$H NMR (600 MHz, CD$_3$CN, 298 K) titration spectra of NDI-Δ with TTF. (FIG. 17B) A plot of the chemical shifts of the aromatic NDI protons as a function of increasing [TTF] in solution was used to determine the K$_a$ value for the 1:1 complex.

(FIG. 18A) Variable temperature of $^1$H NMR (600 MHz, CD$_3$CN) spectra of NDI-Δ with TTF. (FIG. 18B) A plot of the chemical shifts of the aromatic NDI protons as a function of temperature.

(FIG. 23A) $^1$H NMR (600 MHz, CD$_3$CN, 298K) titration spectra of NDI-Δ with CHCl$_3$. (FIG. 23B) A plot of the chemical shifts of the aromatic NDI protons as a function of increasing [CHCl$_3$] in solution was used to determine the K$_a$ value for the 1:1 complex.

FIG. 34. Frontier orbitals of NDI-Δ and TTF calculated using optimized geometries using B3LYP/6-31G*+ basis set.

DETAILED DESCRIPTION OF THE INVENTION

Disclosed herein are crystalline compositions comprising tessellated rigid triangular macrocycles and methods of making the same. Tessellation of organic polygons, i.e., triangular macrocycles, though [π . . . π] and charge-transfer (CT) interactions allows for the construction supramolecular organic electronic materials with 2D topologies. As we demonstrate below, a variety of different crystalline compositions having tessellated rigid triangular macrocycle may be prepared by controlling the identity of the solvent and solute concentrations.

Figure 1A:
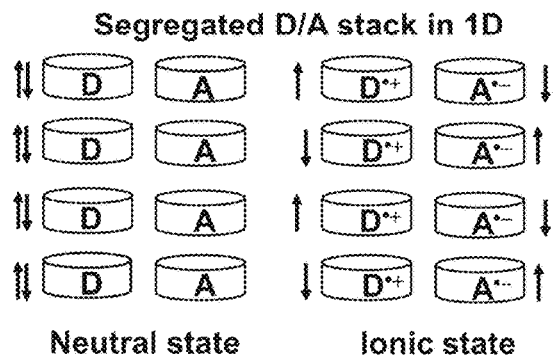
FIGS. 1A-1B. Schematic representation of (FIG. 1A) segregated π-stack CT structure.
Figure 1B:
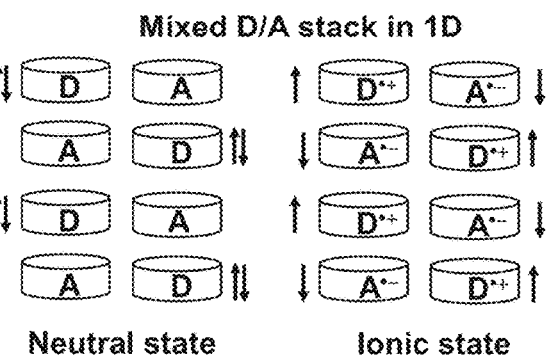

Precise design and control of the molecular topology can result in desirable electronic properties. For example, 1D π-conjugated organic materials comprising infinite segregated π-stacks of donors (D) and acceptors (A) may be prepare (FIG. 1A). Mixed-stack CT assemblies, composed of alternating D and A aromatic molecules, provide[18] the inherent and uniform doping required to obtain excellent conducting properties (FIG. 1B). Under external stimuli, such as pressure, temperature or light, electrons delocalized along the D/A stack leading[20] to the formation of fractional charges (ionic phase) and increase conductivity. In addition, the structural synergy between a hydrogen-bonded network and the CT complexation of D and A molecules in mixed-stack CT superstructures can lead to the emergence of ferroelectric behavior at room temperature.

Supramolecular tessellation of rigid triangular macrocycles in a 2D-plane results in the emergence materials where conductivity or photoconductivity may be tailored to particular applications. 2D semi-conductive materials, such as graphene, boron nitride, and transition metal dichalcogenides, are based on covalently interconnected atoms to form honeycomb 2D network patterns, and are widely utilized in energy harvesting technologies and flexible electronics. Supramolecular tessellation of rigid triangular macrocycles similarly allows for preparation of semi-conductive materials. In this context, there is a combination of four parameters to be considered, namely (i) the rigid structure and the triangular shape of which can adopt different 2D tessellation packing motifs following the AT tiling principles, (ii) the confinement of electron donors inside the cavities leading to the formation of host-guest complexes which can facilitate CT, (iii) the greater electron-deficiency of triangular macrocycle, compared to that of the aromatic units, enhances the macrocycles electron affinity, and (iv) the intramolecular electron sharing between the aromatic units which offer potentially additional degrees of freedom for charge transport in 2D or 3D in tessellated packing patterns.

The rigid triangular macrocycle allows for tessellation in a two-dimensional plane. Suitably, the rigid triangular macrocycle may be formed from a functional π-system such as 1,4,5,8-naphthalene tetracarboxylic diimide (NDI). NDI has emerged as an important class of functional π-systems, often finding application in organic electronics,[27] photovoltaic devices,[28] and sensors.[29] This molecular motif is also a potential lithium-ion electrode material, owing to its low molecular weight, high electron affinity and high charge carrier mobility.[27a,30] In some embodiments, the rigid triangular macrocycle may be NDI-Δ. NDI-Δ includes (−)NDI-Δ or (+)NDI-Δ.

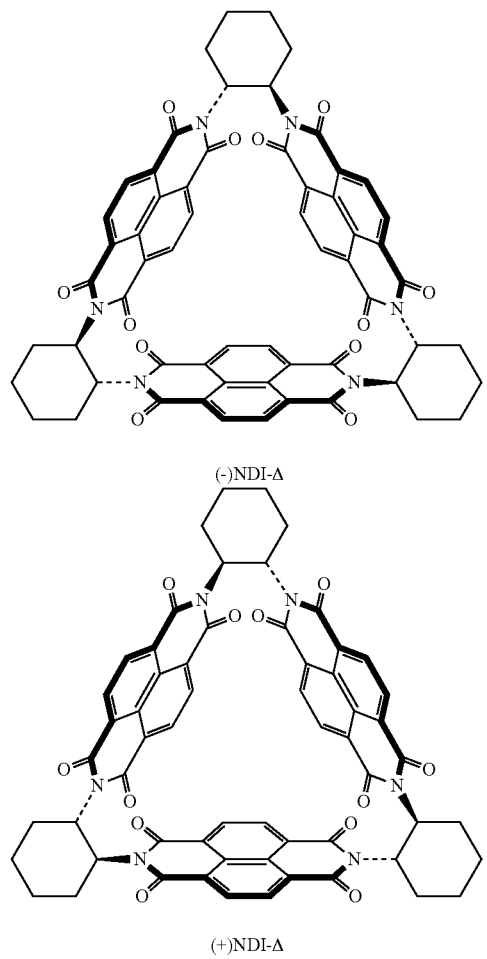

(-)NDI-Δ

(+)NDI-Δ

The structural and electronic properties of rigid shape-persistent NDI triangles display (i) electron sharing between three NDI units, leading to the observation of stepwise six-electron reductions, and (ii) anionic recognition properties. Incorporation into tessellated substructures allows for the development of compositions having the remarkable properties further described herein.

Rigid triangular macrocycles may be used to prepare charge transfer complexes with a π-electron or charge transfer donor. The charge transfer donor may comprise an aromatic unit such as tetrathiafulvalene (TTF)

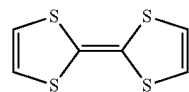

TTF

Incorporation of charge transfer donors such as TTF allow for the tailoring of properties of the material.

Utilization of non-halogenated solvents, combined with careful tailoring of the concentrations, results in the rigid triangular macocycle, such as NDI-Δ, self-assembling though [π . . . π] interactions into 2D honeycomb triangular and hexagonal tiling patterns. Co-crystallization of NDI-Δ with tetrathiafulvalene (TTF) leads systematically to the formation of 2D tessellations as a result of superstructure directing of CT interactions. Different solvents lead to different packing arrangements. Using MeCN, CHCl$_3$ and CH$_2$Cl$_2$, we identified three sets of co-crystals, namely CT-A, CT-B, and CT-C respectively. Solvent modulation plays a critical role in controlling, not only the NDI-Δ:TTF stoichiometric ratios and the molecular arrangements in the crystal superstructures, but also prevents the inclusion of TTF guests inside the cavities of NDI-Δ. Confinement of TTF inside the NDI-Δ cavities in the CT-A superstructure enhances the CT character with the observation of a broad absorption band in the NIR region. In the CT-B superstructure, the CHCl$_3$ lattice molecules establish a set of [Cl . . . Cl] and [Cl . . . S] intermolecular interactions, leading to the formation of a hexagonal grid of solvent in which NDI-Δ forms a triangular grid. In the CT-C superstructure, three TTF molecules self-assemble, forming a supramolecular isosceles, triangle TTF-Δ, which tiles in a plane alongside the NDI-Δ, producing a 3+3 honeycomb tiling pattern of the two different polygons. Solid-state spectroscopic investigations on CT-C, revealed the existence of an absorption band at 2500 nm which, on the basis of TDDFT calculations was attributed to the mixed-valence character between two TTF$^{•+}$ and one neutral TTF molecule.

Figure 2A:
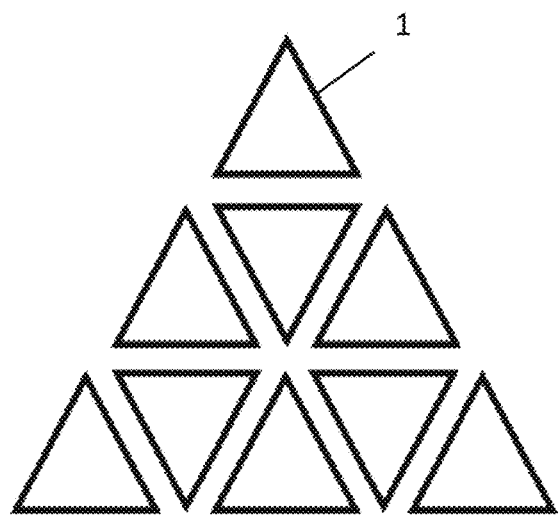
FIGS. 2A-2B.
Figure 2B:
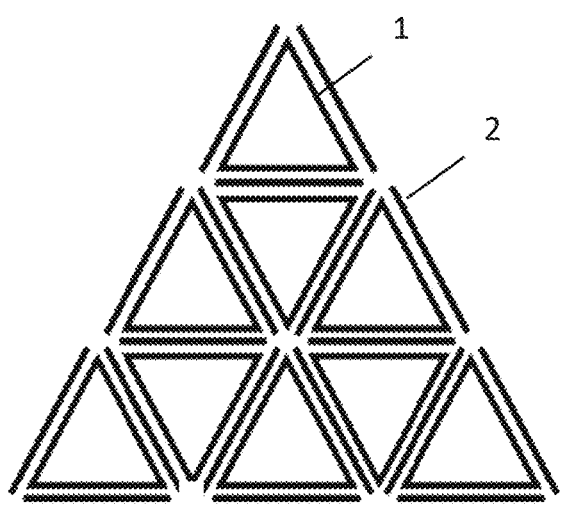

As demonstrated in the Examples, tessellations (FIG. 2A) of a shape-persistent regular polygon NDI-Δ1 in a 2D framework through favorable [π . . . π] interactions between the NDI units is achievable. Furthermore, because the triangle is the smallest geometry capable of achieving regular and semi-regular tiling, several tiling patterns, such as triangular and hexagonal tiling have been achieved through solvent and solute concentration modulations. Indeed, careful modulation of the solvent composition (halogenated versus non-halogenated solvents) and solute concentrations induce a dramatic change in the arrangement of NDI-Δ in crystal superstructures. In addition, we report that utilization of tetrathiafulvalene (TTF) 2 as an electron donor with NDI-Δ1 can offer systematic in-plane 2D networks of CT interactions since propagation of CT interactions are superstructure directing, such as illustrated in FIG. 2B. Molecular packing in the crystal superstructure and the formation of host-guest supramolecular complexation between NDI-Δ and TTF, however, can be controlled through solvent modulation. Detailed information of the 3D arrangement of NDI-Δ polygons and TTF have been investigated thoroughly using X-ray crystallography. In addition, detail analysis of the molecular structures has provided valuable information on the valency of the different components and the dominant intermolecular interactions ([Cl . . . π], [π . . . π], CT interactions etc.) which influence the molecular arrangements. The physical properties have been unraveled using a combination of spectroscopic, magnetic, and electron-transport measurements in addition to theoretical calculations.

Crystal Engineering of the NDI-Δ and NDI-Δ•TTF Cocrystals

Figure 3:
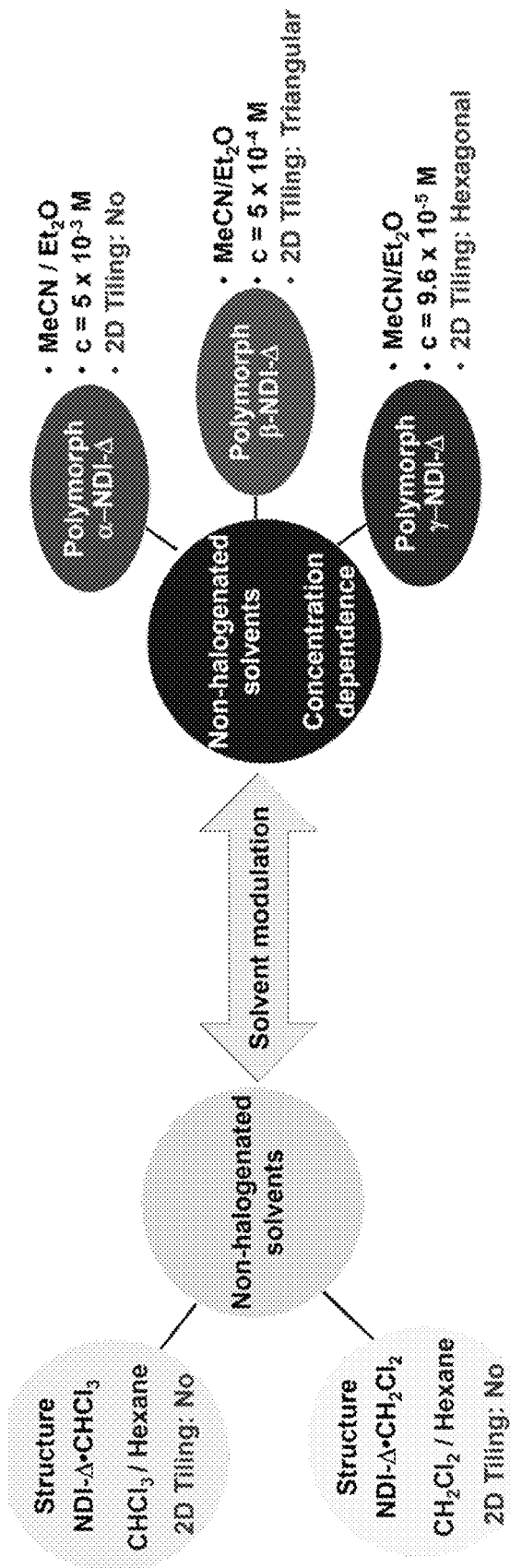
FIG. 3. Summary of the crystallization conditions utilized to isolate the different crystals of NDI-Δ.

Tessellation of NDI-Δ Through [π . . . π] Interactions:

The synthesis of NDI-Δ was carried out according to standard literature procedures.[31,32] Crystal engineering of NDI-Δ in a 2D network requires understanding the different forces that can enhance or prevent the formation of superstructural patterns. The crystal packing of NDI-Δ is very sensitive to the solvent identity and solute concentrations. Crystallization processes utilized for the growth of the different NDI-Δ superstructures are summarized in FIG. 3. The superstructure of NDI-Δ crystallized from CH$_2$Cl$_2$ has been already reported,[32] and presents many voids as a result of the removal of the solvent electron density during refinement of the crystal superstructure. For a better understanding of the role of solvent molecules in the packing of NDI-Δ, we crystallized NDI-Δ from CH$_2$Cl$_2$ at a concentration of 5.7×10$^{-4}$ M. NDI-Δ in CH$_2$Cl$_2$ crystallizes in the cubic I2$_1$3 space group, similar to that reported[32] in the literature (Figure S1). The current crystal superstructure, however, reveals the presence of three disordered CH$_2$Cl$_2$ molecules and two NDI units in the asymmetric unit. This superstructure displays the existence of [C—H . . . Cl] and [Cl . . . π(NDI)] interactions which prevent [π . . . π] interactions between these NDI units. In order to confirm the competition between the [Cl . . . π(NDI)] and [π . . . π] interactions, we crystallized NDI-Δ from a CHCl$_3$ solution. Once again, the NDI units do not interact as a result of [π . . . π] interactions, but rather establish a set of [Cl . . . π(NDI)] and [Cl . . . H(cyclohexane)] interactions. Furthermore, CHCl$_3$ molecules occupy the NDI-Δ cavity and interact on account of [Cl . . . π] interactions. Previous studies revealed[35] the role of lone pair . . . π interactions, which take place between lone pair-bearing atoms in neutral molecules and electron-deficient π-acidic aromatic systems in Z-DNA, for example. Other studies have revealed[36] that NDIs are electron-deficient molecules and have a strong tendency to interact with electron-rich lone pair-bearing atoms. Crystallization of NDI-Δ in 1,2-dihalogenated ethane or ethene solvents has revealed[37] the absence of the [π . . . π] interactions between the NDI units. Clearly, halogenated solvents (CH$_2$Cl$_2$, CHCl$_3$) establish a network of [Cl . . . H(cyclohexane)] and [Cl . . . π(NDI)] interactions which prevent in-plane packing of NDI-Δ through [π . . . π] interactions. In this context, utilization of non-halogenated and relatively low-solubilizing solvents, such as MeCN, is essential in order to enhance the self-assembly of NDI-Δ through [π . . . π] interactions which generate in-plane 2D NDI-Δ tiling patterns. Notably, crystallization of NDI-Δ from MeCN has been proven to be concentration dependent; the crystal growth procedures are summarized in FIG. 3. Three different polymorphs, named α-NDI-Δ, β-NDI-Δ and γ-NDI-Δ, have been identified by employing different solute concentrations. While α-NDI-Δ crystallizes at the highest concentration (5×10$^{-3}$ M) of NDI-Δ, β-NDI-Δ and γ-NDI-Δ crystallize at 5×10$^{-4}$ and 9.6×10$^{-5}$ M, respectively. Seemingly, the β-NDI-Δ and γ-NDI-Δ phases are thermodynamically favored, while fast crystallization of NDI-Δ offers selectively the α-NDI-Δ phase as a kinetic polymorph. According the density rule,[38] superstructures with higher density (more efficient packing) tend to have greater (enthalpic) stability. In this context, the γ-polymorph (d=1.71 g/mm$^3$) is enthalpically more favorable than the β-NDI-Δ (d=1.42 g/mm$^3$) and α-NDI-Δ (d=1.37 g/mm$^3$). Recent investigations on the tiling of hexagonal macrocycles into 2D hexagonal network have been shown[14] to be concentration dependent. To the best of our knowledge, there has been no systematic investigations of the effects of solvent identity and concentration on the packing geometries of triangular macrocycles.

Figure 4:
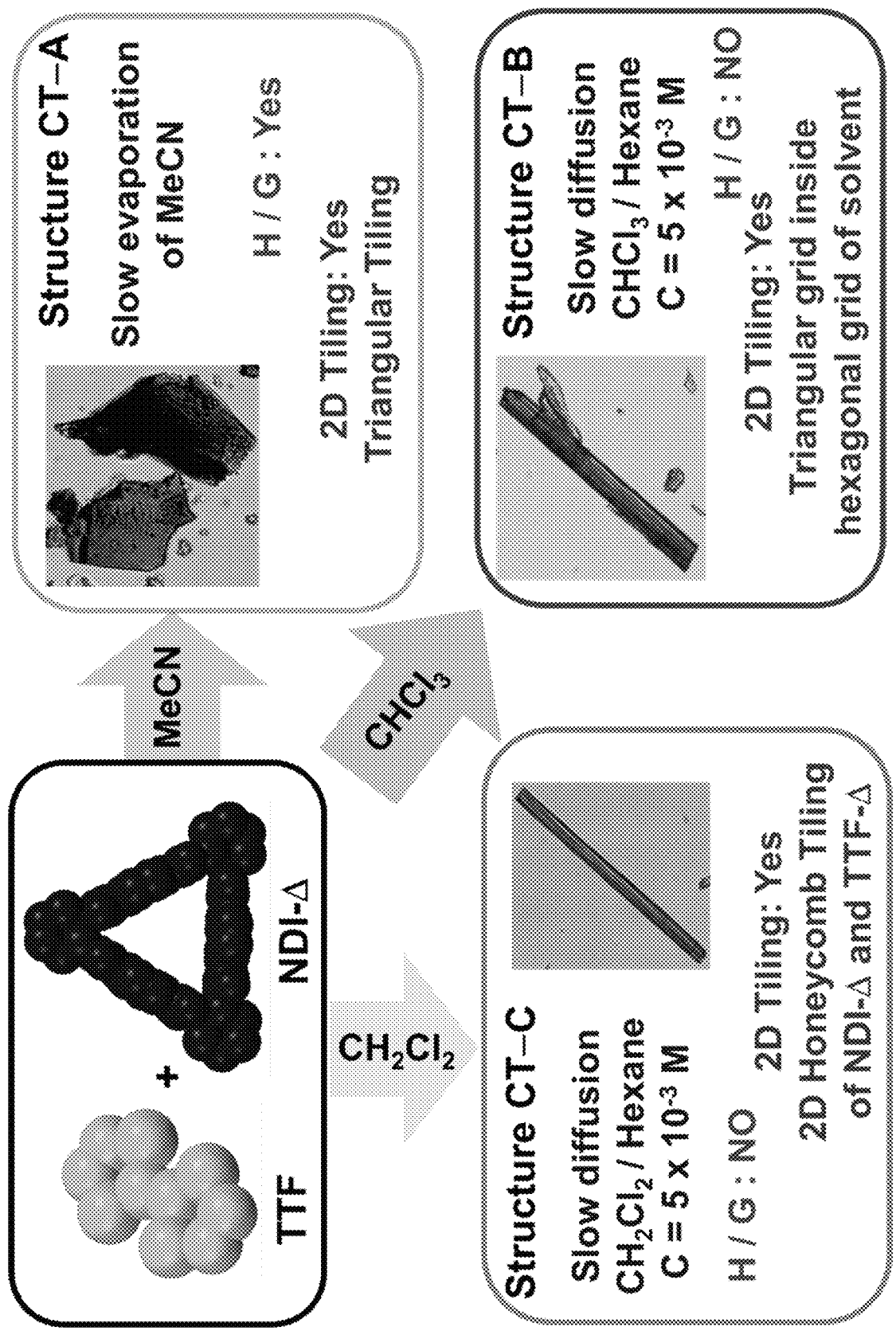
FIG. 4. Summary of the crystallization conditions utilized to isolate the different NDI-Δ:TTF cocrystals.

Tessellation of NDI-Δ and TTF Through CT Interactions:

Co-crystallization of the electron-deficient NDI-Δ with electron-rich TTF at a molar ratio of 1:3 leads (FIG. 4) to the formation of three sets of CT complexes—named as the CT-A, CT-B and CT-C complexes, depending on the crystallization conditions. Crystallization by slow evaporation of MeCN yields selectively the CT-A complex with a molar ratio 2:5 NDI-Δ:TTF in the resulting crystal structure. Notably, CT-A shows the formation of a host-guest complex between two NDI-Δ units and one TTF molecule. Slow diffusion of hexane into a solution of NDI-Δ in CHCl$_3$ and CH$_2$Cl$_2$ leads to the formation of two different complexes, namely CT-B and CT-C, with NDI-Δ:TTF molar ratios in the crystal superstructures of 2:3 and 1:3, respectively. Neither of the CT-B and CT-C superstructures display the presence of TTF inside the NDI-Δ cavity because of the stronger affinity of the solvent molecules for that cavity. All three superstructures display 2D-tiling patterns composed of NDI-Δ and TTF, indicating that the CT interactions between the TTF and NDI units are more favored than are the [Cl . . . π(NDI)] interactions.

Crystallographic Studies of the NDI-Δ Structures

Three sets of NDI-Δ crystals have been obtained using different crystallization conditions. Solvent modulation plays a critical role in controlling the molecular arrangement in the crystal structure. All the crystallographic data are reported in Table 1.

Figure 5B:
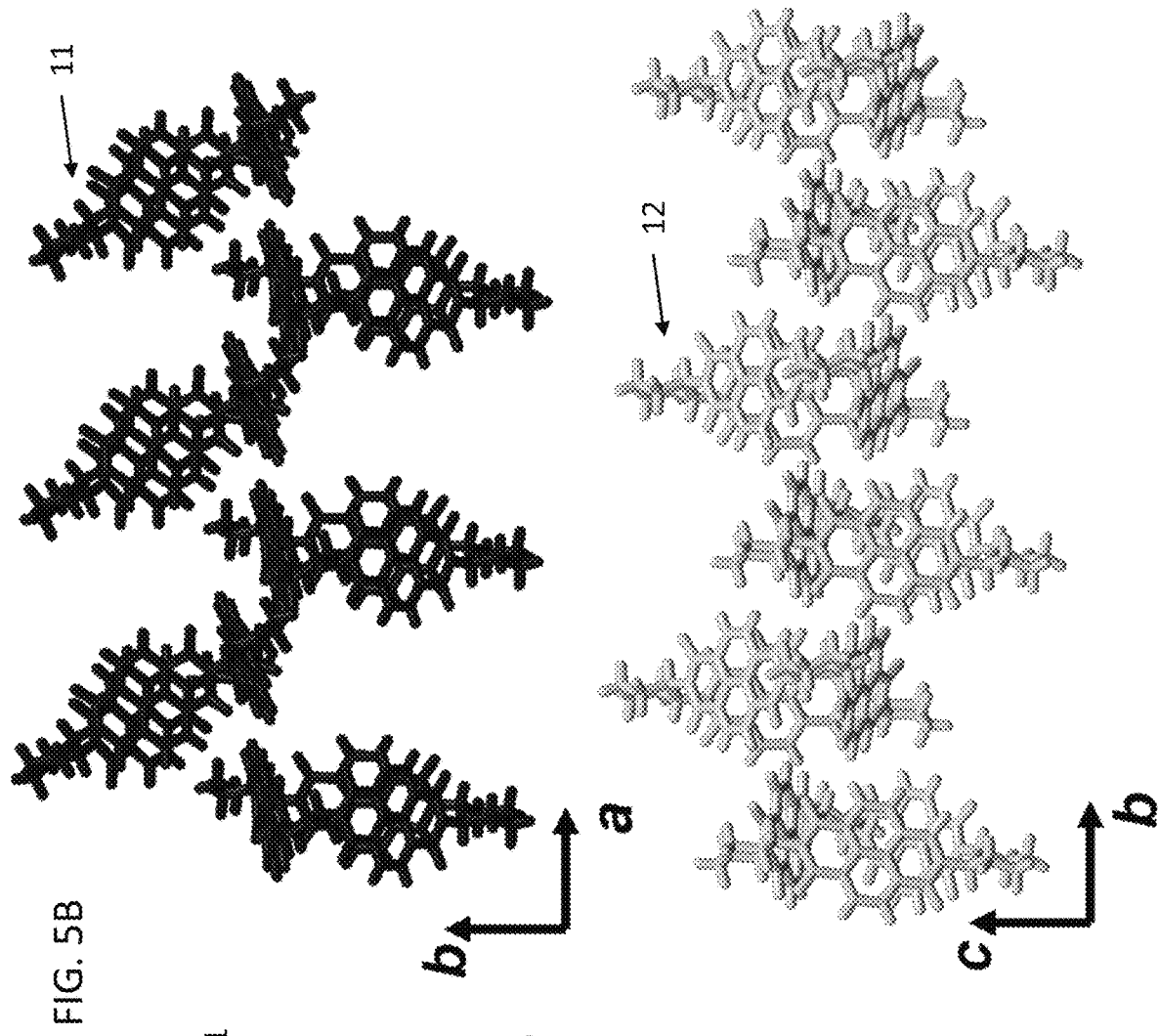
FIGS. 5A-5B. Crystal superstructure of α-NDI-Δ showing (FIG. 5A) two molecules (dimer) in the asymmetric unit interacting through $[\pi\ldots\pi]$ interactions.
Figure 5A:
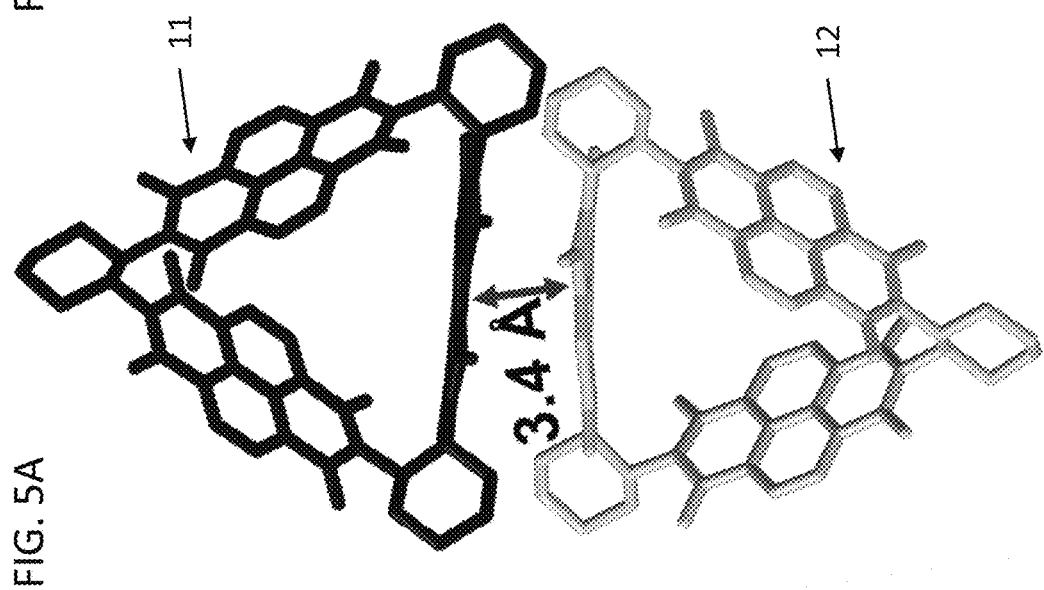

Structure α-NDI-Δ:

At high concentration of the NDI-Δ in MeCN ($5\times10^{-3}$ M), α-NDI-Δ crystallizes (FIG. 5A) in the monoclinic P2$_1$ space group with two NDI-Δ molecules in the asymmetric unit. These two molecules form a supramolecular dimer as a result of [π . . . π] interactions at a distance of 3.52 Å between two NDI units of each crystallographically distinct NDI-Δ, with a deviation from a parallel face-to-face interaction of ~72°. One of the two NDI-Δ units contains one molecule of Et$_2$O in its cavity, while the second NDI-Δ contains a MeCN molecule inside its cavity. This behavior could be related to the low solubility of the NDI-Δ in MeCN which leads to fast crystallization of NDI-Δ at high concentrations in a MeCN/Et$_2$O solvent mixture. Along the a-axis and b-axis, each molecule of the asymmetric unit establishes [C—H . . . O] interactions (mean 3.1 Å, $\theta_{[C-H \ldots O]}$=137°) with two symmetrically related neighboring molecules, forming (FIG. 5B) zig-zag chains of NDI-Δ. Notably, α-NDI-Δ does not form supramolecular triangular nanotubes, as observed in the case of β-NDI-Δ and γ-NDI-Δ or when 1,2-dihaloethane and -ethene (BrCH$_2$CH$_2$Br, ClCH$_2$CH$_2$Br, and ClCH$_2$CH$_2$I) are utilized for crystallization[37]. Seemingly, the existence of structure-directing interactions (halogen . . . halogen bonding) between the solvent molecules residing inside the cavity of NDI-Δ are structure-directing toward the formation of tubular superstructures.

Structure β-NDI-Δ.

In an attempt to decrease the nucleation kinetics, we diluted a solution of NDI-Δ in MeCN ($5\times10^{-4}$ M). Slow diffusion of Et$_2$O into the solution resulted in colorless needles suitable for crystallographic studies. β-NDI-Δ crystallizes in the triclinic P1 space group with two molecules in the asymmetric unit; each triangle contains (FIG. 6A) one molecule of Et$_2$O. This dimeric superstructure interacts through [π . . . π] interactions between NDI units with a deviation from a parallel face-to-face interaction of 11.8 (2)°. The NDI-Δ units stack in a parallel manner to form (FIG. 6B) triangular supramolecular nanotubes. The stacking of NDI-Δ via hydrogen bonding to form a nanotubular structure with a perpendicular rotation angle of 60° has been reported[37] in the literature for the case where 1,2-dihaloethane or -ethene (BrCH$_2$CH$_2$Br, ClCH$_2$CH$_2$Br, and ClCH$_2$CH$_2$I) are present in the cavity of NDI-Δ. Remarkably, in the β-NDI-Δ structure, all the polygon faces interact via face-to-face [π . . . π] interactions in the range of 3.34 to 3.46 Å between the NDI units; these interactions propagate (FIG. 6C) in the bc-plane to form a distorted hexagonal superstructure (six triangles around a vertex, 121212). In the ATs, the structure of β-NDI-Δ can be considered[1] (FIG. 6D-6E) as a truncated 2D honeycomb triangular tiling of P6m Euclidean plane symmetry. Tiling of shape-persistent molecular triangles on a metal surface has been achieved[12] through dispersive forces between long alkyl chains, leading to the formation of a 2D network. More recently, covalent 2D tiling of C$_3$ and C$_6$ symmetric molecular polygons via the Schiff base reaction has been reported.[39] Tessellation of shape-persistent molecular polygons through [π . . . π] interactions between polycyclic aromatic hydrocarbons, however, has not yet been reported. Precise control of the packing is important because the optical and electronic properties of numerous organic materials arise from the propagation of such interactions.

Structure γ-NDI-Δ.

Figure 7A:
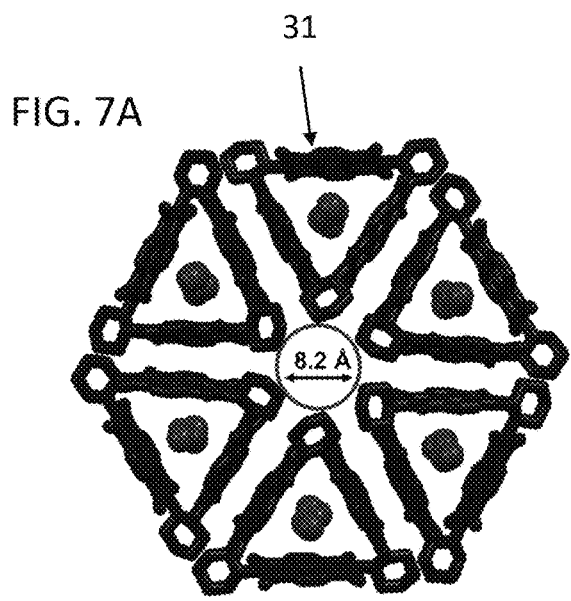
FIGS. 7A-7C. Crystal superstructure of γ-NDI-Δ showing (FIG. 7A) Six NDI-Δ 31 triangles around a vertex, 111111, interacting through $[\pi\ldots\pi]$ interactions to offer regular hexagonal superstructure hex-NDI-Δ (with one molecule of Et$_2$O inside the NDI-Δ cavity).
Figure 7B:
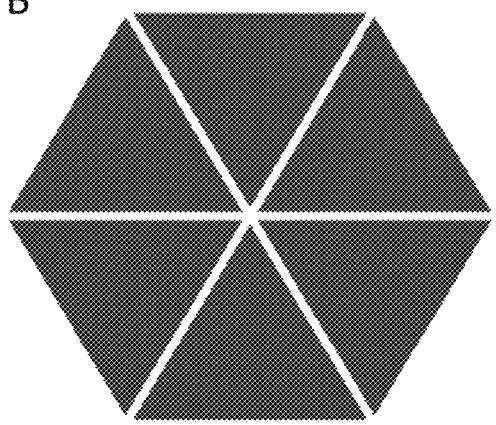
Figure 7C:
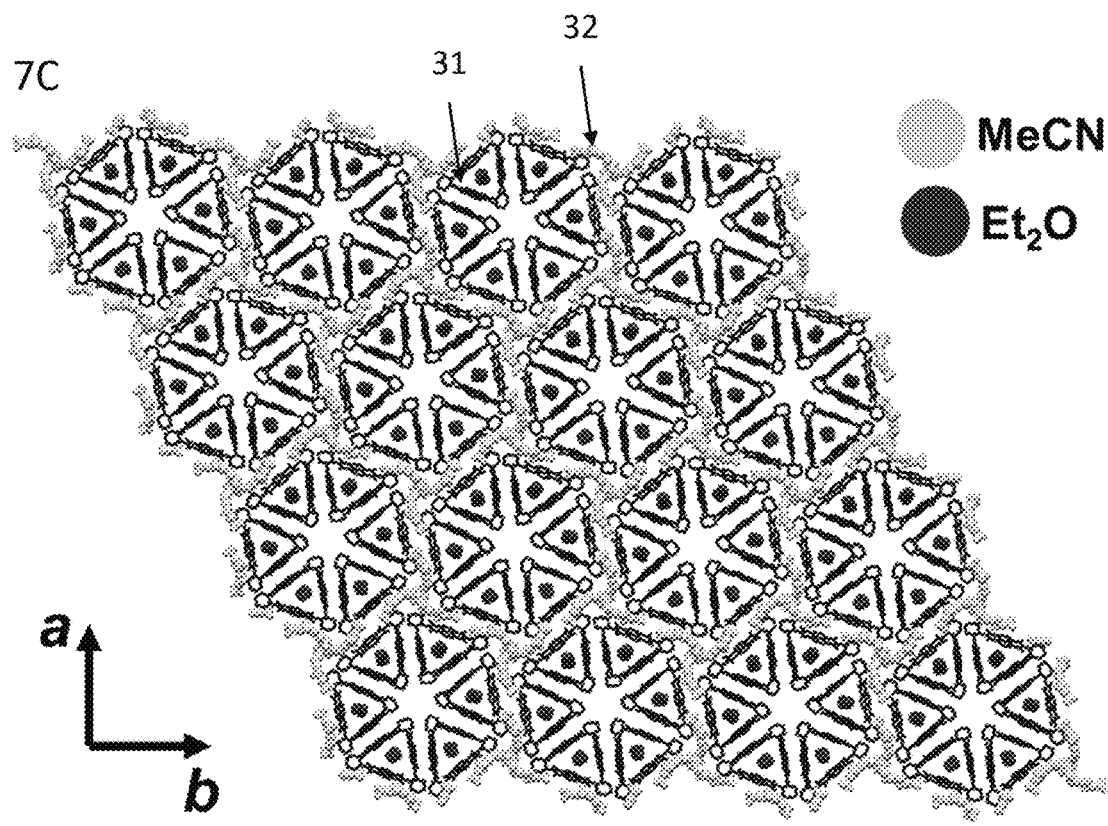

Further dilution of the NDI-Δ in MeCN ($9.6\times10^{-5}$ M) and crystallization by the slow diffusion of Et$_2$O resulted in colorless hexagonal needles suitable for single-crystal crystallography. γ-NDI-Δ crystallizes in the hexagonal P6$_2$ space group with one NDI-Δ in the asymmetric unit. The cavity of NDI-Δ contains (FIG. 7A-7B) one molecule of Et$_2$O. While along the c-axis, the NDI-Δ establishes a set of [C=O . . . H] hydrogen bonds to form supramolecular nanotubes similar to those found in β-NDI-Δ, in the ab-plane NDI-Δ interacts via [π . . . π] interactions of ~3.4 Å between the NDI units to form (FIG. 7A-7B) a uniform hexagonal superstructure, hex-NDI-Δ. In this case, six NDI-Δ molecules around a vertex form a small cavity of 8.2 Å diameter (FIG. 7A) and these hex-NDI-Δ, when viewed along the a-axis, together form a boat-like superstructure. In ATs, the hex-NDI-Δ superstructure is characterized by P6m symmetry. The arrangement of these hex-NDI-Δ in the crystal structure is different from the arrangement of the NDI-Δ units in β-NDI-Δ. The ATs in γ-NDI-Δ are considered as a case of periodic isogonal tiling[1] by non-edge-to-edge convex regular hex-NDI-Δ polygons (FIG. 7C). These hex-NDI-Δ are surrounded by MeCN solvent molecules which form a hexagonal grid of P6m symmetry in the ATs. Although the hexagonal tiling of hexagonal polygons was reported[14] recently, to the best of our knowledge, hexagonal molecular tiling of triangular polygons remains elusive. The present results provide useful insight into the control of packing of regular polygons through careful selection of the solvent (halogenated versus non-halogenated) as well as the choice of the concentration of the solute in non-halogenated solvents.

Crystallographic Studies of the CT Complexes

Three sets of co-crystals of NDI-Δ•TTF have been obtained using different crystallization conditions. Solvent modulation plays a critical role in controlling, not only the D/A stoichiometry ratio and the molecular arrangement in the crystal structure, but also it prevents the inclusion of the guest TTF inside the cavity of the NDI-Δ macrocycle. All the crystallographic data are reported in Table 2.

Crystal Structure of CT-A.

Figure 8A:
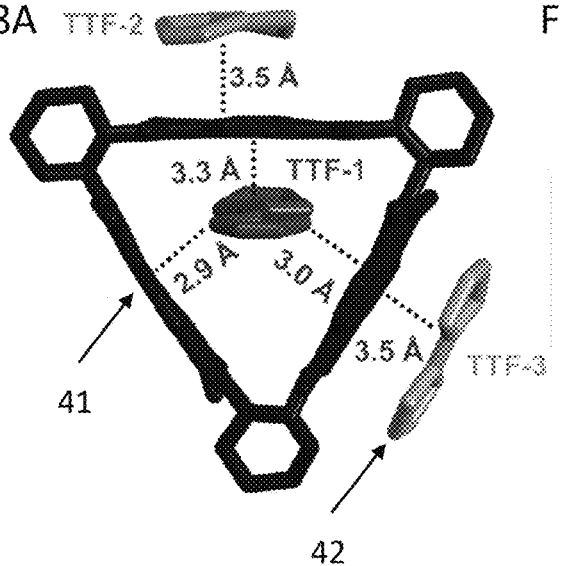
FIGS. 8A-8C. Crystal superstructure of CT-A showing (FIG. 8A) the asymmetric unit containing one NDI-Δ 41 and 2.5 TTF 42 molecules. The TTF inside the cavity was refined with an occupancy factor of 0.5.
Figure 8B:
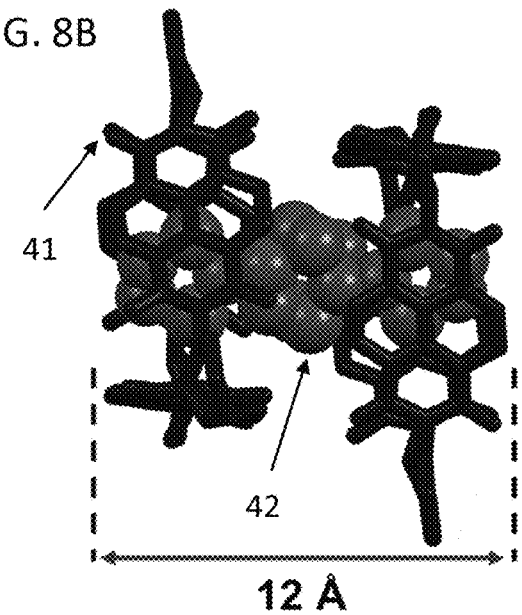
Figure 8C:
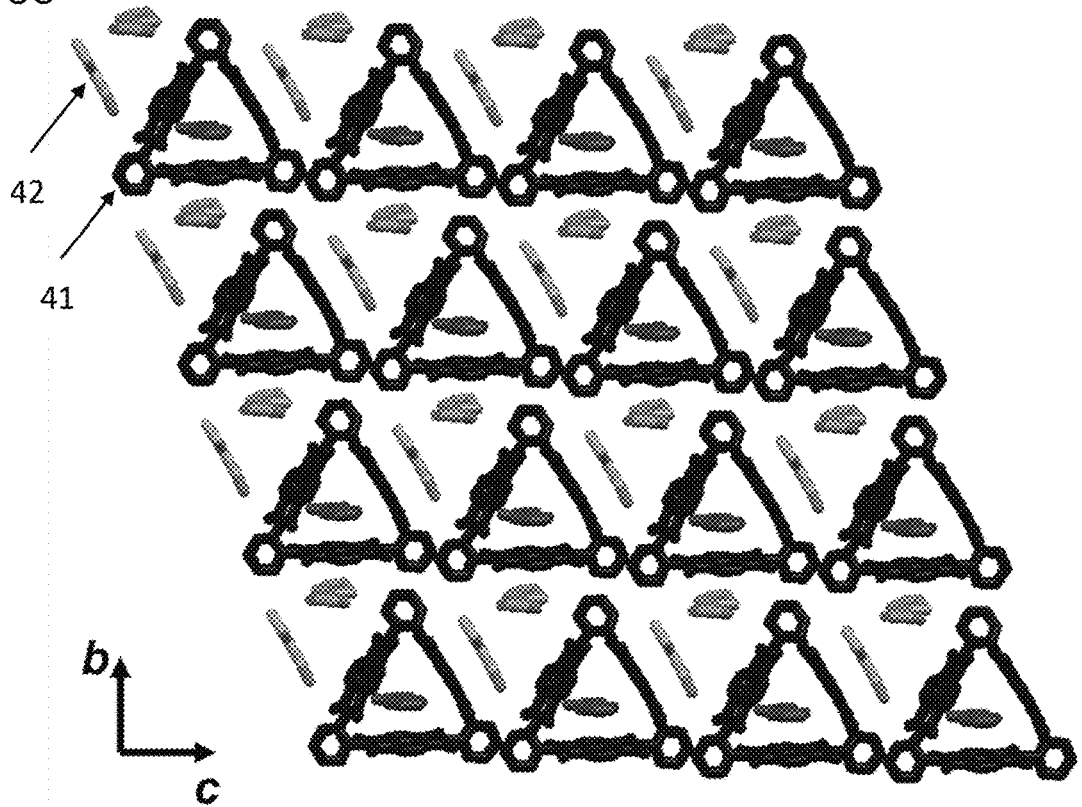
Figure 17A:
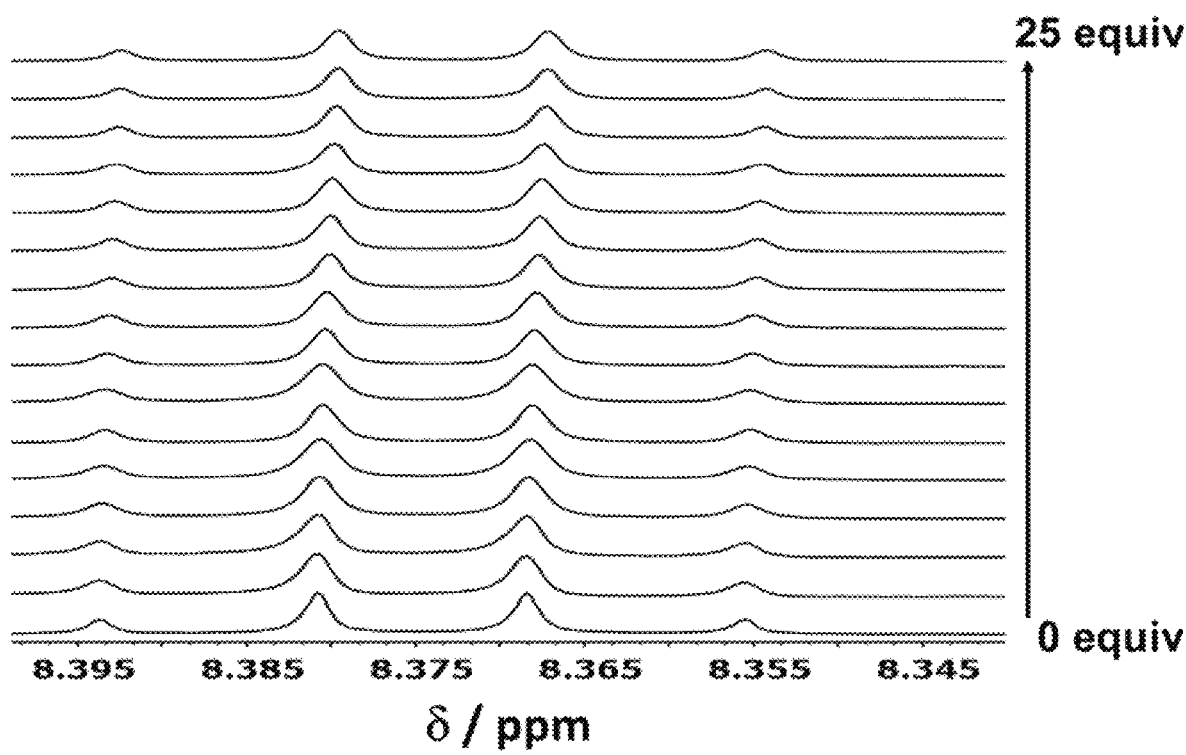
FIGS. 17A-17B.
Figure 17B:
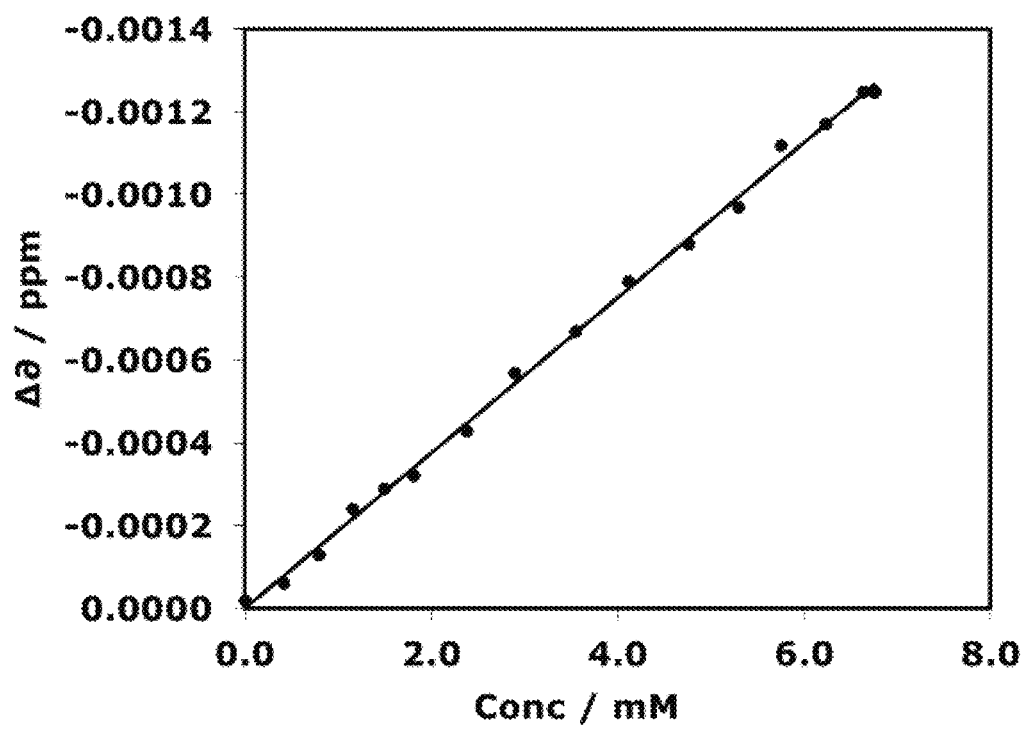

CT-A adopts (FIG. 8A) the triclinic space group P$\bar{1}$ with one NDI-Δ molecule and 2.5 TTF molecules in the asymmetric unit. Two NDI-Δ molecules ((NDI-Δ)$_2$) exhibit the classical C$_3$ rotation (60°) of hydrogen-bonded NDI-Δ ([C—H . . . O] interactions (mean d$_{[C \ldots O]}$=3.39 Å; mean $\theta_{[C-H \ldots O]}$=159°) to form (FIG. 8B) a cavity ~12 Å in length. The structure, however, does not form a long-range tubular superstructure because of the weak directionality of the CH interactions between TTF molecules inside the NDI-Δ cavity. The cavity of the (NDI-Δ)$_2$ dimer encapsulates one TTF molecule (TTF-1) which is disordered between the two NDI-Δ molecules with an occupancy factor of 0.5. Variable-temperature powder-XRD measurements revealed (FIG. 14) no change in the powder pattern profile, indicating that the disorder of TTF-1 is rather static. $^1$H NMR Titration of TTF into a solution of NDI-Δ in MeCN revealed (FIG. 17) an upfield shift of the NDI aromatic protons: a fit of the chemical shifts using a 1:1 binding model for a host-guest complex gave a binding constant of 1.8±0.02 M$^{-1}$. The guest TTF-1 molecule is in close contact with the three NDI units of NDI-Δ, establishing (FIG. 8A) a set of face-to-face [π . . . π] interactions of ~3.3 Å and edge-to-face [S . . . π(NDI)] interactions of 2.95 and 3.00 Å. These interactions are below the van der Waals radii for [C . . . C] and [S . . . C] distances of 3.4 Å and 3.5 Å, respectively. One of the edges of the NDI-Δ molecule interacts via [π . . . π] interactions of 3.35 Å between the NDI units to form a dimeric superstructure. The two other edges interact in a face-to-face fashion with two other TTF molecules, named TTF-2 and TTF-3. These two TTF molecules are distant from the NDI units at 3.5 Å. The relative orientation the TTF molecules with respect to the plane of the NDI units, however, is different. While TTF-1 and TTF-2 are oriented perpendicularly to the NDI units' plane, TTF-3 is oriented parallel to the NDI unit plane (FIG. 8A). The NDI-Δ and TTF molecules forms a 2D network of CT interactions in the bc-plane (FIG. 8C). These layers are interconnected by means of a set of [π . . . π] interactions between the NDI units and [S . . . S] interactions between the TTF molecules (d$_{S...S}$ in a range 2.98 to 3.70 Å; VDW radii for [S . . . S] interaction is 3.6 Å).

Figure 27:
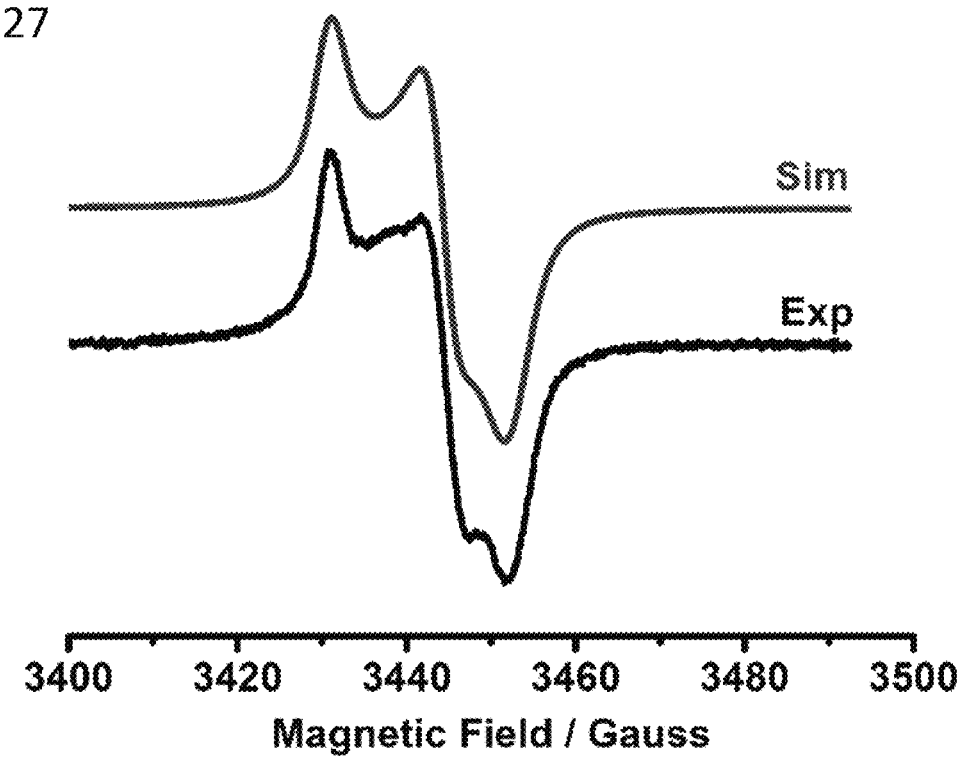
FIG. 27. EPR Signal of the CT-A at room temperature with (S=½, g$_{iso}$ (TTF)=2.0079 and g$_{iso}$ (NDI-Δ)=2.004).
Figure 30:
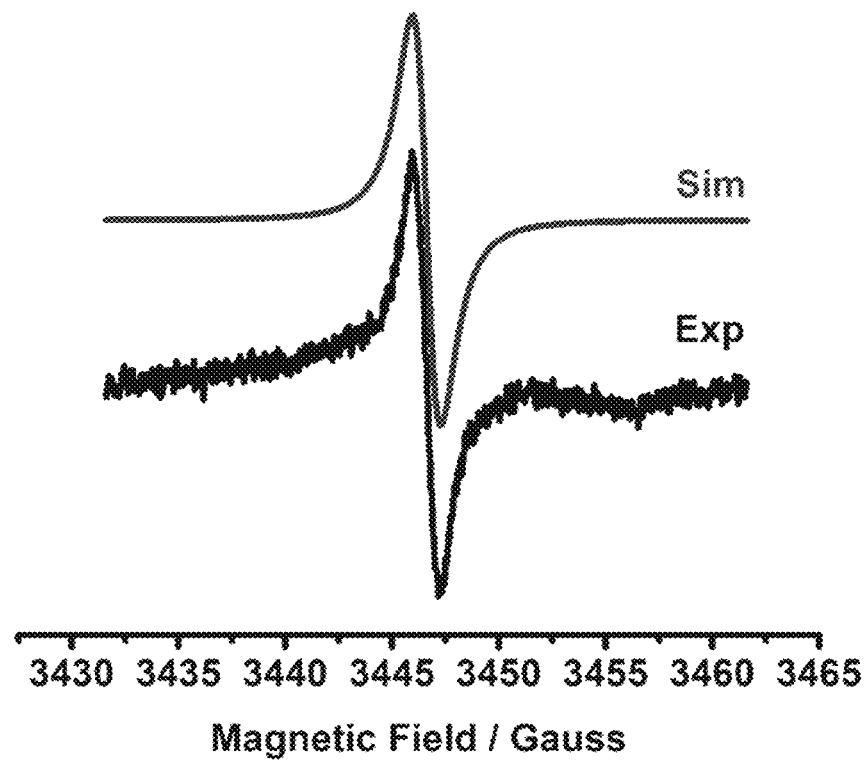
FIG. 30. EPR Signal of the ref-NDI•TTF monomer at room temperature (S=½, g$_{iso}$=2.006).

In previous studies[41] on CT complexes, the valency of organic molecules, as well as the electron transporting properties of the materials, can be predicted by analyzing the details of their superstructures, such as bond lengths, bond angles, separation distances and the packing motifs of donor and acceptor species. The side view reveals (FIG. 8A), that both TTF-1 and TTF-3 molecules are near planar (3.3 and 4.4°, respectively) while TTF-2 is slightly curved along the dithiole and lies with a torsion angle of ~11.3°. Such distortion could be a result of weak attractive intermolecular interactions. DFT calculations reveal that the structure of an isolated TTF molecule in the gas phase is not planar. Instead, it adopts a 'boat-like' conformation with a C$_{2v}$ point group[42] where the two pentagonal rings are slightly bent with an angle of about 12.9° and a C=C bond length of 1.33 Å. Additionally, the C=C bond lengths are benchmarks for predicting the oxidation states of TTF species.[42] Because they are adjacent to NDI units, the TTF molecules were expected to possess positive charges, and the central C=C bond was expected to be elongated by the single-bond component from the resonance structure compared with that in the neutral TTF. TTF-1 and TTF-2 are both thermally disordered preventing detailed analysis of the C=C bond lengths. The average of the C=C bond length, however, is estimated to be of 1.49 and 1.43 Å for TTF-1 and TTF-2, respectively, whilst in TTF-3, the C=C bond length is only slightly elongated to 1.36 Å. The C=C bond length in TCNQ-TTF is 1.369 Å (ρ$_{TFT}$=+0.59).[43] DFT calculations reveal[43] that radical TTF$^{•+}$ is characterized by a C=C bond length of 1.396 Å, while in TTF$^{2+}$, the bond length is 1.454 Å. In this context, it is obvious that TTF-1 and TTF-2 are in their radical cationic states, while TTF-3 is only partially oxidized owing to a CT to the electron-poor NDI-Δ at 100 K. It has been previously reported[44] that confinement of TTF inside metalorganic framework (MOF) pores induce an enhancement of a CT and a significant increase in the conductivity. EPR investigations of CT-A in the solid-state revealed the existence of an anisotropic signal. Simulated results indicate (FIG. 27) the existence of two types of paramagnetic centers, with a main component of g$_{iso}$=2.0079 and a minor component with g$_{iso}$=2.004. The EPR spectrum of the ref-NDI•TTF composite offered (FIG. 30) a very weak isotropic signal, indicative of a weak CT.

Figure 31:
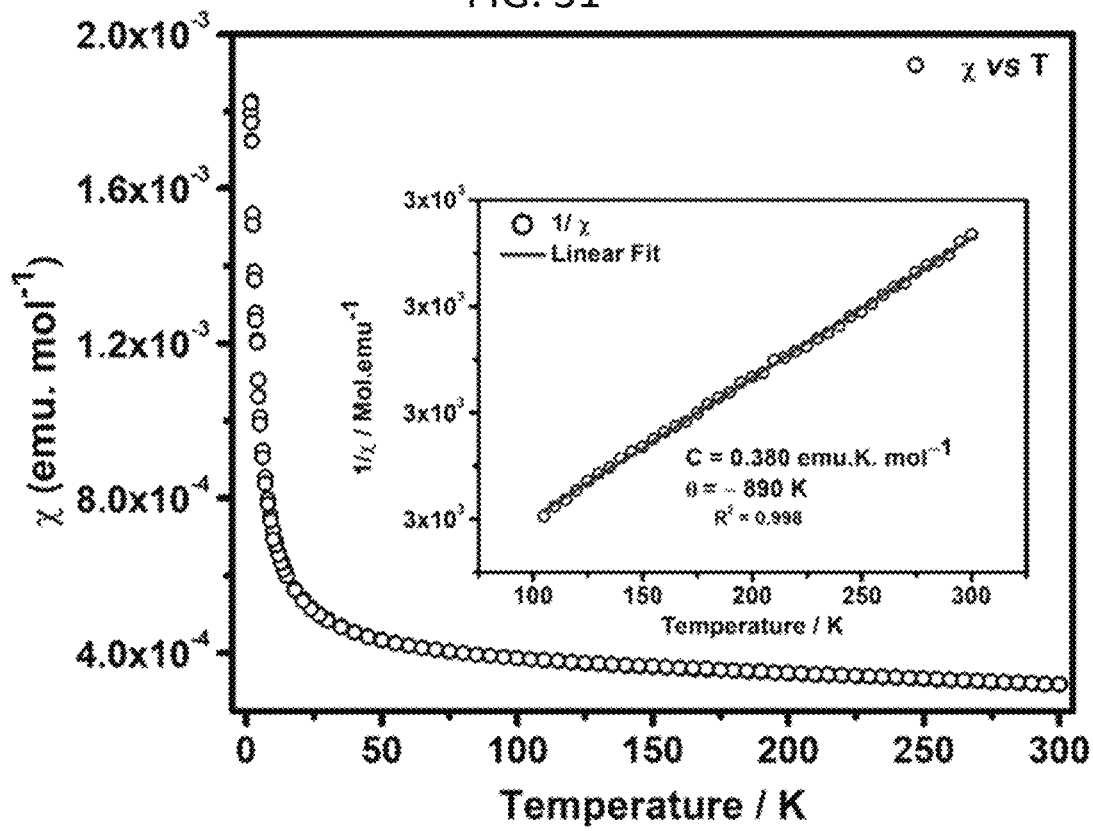
FIG. 31. Temperature dependence of magnetic susceptibility for CT-A. (Inset) 1/χ vs T plot FIG. 32. Plot of the χT vs T plot FIG. 33. Plot of the magnetic moment vs magnetic field at different temperatures for CT-A: 2K 111, 5 k 112, and 10K 113.
Figure 32:
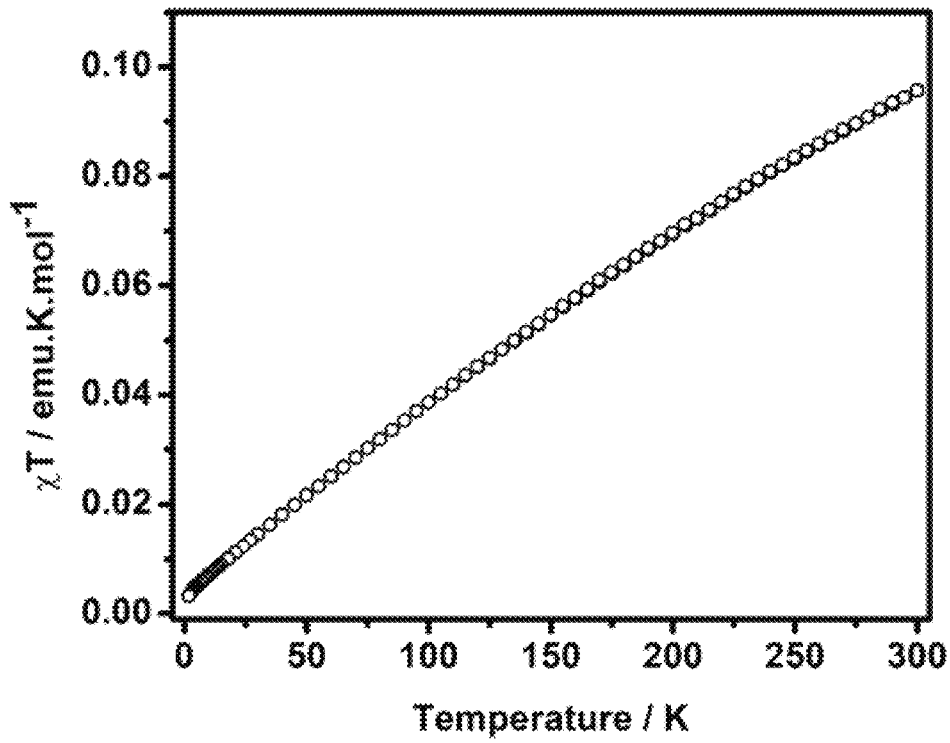

Previous studies revealed that the EPR signal of TTF, either in solution or in the solid state, is centered at around g=2.006.[45] The g-tensor of the NDI-Δ$^{•-}$ and NDI-Δ$^{3•-}$ have been reported[33,34] to be centered at ~g$_{iso}$=2.0035. Therefore, the slight shift of the g$_{iso}$-value is indicative of both (i) the delocalization of the spin density as the result of the close intermolecular contacts and (ii) the contribution to the anisotropic shape of the EPR signal from chemically and crystallographically distinct paramagnetic components. Although the magnetic susceptibility (FIG. 31) in the high-temperature region indicates the analogous paramagnetism arising from the spin-½ residing on each D$^{•+}$ and A$^{•-}$ radical, its monotonic increase on cooling combined with the field dependence of the magnetisation at low temperatures (FIG. 33) represent the absence of the spin Peierls transition. The χT product in FIG. 32 is lower than the expected value for a S=½ system which denotes either a partial charge transfer or the existence of strong antiferromagnetic interactions.

Crystal Structure of CT-B.

Figure 21:
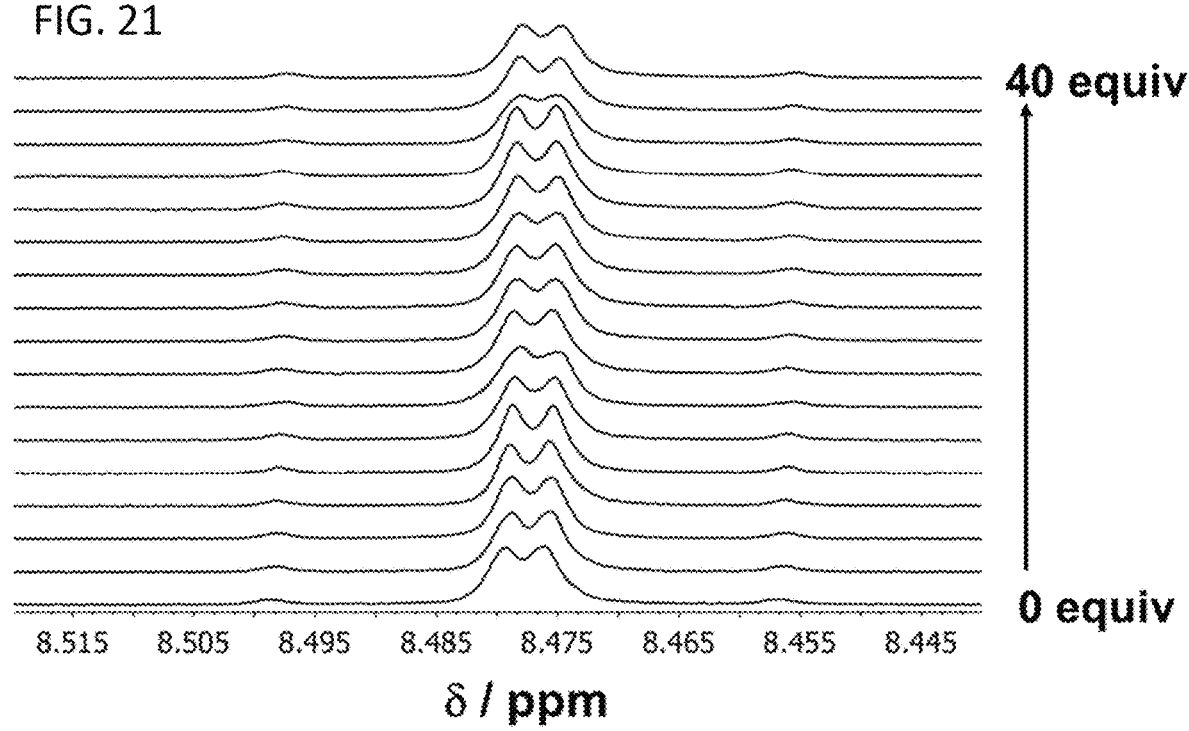
FIG. 21. $^1$H NMR (600 MHz, CHCl$_3$, 298 K) titration spectra of NDI-Δ with TTF. The insignificant chemical shift of the NDI aromatic protons indicates the non-inclusion of the TTF inside the NDI-Δ cavity.
Figure 23A:
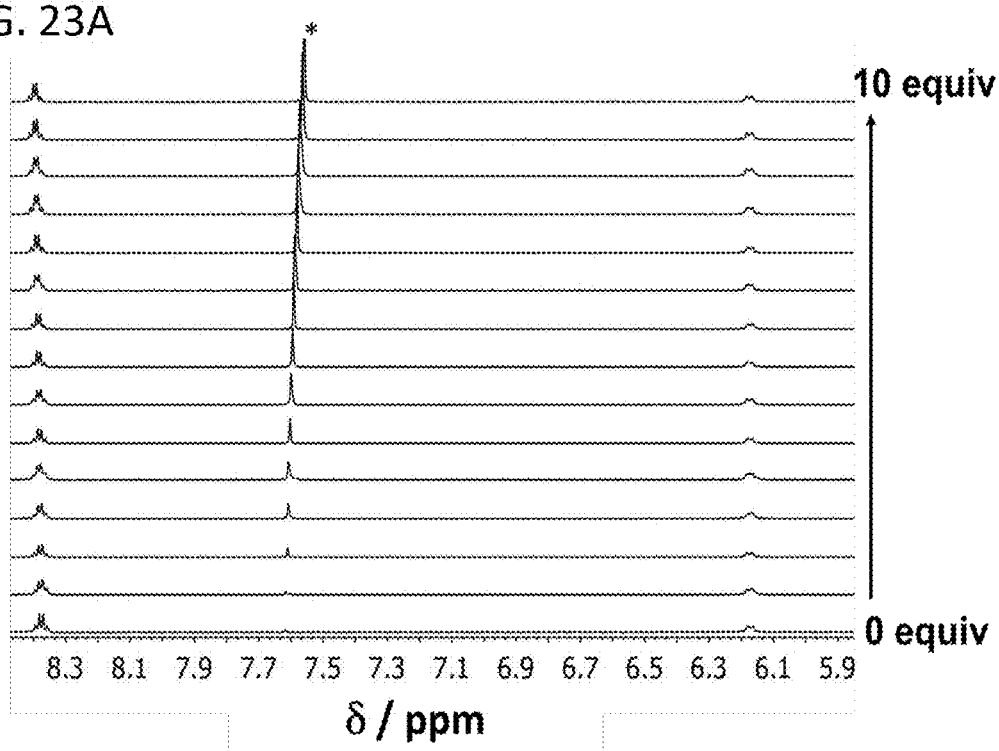
FIGS. 23A-23B.
Figure 23B:
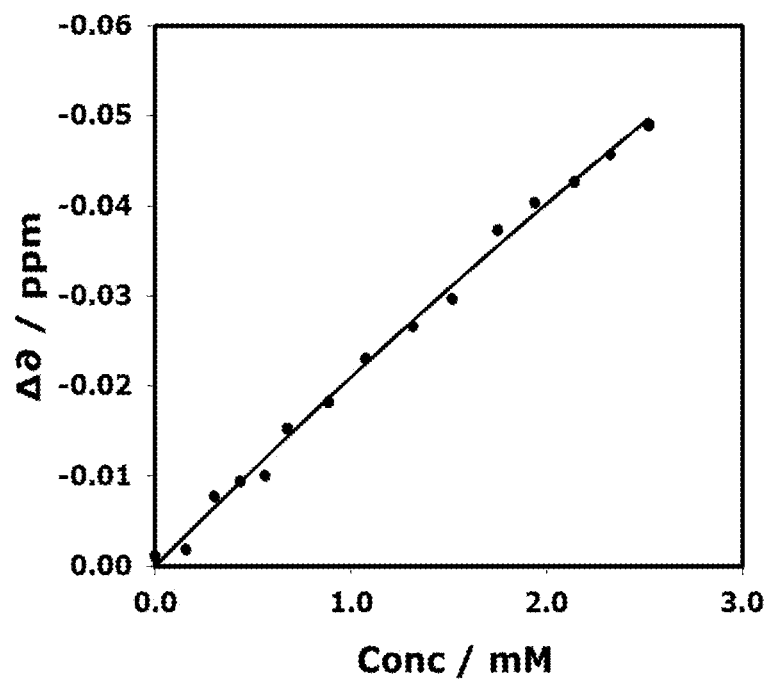
Figure 28:
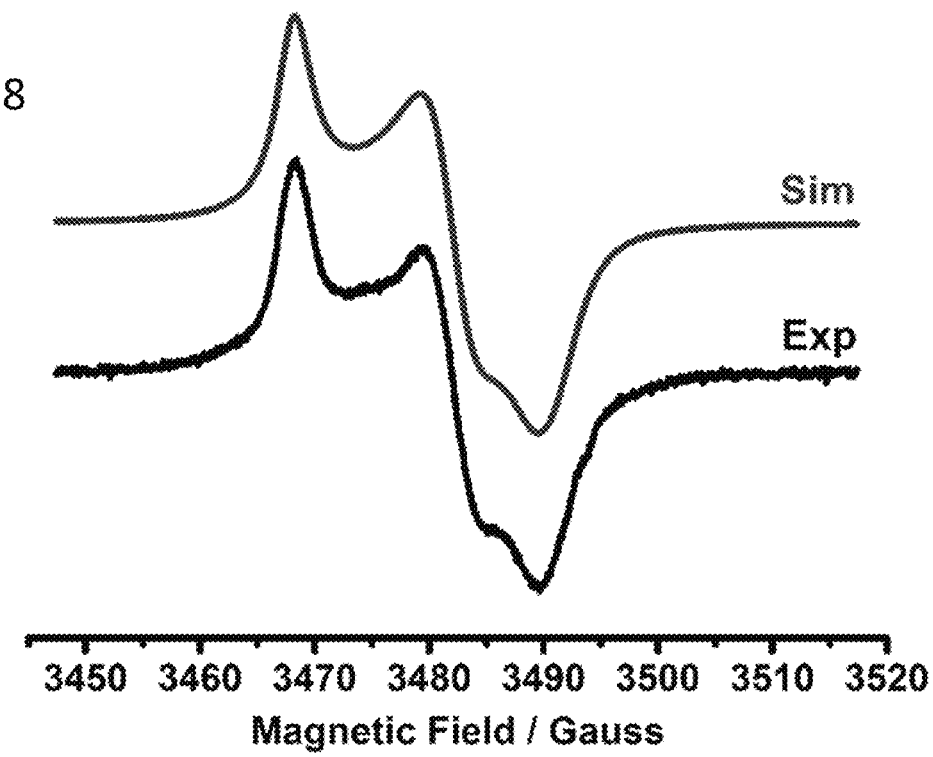
FIG. 28. EPR Signal of the CT-B at room temperature (S=½, g$_{iso}$(TTF)=2.0077, g$_{iso}$(NDI-Δ)=2.0037).

The arrangement of NDI-Δ in the solid-state is very sensitive to solvent identity and concentration, as is the co-crystallization of NDI-Δ and TTF. Crystallization of NDI-Δ and TTF by the slow diffusion of hexane into a solution of NDI-Δ•TTF in CHCl$_3$ leads to the formation of a CT complex of NDI-Δ:TTF in a 2:3 mole ratio. CT-B crystallizes (FIG. 9A) in a trigonal P3$_2$1 space group with two crystallographically distinct NDI-Δ molecules in the asymmetric unit. The two crystallographically distinct NDI-Δ molecules display a perpendicular rotation angle of 60° (a 3-fold screw axis) as a result of the stabilization by three pairs of self-complementary [C—H . . . O] interactions (mean d$_{[C...O]}$=3.25 Å; mean θ$_{[C—H...O]}$=162°) between the NDI units. The propagation of these hydrogen bonds along the c-axis leads to the formation of supramolecular nanotubes (FIG. 9B) similar to those observed in other superstructures when a structure-directing 1,2-dihaloethane solvent is utilized.[37] In keeping with the superstructure of NDI-Δ•CHCl$_3$, the cavity of NDI-Δ macrocycle in the CT-B superstructure contains (FIG. 9A) molecules of CHCl$_3$. Apparently, NDI-Δ has stronger affinity to bind CHCl$_3$ than TTF. Titration of TTF into a CHCl$_3$ solution of NDI-Δ did not result (FIG. 21) in any change of the aromatic chemical shift of the NDI protons in the $^1$H NMR spectrum, while titration of CHCl$_3$ into a MeCN solution of NDI-Δ resulted in a strong shift of the aromatic protons, indicative (FIG. 23) of the binding (K$_a$=15 M$^{-1}$) of CHCl$_3$ inside the NDI-Δ cavity. These data support the favorable interaction of chlorinated solvents through [Cl . . . π(NDI)] and [Cl . . . H(NDI)] contacts. Surprisingly, one NDI-Δ of the two crystallographically distinct molecules interacts with three TTF molecules through face-to-face [π . . . π] interactions of 3.27(1) Å and [C—H(cyclohexane) . . . π(TTF)] interactions of 2.88(1) Å to form (Layer 1 in FIG. 9C-9D) a 2D D/A layer-like superstructure. The second NDI-Δ interacts with CHCl$_3$ solvent through a set of [Cl . . . π(NDI)] interactions (Layer 2 in FIG. 9E-9F). It is remarkable that, in the absence of TTF, NDI-Δ forms neither supramolecular nanotubes nor a layer-like superstructure, but the presence of TTF modulates the packing to yield supramolecular nanotubes and layer-like superstructures. In the D/A layer (Layer 1), one structurally well-ordered CHCl$_3$ molecule interacts with TTF through [Cl . . . S] contacts of 3.55(2) Å (VDW radii=3.55 Å) to form (FIG. 9C) a 2D network superstructure. The CHCl$_3$ molecules are arranged (FIG. 9C) in a hexagonal fashion and can be considered as the vertices of a regular hexagon. In the ATs, these solvent-based regular hexagons are arranged in a P6m symmetry where three hexagons share same vertices. The second crystallographically distinct NDI-Δ interacts with CHCl$_3$ solvent through a set of [Cl . . . π(NDI)] and [Cl . . . H—C(Cyclohexane)] interactions. The NDI-Δ triangle also displays (FIG. 9E-9F) a vertex-to-edge tiling in the ab-plane. In Layer 2, by contrast, the two CHCl$_3$ lattice molecules interact through [Cl . . . Cl] bonds of 3.509(7) and 4.24(1) Å (VDW radii=3.5 Å) to form (FIG. 9E) supramolecular CHCl$_3$-based triangles. These triangles tessellate in hexagonal fashion (P6m symmetry) through [Cl . . . Cl] interactions to form a hexagonal grid of solvent, similar to those found in the D/A layer (Layer 1). The two distinct layers—DADADA (Layer 1) and AAAAA (Layer 2)—in the ab-plane can be represented schematically as a triangular grid of NDI-Δ inside a hexagonal grid of CHCl$_3$. Certainly, the interplay between the molecular structures of the NDI-Δ and the honeycomb supramolecular arrangement of the CHCl$_3$ through a set of [Cl . . . Cl] and [Cl . . . S(TTF)] interactions plays a crucial role in the 2D packing of CT-B. Powder-XRD measurements show (FIG. 15) the semi-crystalline nature of CT-B after removal of solvent, supporting the fragile nature of the crystal structure. Along the c-axis these layers alternate to form DADA-AAAA-DADA-AAAA stacking motifs. The TTF molecule is relatively flat with a bending angle of the dithiol rings of 5.6° and a C=C bond length of 1.35(1) Å which is indicative of a partial charge transfer from TTF to NDI-Δ. EPR spectroscopy confirmed (FIG. 28) the ionic state of the CT-B complex. The absence of a long-range propagation of the CT interactions between the NDI units and the TTF molecules, however, might hamper electron transport in this material.

Crystal Structure of CT-C.

Figure 10A:
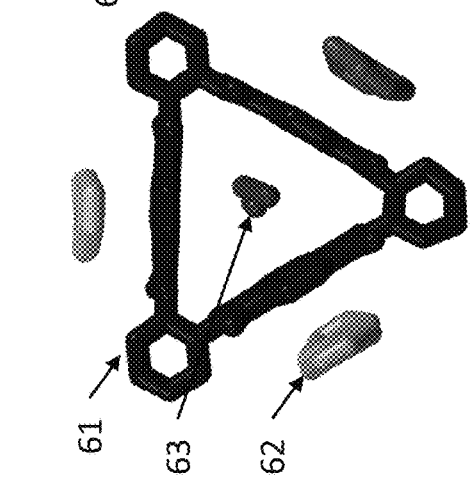
FIGS. 10A-10F. Crystal superstructure of CT-C showing (FIG. 10A) the asymmetric unit containing one NDI-Δ 61 and three TTF 62 molecules, with CH$_2$Cl$_2$ 63 in the cavity of NDI-Δ 61. Hydrogen atoms are removed for the sake of clarity and colors represent the symmetry equivalence.
Figure 10C:
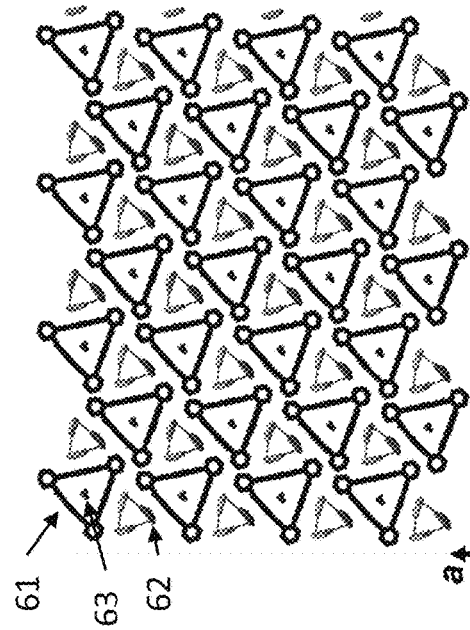
Figure 10E:
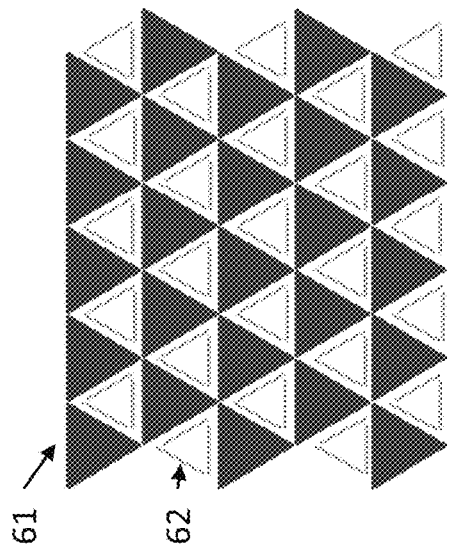
Figure 10B:
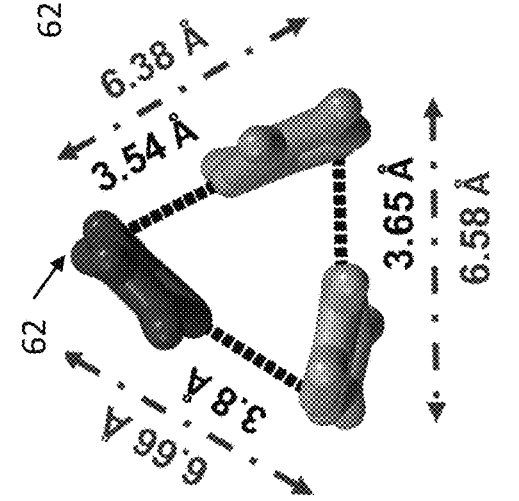
Figure 10D:
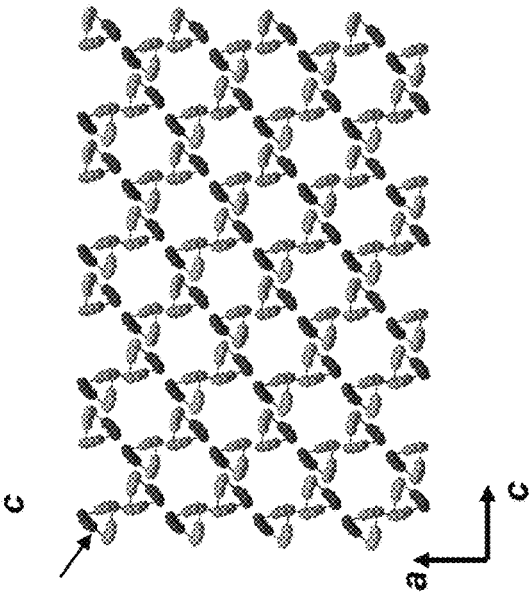
Figure 10F:
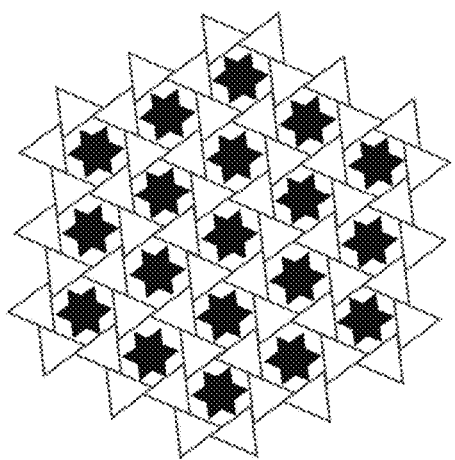
Figure 19:
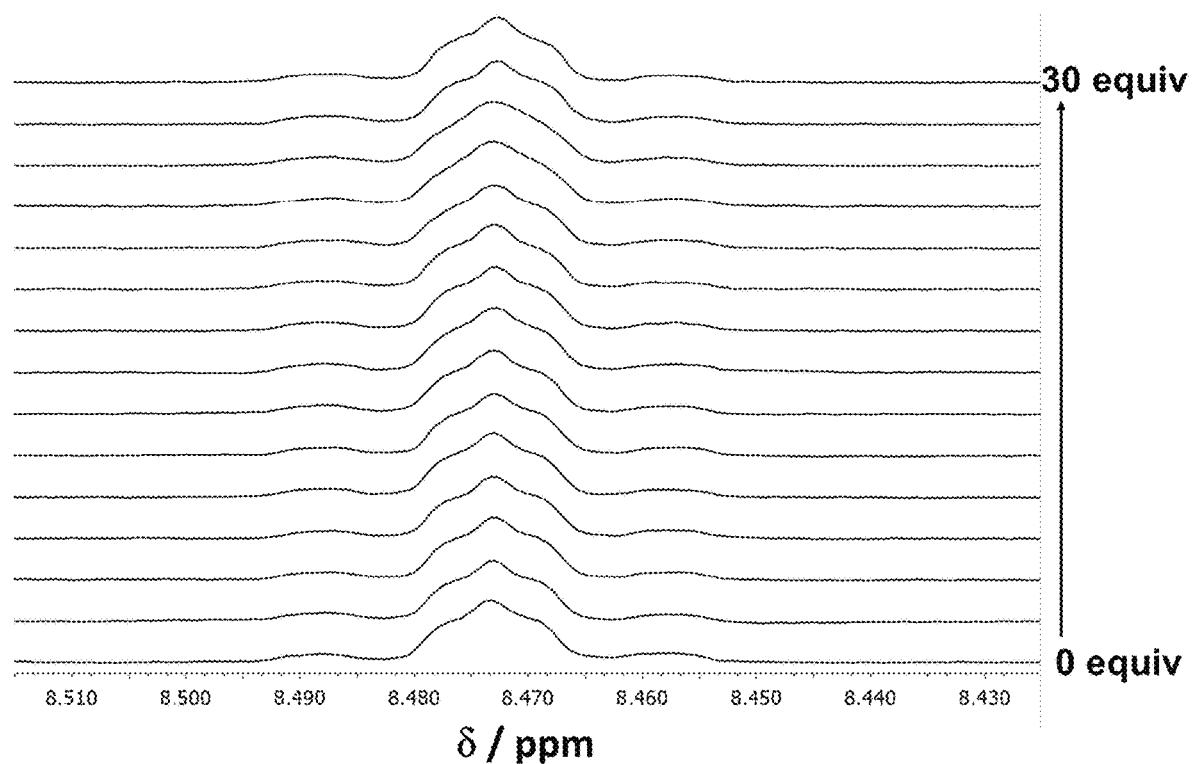
FIG. 19. $^1$H NMR (600 MHz, CD$_2$Cl$_2$, 298 K) titration spectra of NDI-Δ with TTF. No shift of the NDI-Δ protons indicating that CD$_2$Cl$_2$ prevents TTF inclusion inside the cavity.

The co-crystal CT-C was formed either by (i) slow diffusion of Et$_2$O or hexane into a solution of NDI-Δ and TTF solubilized in CH$_2$Cl$_2$ or (ii) slow evaporation of CH$_2$Cl$_2$. Once again, we found (FIG. 10A) that the use of chlorinated solvents prevented TTF from entering the cavity of NDI-Δ. $^1$H NMR Titration of TTF into a solution of NDI-Δ in CH$_2$Cl$_2$ did not display a significant chemical shift of the protons, indicating (FIG. 19) the lack of any binding of TTF inside NDI-Δ. CT-C crystallizes in the monoclinic P2$_1$/n space group with three TTF molecules and one NDI-Δ molecule in the asymmetric unit (FIG. 10A). Again, stacking of NDI-Δ displays perpendicular rotation angle of 60° around a 3-fold screw axis as a result of the stabilization by three pairs of self-complementary [C—H . . . O] interactions (mean d$_{C...O}$=3.25 Å and mean θ$_{[C-H...O]}$=161°) between the NDI units). The propagation of these hydrogen bounds along the b-axis leads to the formation of supramolecular nanotubes similar to those of CT-B. Unlike CT-A, however, in which only two edges of the NDI-Δ interact with TTF molecules, while the third edge interacts by [NDI . . . NDI] [π . . . π] interactions, in CT-C, each face of NDI-Δ interacts with one TTF molecule in a perpendicular face-to-face fashion (FIG. 10A). The [π . . . π] distances between TTF and NDI units are in the range of 3.1(1)-3.28(4) Å (VDW radii=3.4 Å). Propagation of these CT interactions in the ac-plane leads (FIG. 10B) to the formation of 2D layer-like superstructure. The three TTF molecules interact through close S . . . S contacts of 3.48(8)-3.70(8) Å to form (FIG. 10C) a supramolecular triangle (TTF-Δ). This TTF-Δ is a semi-regular triangle with length edges in the range of 6.4-6.7 Å, similar to those of the supramolecular triangles of CHCl$_3$ in CT-B (6.89 and 6.09 Å). According to the ATs, the two polygons NDI-Δ and TTF-Δ adopt (FIG. 10C) a triangular tessellation pattern in the ab-plane with two different triangles. This 2D geometrical packing leads to the propagation of the CT interactions in a 2D layer. The TTF-Δ interact through unidirectional S . . . S contacts of 3.89(2) and 3.19(1) Å to form supramolecular chains. As a result of the rotational symmetry of two NDI-Δ along the c-axis, the TTF-Δ are arranged in hexagonal fashion with intermolecular [S . . . S] contacts propagating along one direction (FIG. 10D). Similar to the structure of CT-B in which solvent molecules form a supramolecular hexagonal shell, the TTF-Δ molecules form a hexagonal grid in which NDI-Δ stacks along the b-axis to form supramolecular nanotubes (FIG. 10E-10F). A view of the superstructure along the c-axis illustrates the formation of stacked DADA layers. The absence of lattice solvent in CT-C increases the thermal stability of the material which is essential for single crystal electron-transport measurements. Indeed, thermal studies using VT powder XRD over a temperature range 100 to 400 K revealed (FIG. 16) no change in the powder pattern, indicating the high stability of the material.

Figure 29:
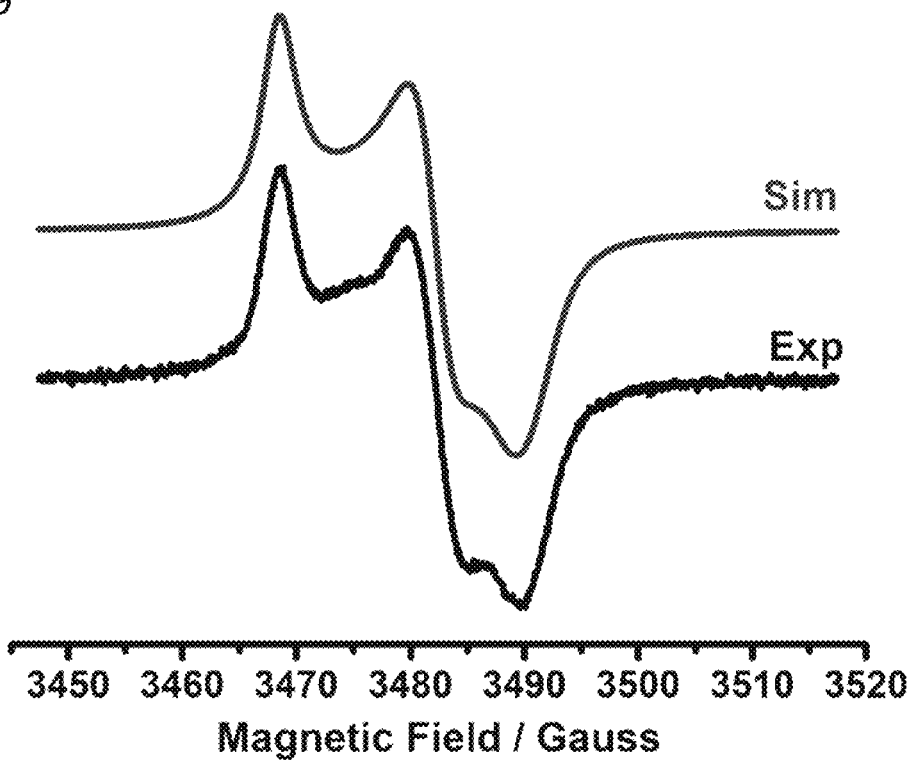
FIG. 29. EPR Signal of the CT-C at room temperature (S=½, g$_{iso}$(TTF)=2.0078 and g$_{iso}$(NDI-Δ)=2.0037).

Detailed structural analysis of the TTF molecules revealed that TTF-1 is almost planar—the two pentagonal rings are slightly bent with an angle of 7.3°—with its C=C bond length elongated to 1.42(4) Å, corresponding to the radical cationic state. Both TTF-2 and TTF-3 are slightly curved with an angle between the two pentagonal rings of 13.5 and 15.4°, respectively. The C=C bond length of TTF-2 of 1.35(3) Å is slightly more elongated than those of neutral TTF; this pattern is indicative of the partial CT while the C=C bond length of TTF-3 is 1.32 (3) Å, similar to those of neutral TTF (1.33 Å). In this context, the close interaction between these TTF molecules through short [S . . . S] contacts below the VDW radii—VDW radius for [S . . . S] contact is 3.6 Å—is consistent with the formation of a mixed-valence state between a radical cationic TTF (TTF$^{•+}$), a partially oxidized TTF and a neutral TTF. EPR Spectroscopic studies of CT-C in the solid-state and at room temperature revealed the existence of anisotropic signal similar to that for CT-A. Simulated results indicate (FIG. 29) the existence of two types of paramagnetic centers, with a main component of g$_{iso}$=2.0079 and a minor component with g$_{iso}$=2.004. Thus, the slight shift of the g$_{iso}$-value shows both the delocalization of the spin density as a result of the close intermolecular contacts and a contribution to the anisotropic shape of the EPR signal from chemically and crystallographically distinct paramagnetic components.

Solution Spectroscopic Properties

Figure 11A:
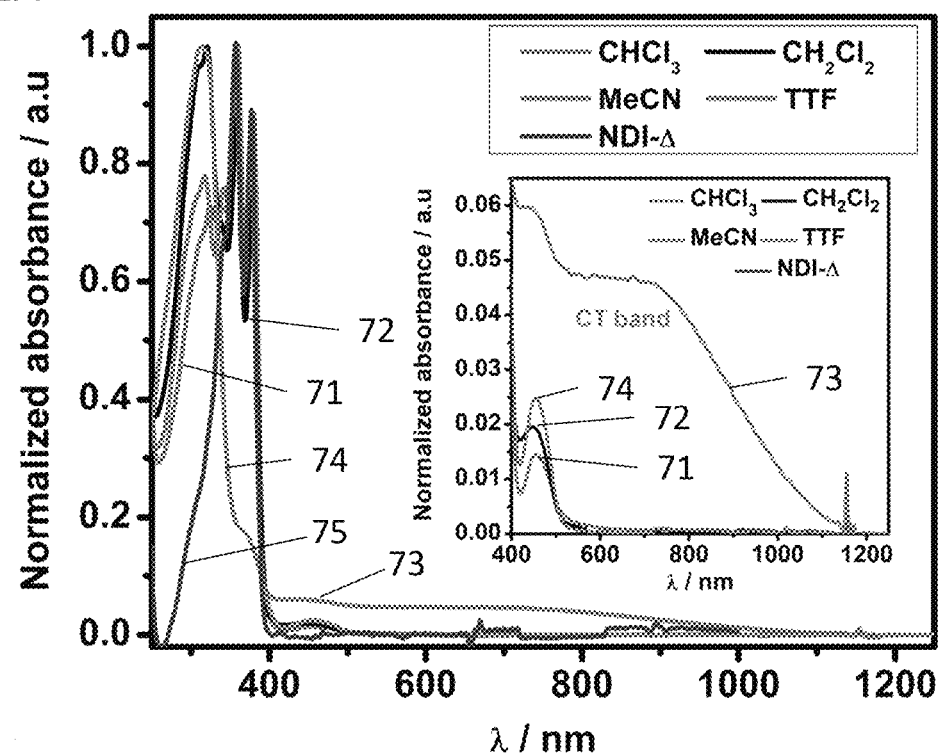
FIGS. 11A-11B.
Figure 11B:
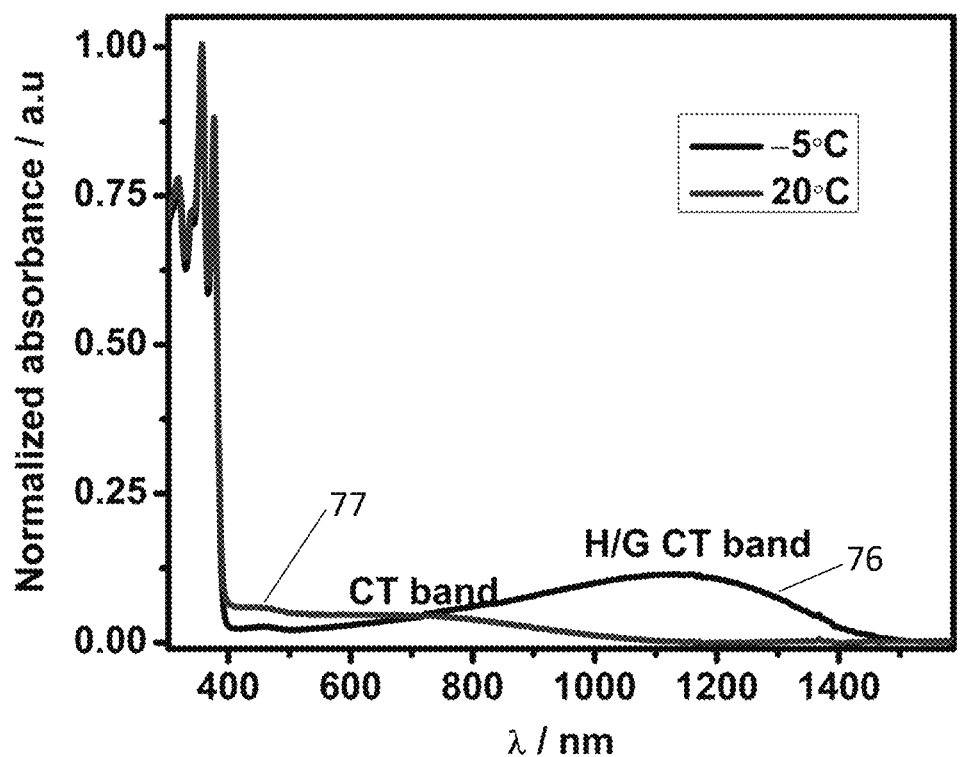

All solution samples of NDI-Δ and TTF for UV/Vis spectroscopic studies were measured at concentration of 5×10$^{-5}$ M. In the first instance we have analyzed the UV-Vis spectra of NDI-Δ and TTF in MeCN separately. NDI-Δ exhibits (FIG. 11A-11B) a vibronically structured absorption in the UV-Vis region with maxima at 340, 356 and 375 nm, indicative of the rigid structure of the NDI-Δ. These maxima correspond to π→π* transitions occurring in the NDI units. TTF exhibits typical absorption bands at 315, 372 and 454 nm associated with π→π* transitions.[46] In order to probe the effect of solvent in the formation of the TTF⊂NDI-Δ complex observed in the crystallographic studies, UV-Vis absorption studies of a mixture of NDI-Δ and TTF at a molar ratio of 1:3 and solubilized in different solvents (CHCl$_3$, CH$_2$Cl$_2$ and MeCN) have been recorded (FIG. 11A-11B). The absorption spectra are dominated by TTF and NDI-Δ π→π* transitions which are influenced slightly by solvent polarity. As the solvent polarity decreases (MeCN>CH$_2$Cl$_2$>CHCl$_3$), the absorption bands (356 and 375 nm) of NDI-Δ in MeCN undergo a small bathochromic shift. In CH$_2$Cl$_2$, the absorption bands of NDI-Δ are centered at 358 and 378 nm, while in CHCl$_3$ the bands are further shifted to 360 and 380 nm. This behavior indicates[47] that the bathochromic shift is not associated with polarity but rather with the existence of intermolecular interactions with solvents ([Cl . . . π] interactions). In the visible region of the spectra collected at room temperature in MeCN, a small CT band centered on 700 nm indicates the formation of the TTF⊂NDI-Δ adduct. This band is absent in CHCl$_3$ and CH$_2$Cl$_2$ even at lower temperatures (Figures S23,S24). These data are consistent with the crystal structures and 41 NMR Titrations which have shown that CHCl$_3$ and CH$_2$Cl$_2$ have better affinity for the NDI-Δ cavity than does TTF. Previous studies[47] of catenanes containing TTF and NDI units have shown a CT band in the range of 400 to 500 nm, while TTF⊂CBPQT (cyclobis(paraquat-p-phenylene)) has a stronger binding affinity and shows[48] a broad CT band centered at 830 nm. This behavior implies that the NDI-Δ cavity favors the interaction with TTF in MeCN and therefore enhances the CT character. Notably, a decrease in temperature leads to a significant red shift of the CT band to 1140 nm, corresponding to an increase of the binding between the NDI-Δ cavity and the TTF guest. Gas-phase DFT calculations revealed (Table 3) that the HOMO-LUMO charge separation ($\Delta E_{HOMO-LUMO}$) between NDI-Δ and TTF is 1 eV (1240 nm). The magnitude of the charge separation between the two moieties is slightly affected by solvent polarity. In MeCN, $\Delta E_{HOMO-LUMO}$=1.22 eV (1016 nm) while in CHCl$_3$ and CH$_2$Cl$_2$ $\Delta E_{HOMO-LUMO}$=1.16 eV (1068 nm). These theoretical studies are consistent with the experimentally determined CT band at 1140 nm for the TTF⊂NDI-Δ complex.

Solid-State Spectroscopic Studies

Figure 12:
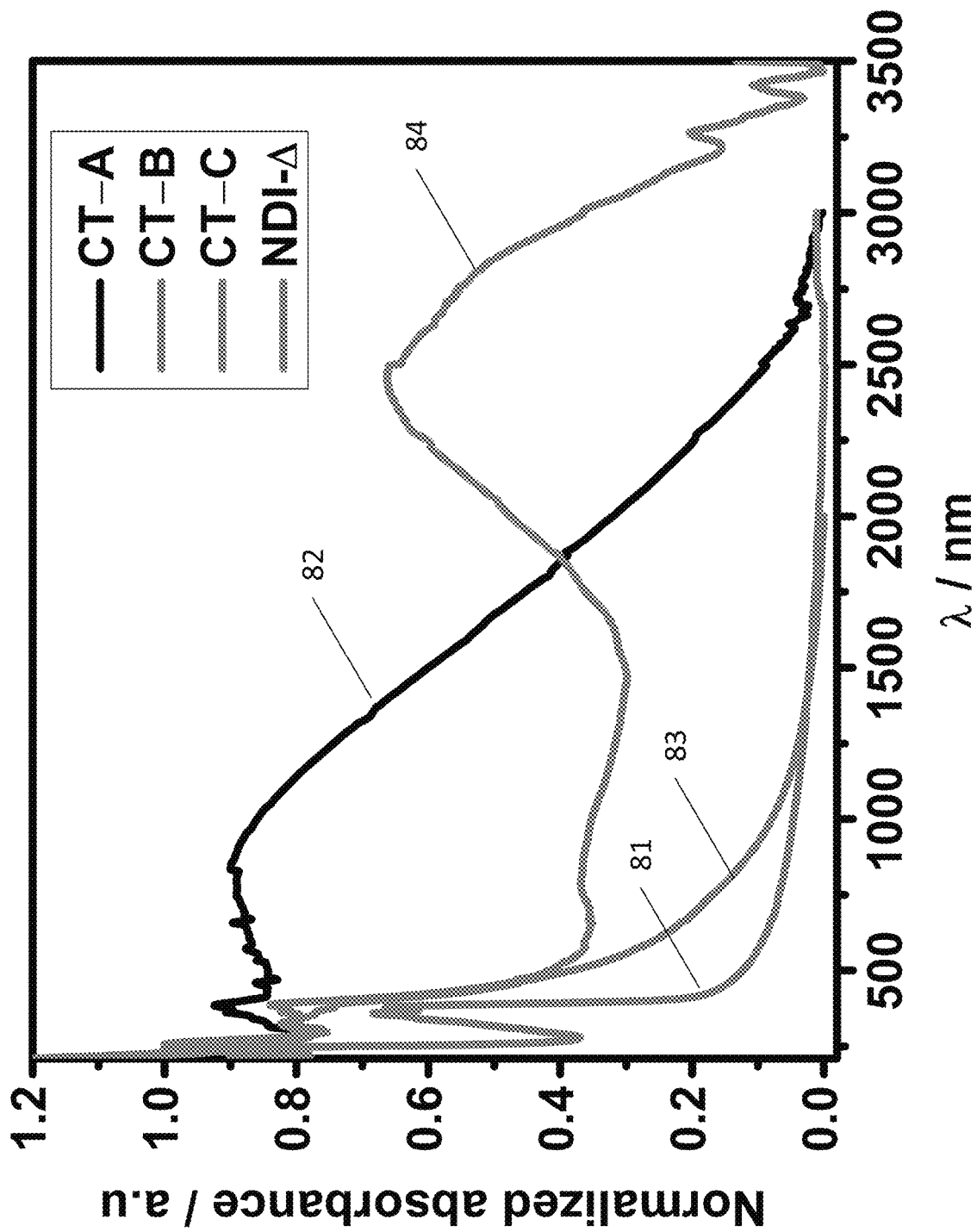
FIG. 12. Room temperature solid-state absorption spectra of NDI-Δ 81, CT-A 82, CT-B 83 and CT-C 84.
Figure 35:
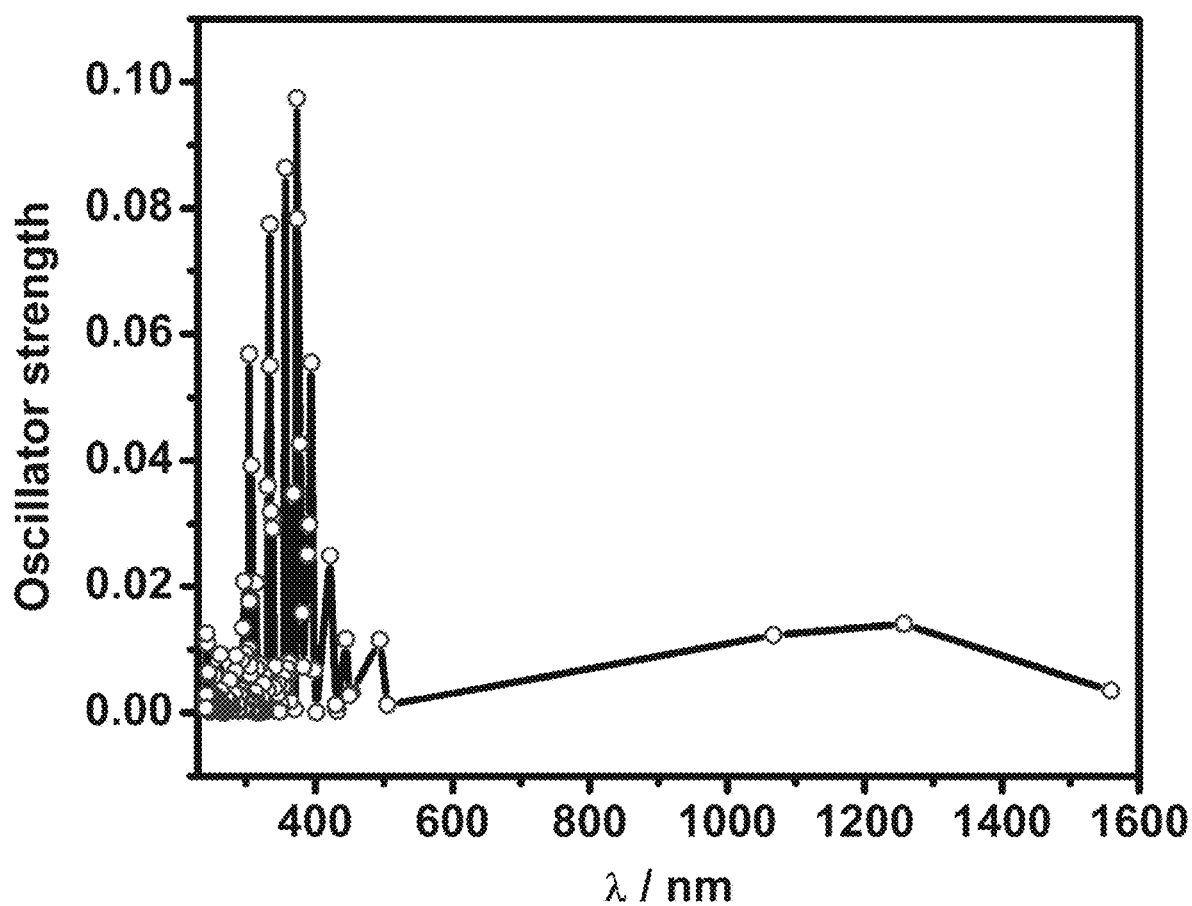
FIG. 35. Calculated UV/visible spectrum for TTF ⊂ NDI-Δ (no scaling factor applied).
Figure 36:
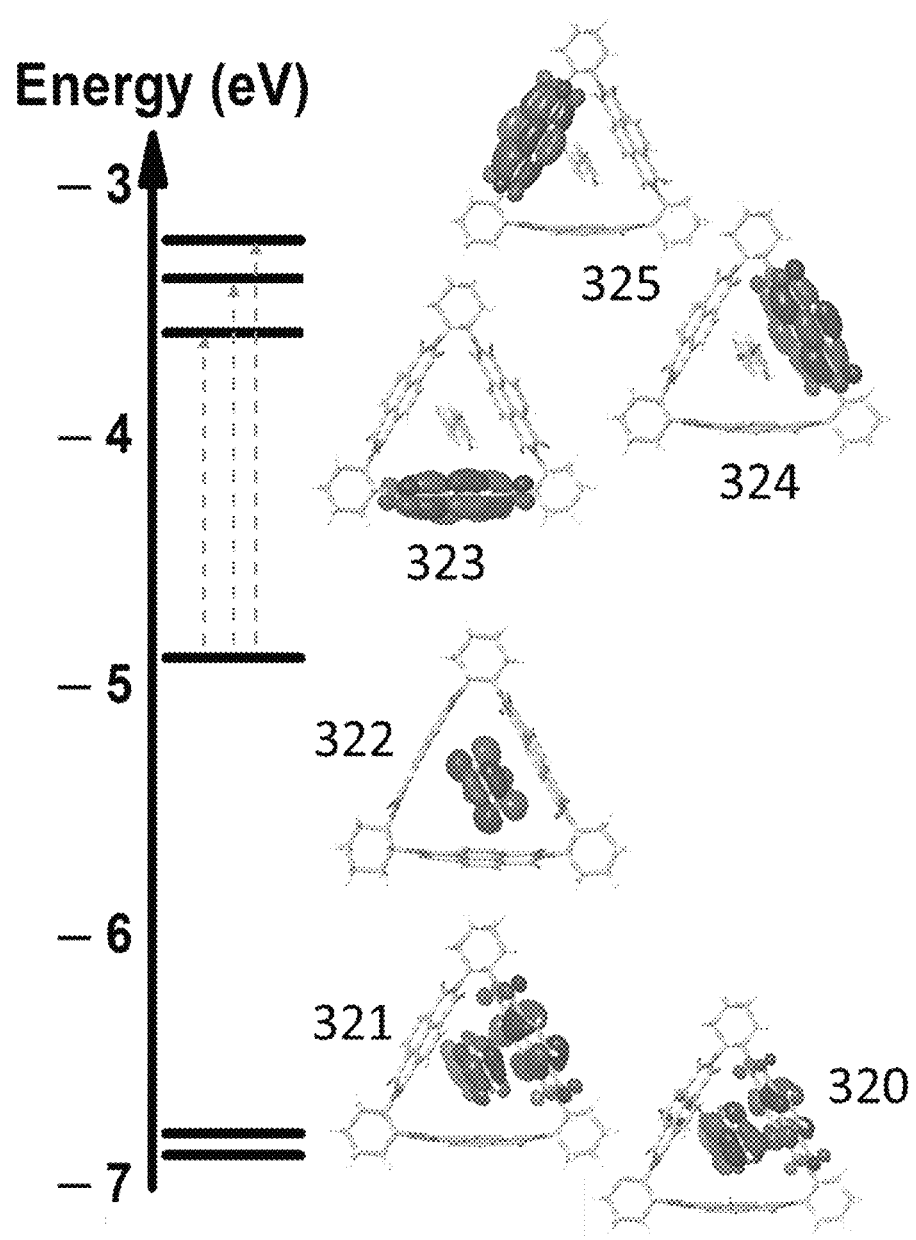
FIG. 36. Frontier orbitals based on B3LYP/6-31G$^{·+}$ calculations of TTF ⊂ NDI-Δ.

Solid-state absorption studies reproduce well the absorption band arising from the π→π* transitions of NDI-Δ. New bands emerge in the visible, near (NIR) and far (FIR) IR regions. Crystallographic studies have revealed that the different TTF molecules in the crystal structure are either partially, fully oxidized or neutral. In addition, the existence of close intermolecular interactions between TTF molecules in the superstructures might affect the overall electronic properties through the formation of mixed-valence forms between radical and neutral TTF species. Therefore, absorption spectra are expected to display broad bands on account of the contributions from different components. Although, all the crystal structures CT-A, CT-B and CT-C display the existence of face-to-face [π . . . π] interactions between NDI units and TTF, the electronic properties of these materials are different. For CT-A, FIG. 12 reveals a broad absorption band in a range 500 to 2700 nm ($\lambda_{max}$=835 nm). Solid-state EPR Spectroscopy revealed that CT-A has significant CT character which implies the existence of TTF$^{•+}$ and NDI-Δ$^{•-}$ species. It has been reported[49] previously that TTF$^{•+}$ has an absorption band at 480 nm while NDI$^{•-}$ absorbs at 490, 700 and 790 nm. In addition, solution studies revealed the existence of a CT band at 1140 nm associated with the formation of a host-guest complex. Therefore, the origin of this band may be from a mixture of the different components (radical and neutral species) combined with the CT band of TTF⊂NDI-Δ. Time-dependent DFT (TDDFT) investigations also reproduce (FIG. 35) the CT absorption band with a calculated broad band centered at 1200 nm associated with the transition from HOMO orbitals which are TTF-based to LUMO orbitals which are NDI-Δ-based (FIG. 36, Table 4). Other investigations[50] reported the emergence of the CT band at 900 nm when an NDI-based MOF was doped with TTF, leading to the decrease of the optical band gap from 2.5 eV (undoped) to 1 eV (doped). Notably, the absorption spectrum of CT-B does not display these features. A shoulder can be observed at 750 nm, similar to the band at 700 nm observed in MeCN solution. The absence of close [S . . . S] interactions between the TTF molecules and the absence of [π . . . π] interactions between NDI-Δ units makes the assignment of the absorption band at 750 nm to a CT between TTF and NDI-Δ. Beyond doubt, crystallographic studies revealed that the C═C bond length is 1.35(1) Å—i.e., it is slightly more elongated than those of neutral TTF (1.33 Å)—confirming a partial CT. Clearly, the inclusion of the TTF inside the cavity of NDI-Δ enhances the CT behavior leading to the formation of radical species which absorb in the NIR and FIR regions.

Figure 37:
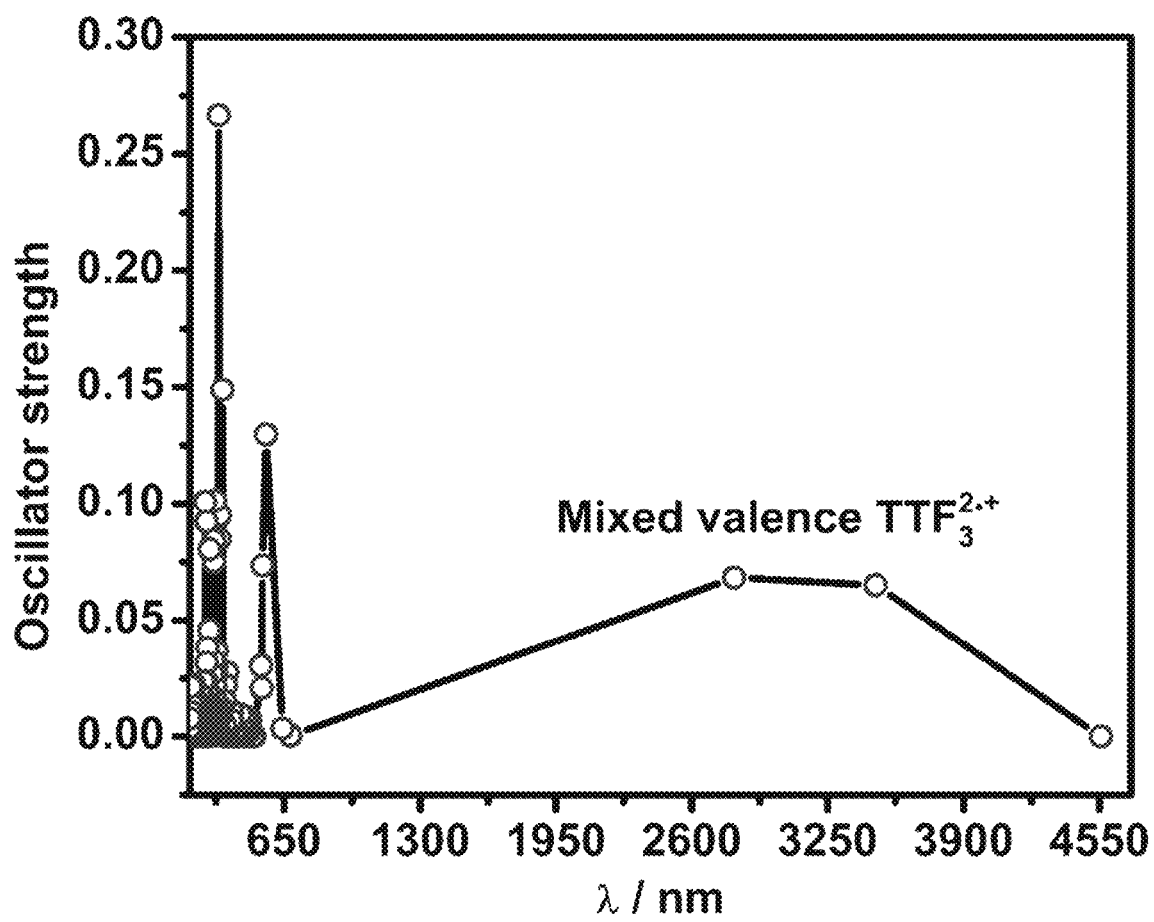
FIG. 37. Calculated UV/visible spectrum for TTF-Δ$^{2+·}$ (no scaling factor applied).
Figure 38:
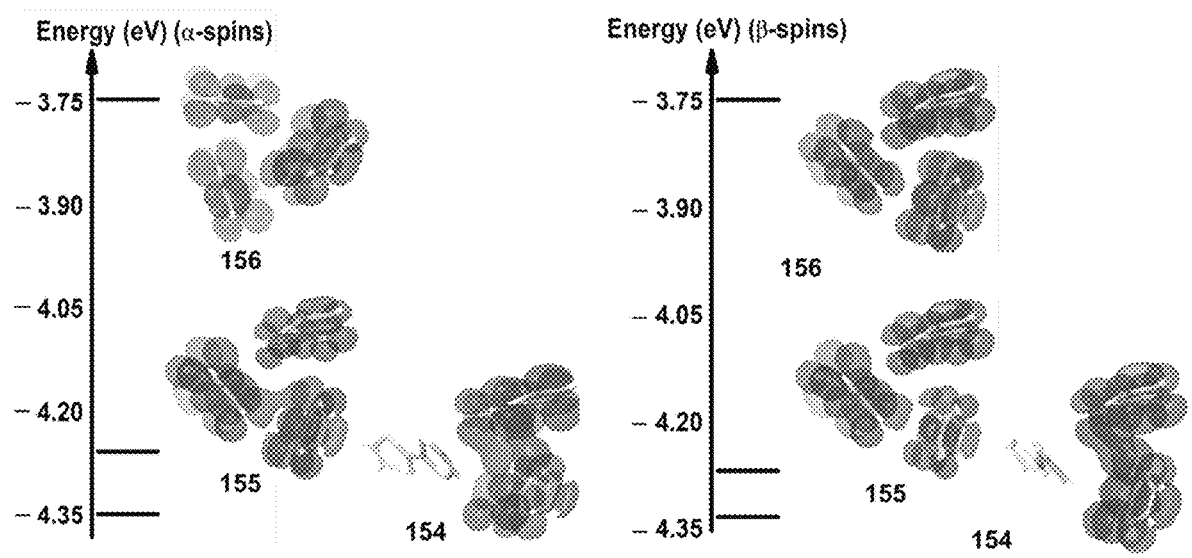
FIG. 38. One-electron frontier orbitals of the 'spin-up' α electrons and 'spin-down' β electrons based on UB3LYP/6-31G*+ calculations of TTF-Δ$^{2+·}$.
Figure 39:
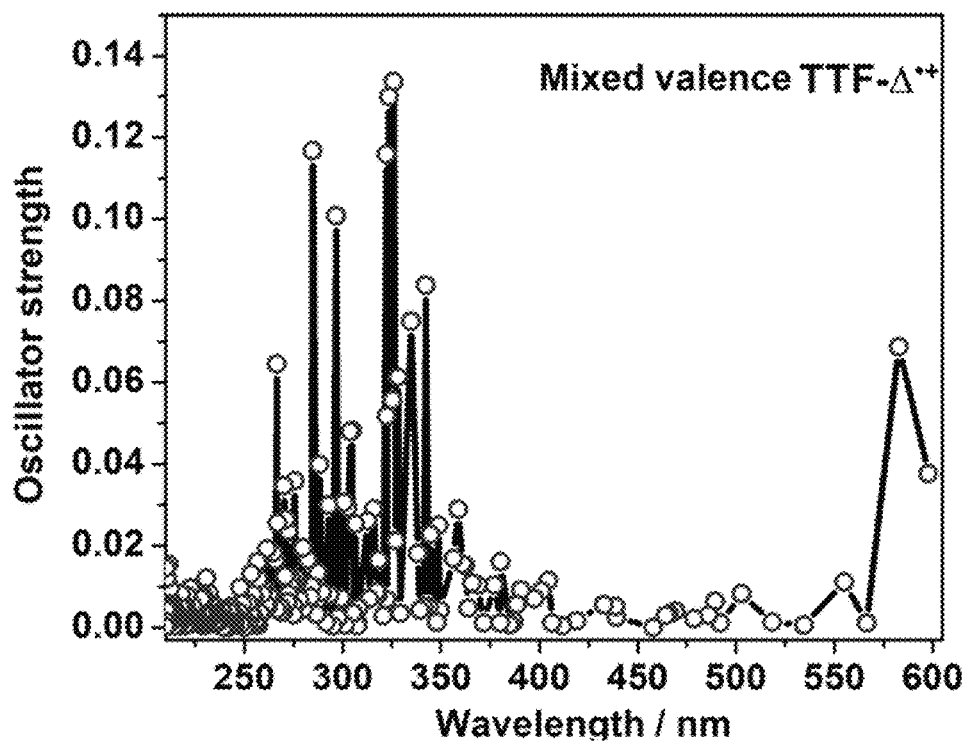
FIG. 39. Calculated UV/visible spectrum for TTF-Δ$^{+·}$ (no scaling factor applied).

The crystal structure of CT-C revealed similar interactions of TTF molecules with NDI-Δ, while solid-state EPR spectroscopy revealed that the complex has an ionic state. Whereas in the CT-A structure, two TTF molecules interact with NDI-Δ externally and one TTF is localized inside the cavity, in CT-C, all three edges of NDI-Δ interact with TTF externally while the cavity is occupied by CH$_2$Cl$_2$ solvent. CT-C displays (FIG. 12) a dominant broad absorption band in the FIR region of the solid-state spectrum centered at 2500 nm. A small absorption band similar to that for CT-A is observed at 835 nm, consistent with the existence of TTF$^{•+}$ and NDI-Δ$^{•-}$ species and CT interactions. The crystal superstructure revealed that three TTF molecules interact through a set of [S . . . S] contacts to form a supramolecular TTF triangle (TTF-A). In addition, from the C═C bond lengths we can infer that one TTF molecule is in its radical cationic state while the two other TTF molecules are, respectively, partially oxidized and in a neutral state. In this context, the origin of the FIR absorption band can be attributed to the mixed-valence character of the TTF-Δ. In order to confirm the electronic configuration of TTF-Δ, we performed TDDFT studies using two electronic configurations—namely, (i) TTF-Δ$^{2•+}$, where two TTF molecules are in a radical cationic state while the third TTF is neutral, and (ii) TTF-Δ$^{•+}$, where one TTF is in a radical cationic state while the other two molecules are neutral. TDDFT calculations on TTF-Δ$^{2•+}$, using a broken-symmetry singlet-state approach at the UB3LYP/6-31G*+ basis set, revealed (FIG. 37, Table 5) the existence of transitions at 3479 and 2802 nm with an oscillator factor of >0.05. Both transitions involve orbitals from the three TTF components of TTF-Δ$^{2•+}$. The SOMO-SUMO transition for each TTF is displayed (FIG. 38, Tables 6-7) at 563 and 547 nm, consistent with literature values.[51] Simulation of the absorption band using the electronic configuration TTF-A$^{•+}$ has proved unsuccessful with respect to reproducing the band at 2500 nm (FIG. 39, Table 6). Previous studies reported[52] the observation of a similar band at 2500 nm for (TTF)$_3$[TTF(CO$_2$H)$_2$(CO$_2$)$_2$], which is composed of two TTF$^{•+}$ cations and one neutral TTF molecule along with one TTF(CO$_2$H)$_2$(CO$_2$)$_2$ anion. The crystal superstructure was not reported, however, preventing detailed analysis of the structure-electronic properties relationship. Other studies[53] on mechanically interlocked TTF-based catenanes have noted the observation of a broad absorption band at 2100 nm, associated with the mixed-valence (TTF)$_2$$^{•+}$ dimer. In this context, the triangular geometry of NDI-Δ combined with careful control of the crystallization conditions can lead to the formation CT complexes with different electronic properties. In particular, the generation of mixed-valence organic materials in the solid-state augurs well for their use in organic and optoelectronic devices.

SUMMARY

We have investigated the effects of molecular tiling of an electronically-active NDI-Δ and NDI-Δ•TTF CT co-crystals through careful control of the crystallization conditions. The in-plane tiling of NDI-Δ is driven by the [π . . . π] interactions between the NDI-Δ. While chlorinated solvents (CH$_2$Cl$_2$, CHCl$_3$) have a strong tendency to form [Cl . . . π] interactions which compete with the [π . . . π] interactions between the NDI units, leading to the disturbance of the in plane 2D tiling of the NDI-Δ, in non-halogenated solvents (MeCN), NDI-Δ is polymorphic and crystallizes into three different polymorphs (α-NDI-Δ, β-NDI-Δ and γ-NDI-Δ) depending on the solute concentrations. Crystallographic studies revealed that honeycomb triangular (β-NDI-Δ) and hexagonal tiling of the NDI-Δ is enthalpically favorable. Fast crystallization of the NDI-Δ leads to the formation of the α polymorph, while dilution of the solute solutions leads to the formation of a semi-regular or regular ATs through 2D [π . . . π] interactions between the NDI units. The β polymorph adopts a honeycomb triangular tiling with 3+3 symmetry in the AT, whilst the γ polymorph adopts a unique tiling where six NDI-Δ self-assemble to form a regular supramolecular hexagon (hex-NDI-Δ) which tessellate in a P632 symmetry in the ATs.

Co-crystallization of the electron-poor NDI-Δ with a strong electron donor, such as TTF, leads systematically to the formation of a 2D tiling pattern as the result of the strong directing CT interactions between the NDI and TTF moieties. The molecular arrangement of the NDI-Δ and TTF is also influenced by solvent accommodation. Utilization of non-halogenated solvents leads to the inclusion of TTF inside the cavity of the NDI-Δ, while halogenated solvents prevent the TTF inclusion. The crystal packing in CT-Δ display a 2D propagation of CT interactions, and the ionic character of this complex has been confirmed through spectroscopic and SQUID magnetometry studies. We have demonstrated that a careful control of the crystal growth conditions, combined with the intrinsic triangular geometry of the NDI-Δ, leads to the formation of mixed-valence TTF-Δ2•+ superstructures which display a small optical band gap of 0.36 eV.

The results provide useful insight into the control of packing geometries of regular and semi-regular molecular tiling using regular polygon building blocks. More broadly, the insights and lessons gained from the triangular NDI system suggest pathways for the deterministic design of a new class of 2D materials, thereby significantly expanding the structural phase space and thus potential properties and applications in organic electronics. The experimental realization of synthetic 2D polymorphs of NDI-Δ and fine-tuning the CT complexes, involved in the packing of NDI-Δ and TTF, anticipates a number of opportunities. Most apparently, the ability to modify the electronic properties through crystal engineering promises to unleash several fundamental and technological advances for the future design of supramolecular 2D organic materials.

Abbreviations

TTF, tetrathiafulvalene; NDI-Δ, naphthalenediimide triangle; TCNQ, tetracyanoquinodimethane; CBPQT, cyclobis(paraquat-p-phenylene); TTF-Δ, Tetrathiafulvalene triangle; NDI, naphthalenediimide; QCs, quasi-crystalline structures; ATs, Archimedean tilings; EPR, electron paramagnetic resonance; SOMO, single occupied molecular orbital; HOMO, highest occupied molecular orbital; LUMO, lowest unoccupied molecular orbital; SUMO, single unoccupied molecular orbital; SQUID, superconducting quantum interference device; VDW, Van der Waals; MOF, metal-organic framework; 1D, two-dimensional; 2D, two-dimensional; 3D, three-dimensional; A, acceptor; D, donor; CT, charge transfer.

Miscellaneous

Unless otherwise specified or indicated by context, the terms "a", "an", and "the" mean "one or more." For example, "a molecule" should be interpreted to mean "one or more molecules."

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All references, including publications, patent applications, and patents, cited herein are hereby incorporated by reference to the same extent as if each reference were individually and specifically indicated to be incorporated by reference and were set forth in its entirety herein.

Preferred aspects of this invention are described herein, including the best mode known to the inventors for carrying out the invention. Variations of those preferred aspects may become apparent to those of ordinary skill in the art upon reading the foregoing description. The inventors expect a person having ordinary skill in the art to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

EXAMPLES

A. Materials/General Methods/Instrumentation

All chemicals and reagents were purchased from commercial suppliers (Aldrich, Fisher and TCI chemicals) and used without further purification. (−)NDI-Δ and (+)NDI-Δ was prepared according to previous literature procedures.[1] Bis(cyclohexyl)naphthalene tetracarboxylic diimide (Ref-NDI) was prepared as well according to previous literature procedure.[2] Column chromatography was carried out on silica gel 60F (Merck 9385, 0.040-0.063 mm). Nuclear magnetic resonance (NMR) spectra were recorded on a Bruker Avance 600 with working frequencies of 600 MHz. Chemical shifts are reported in ppm relative to the signals corresponding to the residual non-deuterated solvents (CDCl$_3$: δ 7.26 ppm, CD$_2$Cl$_2$: δ 5.30 ppm CD$_3$CN: δ 1.94 ppm).

B. Crystallization Protocols

B.1. Crystallization of NDI-Δ in Halogenated Solvents (+)NDI-Δ·CH$_2$Cl$_2$ structure: (+)NDI-Δ (3 mg, 2.9×10$^{-3}$ mmol) was dissolved (c=5.7×10$^{-4}$ mol·L$^{-1}$) in CH$_2$Cl$_2$ (5 mL). Slow diffusion of Et$_2$O afforded colorless block crystals suitable for X-ray diffraction.

(+)NDI-Δ·CHCl$_3$ structure: (+)NDI-Δ (3 mg, 2.9×10$^{-3}$ mmol) was dissolved (c=5.7×10$^{-4}$ mol·L$^{-1}$) in CHCl$_3$ (5 mL). Slow diffusion of cyclohexane afforded colorless block crystals suitable for X-ray diffraction.

B.2. Polymorphism of NDI-Δ in MeCN: Concentration Dependence of the Crystal Structures α-NDI-Δ Polymorph: (−)NDI-Δ (26 mg, 2.5×10$^{-2}$ mmol) was added to a solution (c=5×10$^{-3}$ mol·L$^{-1}$) of MeCN (5 mL) and heated to 60° for 30 min to dissolve completely the NDI-Δ. Then crystallization was achieved by slow diffusion of Et$_2$O into the solution of MeCN to afford yellow pale block crystals.

β-NDI-Δ Polymorph: (+)NDI-Δ (5.2 mg, 5×10$^{-3}$ mmol) was added to a solution (c=5×10$^{-4}$ mol·L$^{-1}$) of MeCN (10 mL) and heated to 60° for 30 min to dissolve completely the NDI-Δ. Then crystallization was achieved by slow diffusion of Et$_2$O into the solution of MeCN to afford colorless crystals of rod shape.

γ-NDI-Δ Polymorph: (−)NDI-Δ (2 mg, 1.92×10$^{-3}$ mmol) was added to a solution (c=9.6×10$^{-5}$ mol·L$^{-1}$) of MeCN (20 mL) to dissolve completely the NDI-Δ. Then crystallization was achieved by slow diffusion of Et$_2$O into the solution of MeCN to afford hexagonal rods crystals.

B.3. Preparation of the NDI-Δ and TTF Charge Transfer Complexes

Preparation of CT-A: Compound (−)NDI-Δ (50 mg, 4.8×10$^{-2}$ mmol) was stirred with tetrathiafulvalene (29 mg, 0.14 mmol) in MeCN (30 mL) under N$_2$ atmosphere. The reaction was left to stir for 1 h at 60° C. to afford an intense orange solution. Then, the solution was left to evaporate slowly to afford green plate crystals suitable for crystallographic studies. Mass spectroscopy (ESI mode) have shown using MeCN solvent, the formation of the NDI-Δ-TTF host-guest complex: Experimental: M$^+$=1295.57, Calculated: for [TTF$^{+•}$⊂NDI-Δ+CH$_3$ONa], M$^+$=1296.21). Yield: 100%, microanalytical data for the determined molecular formula (C$_{75}$H$_{52}$N$_6$O$_{12}$S$_{10}$): Observed (calculated) C=57.8 (58.1), H=3.1 (3.4), N=5.6 (5.4), S=21.1 (20.7)%.

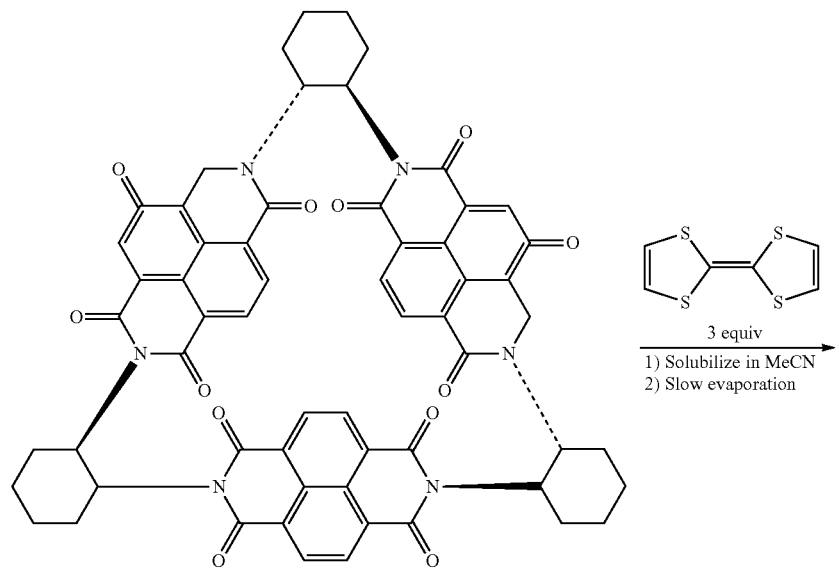

Scheme 1. Preparation of [(-)-NDI-Δ]$_2$:[TTF]$_5$ (CT-A)

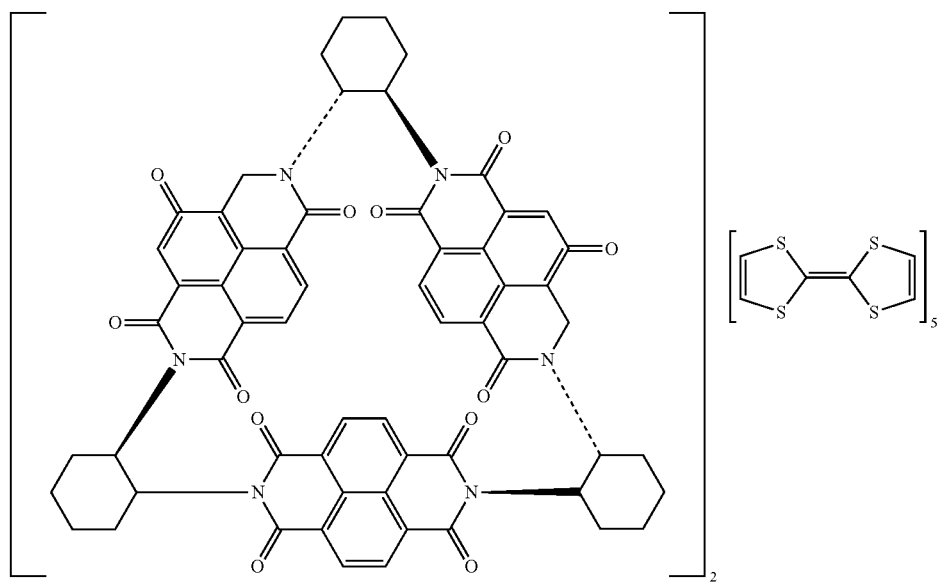

Preparation of CT-B: Compound (−)NDI-Δ (50 mg, 4.8×$10^{-2}$ mmol, 5×$10^{-3}$ mol·L$^{-1}$) was stirred with tetrathiafulvalene (29 mg, 0.14 mmol) in CHCl$_3$ (10 mL). Then crystallization was achieved by slow diffusion of hexane to afford hexagonal rods crystals. Yield: 70%, microanalytical data for the determined molecular formula ($C_{69}H_{48}N_6O_{12}S_6$·(2HCl$_3$)): Observed (calculated) C=53.6 (53.8), H=3.3 (3.2), N=5.4 (5.3), S=12.1 (12.2) %.

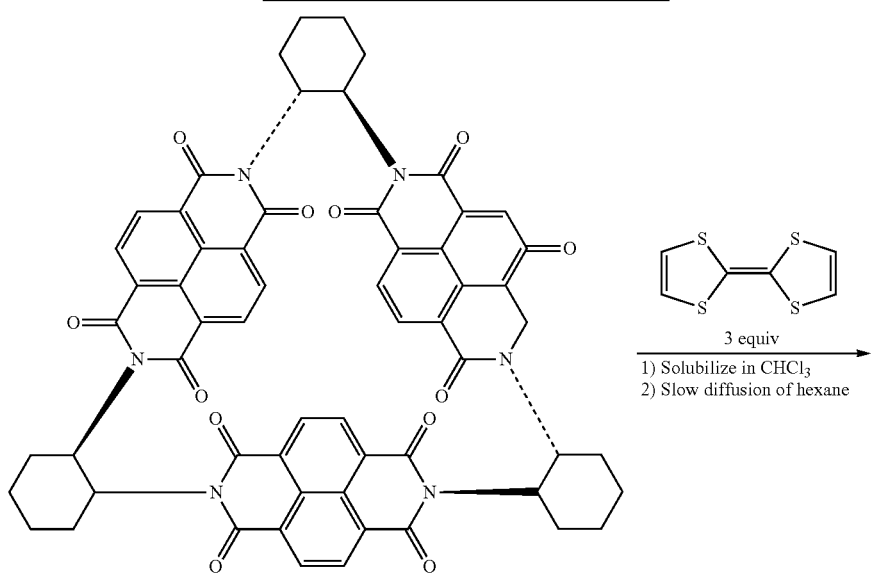

Scheme 2. Preparation of [(-)-NDI-Δ]$_2$:[TTF]$_3$ (CT-B)

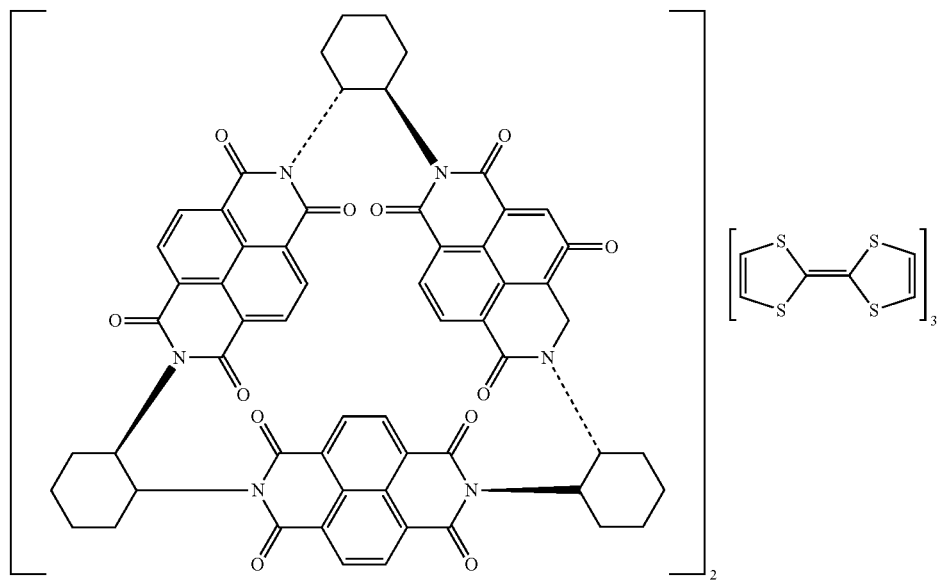

Preparation of CT-C: Compound (−)NDI-Δ (50 mg, 4.8× $10^{-2}$ mmol, $5 \times 10^{-3}$ mol·L$^{-1}$) was stirred with tetrathiafulvalene (29 mg, 0.14 mmol) in CH$_2$Cl$_2$ (10 mL). Then crystallization was achieved by slow diffusion of Et$_2$O or hexane to afford green dark crystals. Yield: 60%, microanalytical data for the determined molecular formula (C$_{78}$H$_{54}$N$_6$O$_{12}$S$_{12}$): Observed (calculated) C=55.8 (56.7), H=3.2 (3.3), N=5.2 (5.1), S=23.3 (23.3) %.

Scheme 3. Preparation of [(−)-NDI-Δ]:[TTF]3 (CT-C)

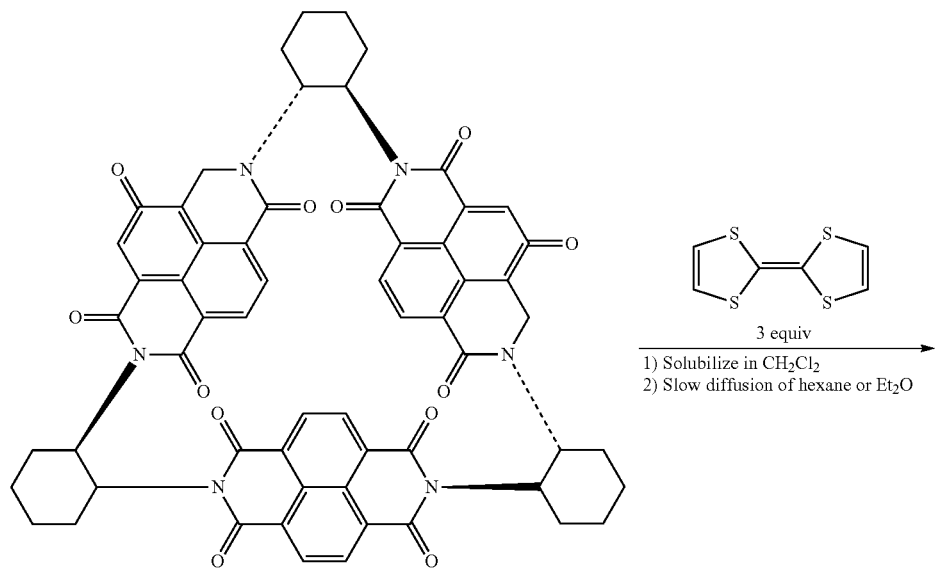

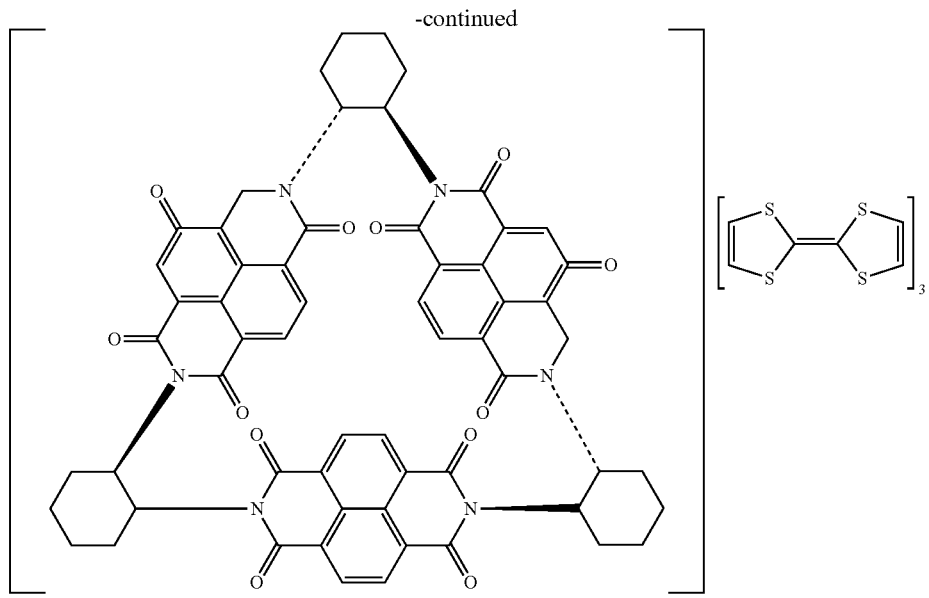

Preparation of Ref-NDI:TTF: Compound Ref-NDI (50 mg, 0.12 mmol) was stirred with tetrathiafulvalene (23 mg, 0.12 mmol) in $CH_2Cl_2$ (15 mL). After evaporation of the solvent, a yellowish-green powder was obtained. Crystal structure of the Ref-NDI•TTF cocrystal remains elusive.

Scheme 4. Preparation of Ref-NDI:TTF

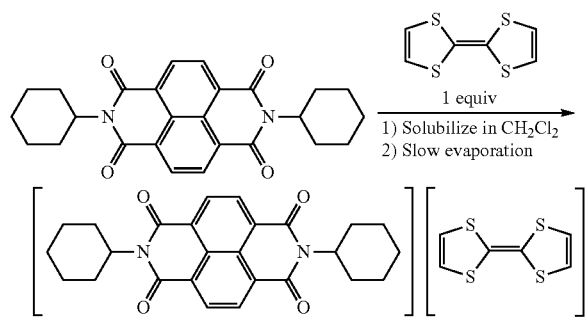

C. Crystallographic Characterization

Single crystal X-ray diffraction studies were measured on a Bruker APEX-II[4] diffractometer using Mo—$K_\alpha$, radiation ($\lambda$=0.71079 Å) or Cu—$K_\alpha$, radiation ($\lambda$=1.5407 Å) equipped with an Oxford cryostream variable temperature device. Data were collected using the Bruker APEX-II program, integrated with SAINT[5] and an absorption correction (SADABS)[6] applied, an empirical correction for crystal decay was applied. The structure was solved using direct methods and all atoms refined anisotropically using full matrix least squares on $F^2$. All non-hydrogen atoms were refined anisotropically and H-atoms added at calculated positions and refined with a riding model.

C.1. Crystal Structure of NDI-Δ•$CH_2Cl_2$

Method. Slow diffusion of $Et_2O$ to a solution of NDI-Δ in $CH_2Cl_2$ afforded colorless block crystals suitable for X-ray diffraction. A suitable single crystal was selected, and the crystal was mounted on a MITIGEN holder in Paratone oil on a Kappa Apex2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula=[($C_{60}H_{42}N_6O_{12}$), 3($CH_2Cl_2$)], formula weight=1293.76, crystal system=Cubic, space group=$I2_13$, a=b=c=29.4561(5) Å, $\alpha=\beta=\gamma=90°$, V=25557.9(13) Å$^3$, Z=16, T=100 K, $\mu$(CuK$\alpha$)=0.03 mm$^{-1}$, $D_{calc}$=1.345 g/mm$^3$, 33468 reflections measured (7.35≤2Θ≤136.322), 7436 unique ($R_{int}$=0.061, $R_{sigma}$=0.0515) which were used in all calculations. The final $R_1$ was 0.113 (I>2σ(I)) and wR2 was 0.2850 (all data).

Refinement Details. Distance restraints were imposed on the C—Cl bonds on the dichloroethane solvent molecules. Rigid bond restraints were imposed on the displacement parameters of the $CH_2Cl_2$ solvent molecule.

Solvent Treatment Details. Total solvent accessible volume/cell=8902.3 Å$^3$. Total electron count/cell=5.07. The solvent masking procedure as implemented in Olex2 was used to remove the electronic contribution of solvent molecules from the refinement. As the exact solvent content is not known, only the atoms used in the refinement model are reported in the formula.

Analysis of the superstructure NDI-Δ•$CH_2Cl_2$: In $CH_2Cl_2$ at concentration of (5.7×10$^{-4}$ M) NDI-Δ crystallizes in cubic $I2_13$ space group with two crystallographically distinct NDI units and three disordered $CH_2Cl_2$ molecules in the asymmetric unit (Solvent molecules establish a network of [Cl . . . H(NDI)] and [CH($CH_2Cl_2$) . . . O] interactions which prevents the NDI-Δ to form pairs of NDI-Δ through [CH(NDI) . . . O(NDI)]. In addition, the strong tendency of $CH_2Cl_2$ to establish a network [Cl . . . π] interactions prevent the NDI units to from interacting in a [π . . . π] face-to-face fashion. The packing of the two asymmetrically distinct NDI-Δ tringles do not form neither tubular superstructure nor a tilling motif.

C.2. Crystal Structure of NDI-Δ•$CHCl_3$

Method. Slow diffusion of cyclohexane to a solution of NDI-Δ in $CHCl_3$ afforded colorless block crystals suitable for X-ray diffraction. A suitable single crystal was selected, and the crystal was mounted on a MITIGEN holder in Paratone oil on a Kappa Apex 2 diffractometer. The crystal was kept at 100 K during data collection. Using Olex2,[8] the structure was solved with the ShelXT,[9] structure solution program using Direct Methods and refined with the ShelXL[10] refinement package using Least Squares minimization.

Crystal Data. Empirical formula= $[C_{60}H_{42}N_6O_{12} \cdot C_2H_{2.71}Cl_{5.11})]$, formula weight=1246.97, crystal system=Cubic, space group=P2$_1$3, a=b=c=26.2442 (10) Å, α=β=γ=90°, V=18076(2) Å$^3$, Z=14, T=99.99 K, μ(CuKα)=2.80 mm$^{-1}$, D$_{calc}$=1.375 g/mm$^3$, 54874 reflections measured (5.832≤2Θ≤118.05), 8619 unique (R$_{int}$=0.118, R$_{sigma}$=0.0769) which were used in all calculations. The final R$_1$ was 0.0618 (I>2σ(I)) and wR$_2$ was 0.171 (all data).

Refinement Details. The structure was refined using the twin law for a racemic twinning with a scale factor 0.91(3). Four molecules of CHCl$_3$ are identified and their occupancy were allowed to be refined. Distance restraints were imposed on the disordered on the CHCl$_3$ molecules. The solvent masking procedure as implemented in Olex2 was used to remove the electronic contribution of solvent molecules from the refinement. As the exact solvent content was not known, only the atoms used in the refinement model are reported in the formula.

Solvent treatment. Solvent mask (OLEX2) was utilized.

Analysis of the superstructure NDI-Δ•CHCl$_3$:

In common with the superstructure NDI-Δ•CH$_2$Cl$_2$, in CHCl$_3$ at concentration of (5.7×10$^{-4}$ M) NDI-Δ crystallizes in cubic P2$_1$3 space groups respectively. The superstructure of NDI-Δ•CHCl$_3$ has thee NDI units and four CHCl$_3$ molecules which are not related by symmetry elements. All the three unsymmetrical NDI-Δ display perpendicular rotation angle of ~60° (a 3-fold screw axis) as a result of the stabilization by three pairs of self-complementary [C—H . . . O] interactions (mean d$_{[C . . . O]}$=3.21 Å and mean θ$_{[C—H . . . O]}$=144°) between the NDI units. In addition, the strong tendency of CHCl$_3$ to establish a network [Cl . . . H] and [Cl . . . π(NDI)] interactions prevents the NDI units from interacting in a [π . . . π] face-to-face fashion. Both superstructures NDI-Δ•CHCl$_3$ and NDI-Δ•CH$_2$Cl$_2$ display encapsulation of solvent inside the cavity of the macrocycles. Previous investigations have also reporter the cavities of NDI-Δ can also encapsulate 1,2-dihaloethane and -ethene (DXE, BrCH$_2$CH$_2$Br, ClCH$_2$CH$_2$Br, and ClCH$_2$CH$_2$I) where they are present as solvents. In these cases, NDI-Δ was found to assemble into supramolecular nanotubes from columnar stacking of the triangles driven by cooperative [C—H . . . O] interactions and the [X . . . X] interactions the stacking directions. These structures do not display, however, the presence of [π . . . π] interactions between the NDI units confirming once again the role of the [halogen . . . π(NDI)] interactions in preventing the [π . . . π] interactions between NDI units.

C.3. Crystal Structure of α-NDI-Δ

Method. Crystallization was achieved by slow diffusion of Et$_2$O into the solution of NDI-Δ in MeCN (c=5×10$^{-3}$ mol·L$^{-1}$) to afford yellow pale block crystals. A suitable single crystal was selected, and the crystal was mounted on a MITIGEN holder in Paratone oil on a Kappa Apex2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula=[C$_{60}$H$_{42}$N$_6$O$_{12}$·4(C$_2$H$_3$N)·0.5(C$_4$H$_{10}$O)], formula weight=1240.27, crystal system=Monoclinic, space group=P2$_1$, a=15.9512 (11), b=15.0324 (11), c=25.0891 (17) Å, α=γ=90°, β=90.488 (2), V=6015.8 (7) Å$^3$, Z=4, T=99.99 K, μ(MoK$_α$)=0.10 mm$^{-1}$, D$_{calc}$=1.369 g/mm$^3$, 73351 reflections measured (3.014≤2Θ≤61.172), 34166 unique (R$_{int}$=0.041, R$_{sigma}$=0.061) which were used in all calculations. The final R$_1$ was 0.057 (I>2σ(I)) and wR2 was 0.1480 (all data).

Refinement Details. Restraints were imposed on the disordered Et$_2$O atoms solvent molecule. The occupancy of the Et$_2$O was allowed to be refined.

Solvent Treatment Details. Not applicable.

C.4. Crystal Structure of β-NDI-Δ

Method. Crystallization was achieved by slow diffusion of Et$_2$O into the solution of NDI-Δ (c=5×10$^{-4}$ mol·L$^{-1}$) MeCN to afford colorless crystals of rod shape. A suitable single crystal was selected, and the crystal was mounted on a MITIGEN holder in Paratone oil on a Kappa Apex 2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula=[C$_{60}$H$_{42}$N$_6$O$_{12}$·(C$_4$H$_{10}$O)], formula weight=1113.11, crystal system=Triclinic, space group=P1, a=8.731 (3), b=18.330 (6), c=18.881 (6) Å, α=62.204 (7°), β=85.045 (8°), γ=77.442 (7°), V=2608.7 (14) Å$^3$, Z=2, T=99.99 K, μ(MoK$_α$)=0.10 mm$^{-1}$, D$_{calc}$=1.417 g/mm$^3$, 51932 reflections measured (4.276≤2Θ≤52.986), 21111 unique (R$_{int}$=0.18, R$_{sigma}$=0.3502) which were used in all calculations. The final R$_1$ was 0.10 (I>2σ(I)) and wR2 was 0.237 (all data).

Refinement Details. Two molecules of Et$_2$O are identified and distance restraints were imposed on the disordered on the Et$_2$O molecules. The solvent masking procedure as implemented in Olex2 was used to remove the electronic contribution of solvent molecules from the refinement. As the exact solvent content was not known, only the atoms used in the refinement model are reported in the formula.

Solvent Treatment Details. Not applicable

C.5. Crystal Structure of γ-NDI-Δ

Method. Crystallization was achieved by slow diffusion of Et$_2$O into the solution of NDI-Δ (c=9.6×10$^{-5}$ mol·L$^{-1}$) in MeCN to afford hexagonal rods crystals. A suitable single crystal was selected, and the crystal was mounted on a MITIGEN holder in Paratone oil on a Kappa Apex 2 diffractometer. The crystal was kept at 99.99 K during data collection. Using Olex2,[8] the structure was solved with the ShelXT[9] structure solution program using Direct Methods and refined with the ShelXL[10] refinement package using Least Squares minimization.

Crystal Data. Empirical formula=[(C$_{60}$H$_{42}$N$_6$O$_{12}$), (C$_4$H$_{10}$O), (C$_2$H$_3$N)], formula weight=1140.16, crystal system=Hexagonal, space group=P6$_2$, a=b=34.5345 (11), c=8.5499 (4) Å, α=β=γ=90, V=8830.8 (7) Å$^3$, Z=8, T=99.99 K, μ(CuKα)=0.76 mm$^{-1}$, D$_{calc}$=1.715 g/mm$^3$, 24922 reflections measured (8.87≤2Θ≤136.514), 9124 unique (R$_{int}$=0.0552, R$_{sigma}$=0.0573) which were used in all calculations. The final R$_1$ was 0.071 (I>2σ(I)) and wR2 was 0.203 (all data).

Refinement Details. Distance restraints were imposed on the MeCN bonds on the Et$_2$O solvent molecule. Rigid bond restraints were imposed on the displacement parameters of the MeCN and Et$_2$O solvent molecules.

Solvent Treatment Details. Total solvent accessible volume/cell=296.7 Å$^3$. Total electron count/cell=10.99 The solvent masking procedure as implemented in Olex2 was used to remove the electronic contribution of solvent molecules from the refinement. As the exact solvent content is not known, only the atoms used in the refinement model are reported in the formula here.

D. Crystal Engineering of the NDI-Δ•TTF Co-Crystals

D.1. Crystal Structure of CT-A

Method. The crystals CT-A were grown by slow evaporation of the MeCN solution of NDI-Δ:TTF mixture to afford green plate crystals. A suitable single crystal was selected, and the crystal was mounted on a MITIGEN holder in Paratone oil on a Kappa Apex2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula=[$(C_{60}H_{42}N_6O_{12})$, 2.5 $(C_6H_4S_4)$], formula weight=1550.83, crystal system=Triclinic, space group=P$\bar{1}$, a=15.8923 (10), b=15.9624 (10), c=16.7921 (11) Å, α=69.423 (4), β=69.340 (4), γ=70.959 (4), V=3630.8 (4) Å$^3$, Z=2, T=103.26 K, μ(CuK$_α$)=3.369 mm$^{-1}$, D$_{calc}$=1.419 g/mm$^3$, 15466 reflections measured (5.836≤2Θ≤130.228), 11083 unique (R$_{int}$=0.042, R$_{sigma}$=0.065) which were used in all calculations. The final R$_1$ was 0.205 (I>2σ(I)) and wR2 was 0.464 (all data).

Refinement Details. Distance restraints were imposed on the highly disordered TTF molecules and cyclohexane moieties of the NDI macrocycle. Displacement restrains where imposed on both the macrocycle and the TTF molecules. A Shelx FLAT command was imposed on the disordered TTF rings. Solvent mask was utilized in OLex2.

Solvent Treatment Details. Total solvent accessible volume/cell=849.1 Å$^3$. Total electron count/cell=5.39 The solvent masking procedure as implemented in Olex2 was used to remove the electronic contribution of solvent molecules from the refinement. As the exact solvent content is not known, only the atoms used in the refinement model are reported in the formula here.

D.2. Crystal Structure of CT-B

Method. Crystallization of CT-B was achieved by slow diffusion of hexane to a solution of NDI-Δ and TTF solubilized in CHCl$_3$ to afford green needle crystals. A suitable single crystal was selected, and the crystal was mounted on a MITIGEN holder in Paratone oil on a Kappa Apex 2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula=[$(C_{60}H_{42}N_6O_{12})$, 1.5 $(C_6H_4S_4)$, 7(CHCl$_3$)], formula weight=2181.05, crystal system=Trigonal, space group=P3$_2$1, a=b=19.1592 (4) Å, c=15.4941 (4) Å, α=β=90, γ=120, V=4925.5 (2) Å$^3$, Z=2, T=99.99 K, μ(MoK$_α$)=0.77 mm$^{-1}$, D$_{calc}$=1.471 g/mm$^3$, 134639 reflections measured (2.628≤2Θ≤56.72), 8228 unique (R$_{int}$=0.080, R$_{sigma}$=0.0353) which were used in all calculations. The final R$_1$ was 0.092 (I>2σ(1)) and wR2 was 0.208 (all data).

Refinement Details. Refined as a 2-component inversion twin. Distance restraints were imposed bonds of chloroform solvent molecules. The Chloroform occupancy was fixed. Rigid bond restraints were imposed on the displacement parameters of the chloroform solvent molecule.

Solvent Treatment Details. Total solvent accessible volume/cell=587.4 Å$^3$. Total electron count/cell=12.62. The solvent masking procedure as implemented in Olex2 was used to remove the electronic contribution of solvent molecules from the refinement. As the exact solvent content is not known, only the atoms used in the refinement model are reported in the formula here.

D.3. Crystal Structure of CT-C

Method. Crystallization of CT-C was achieved by slow diffusion of Et$_2$O or hexane to afford green dark crystals. A suitable single crystal was selected, and the crystal was mounted on a MITIGEN holder in Paratone oil on a Kappa Apex 2 diffractometer. The crystal was kept at 100 K during data collection. Using Olex2,[8] the structure was solved with the ShelXT[9] structure solution program using Direct Methods and refined with the ShelXL[10] refinement package using Least Squares minimization.

Crystal Data. Empirical formula [$(C_{60}H_{42}N_6O_{12})$, 3$(C_6H_4S_4)$, $(CH_2Cl_2)$], formula weight=1736.91, crystal system=Monoclinic, space group=P2$_1$/n, a=18.1136(10) Å, b=15.6480 (9) Å, c=27.3059 (15) Å, α=γ=90, β=91.229 (4°), V=7737.8 (7) Å$^3$, Z=4, T=99.99 K, μ(CuK$_α$)=4.34 mm$^{-1}$, D$_{calc}$=1.491 g/mm$^3$, 37431 reflections measured (6.51≤2Θ≤130.804), 12570 unique (R$_{int}$=0.103, R$_{sigma}$=0.105) which were used in all calculations. The final R$_1$ was 0.205 (I>2σ(I)) and wR2 was 0.378 (all data).

Refinement Details. The enhanced rigid-bond restraint (SHELX keyword RIGU) was applied on the cyclohexane moiety of the NDI-Δ. Distance restraints were imposed bonds of CH$_2$Cl$_2$ solvent molecules. The CH$_2$Cl$_2$ occupancy was allowed to be refined. Rigid bond restraints were imposed on the displacement parameters of the dichloromethane solvent molecule.

Solvent Treatment Details. Not applicable

E. Powder X-Ray Crystallography Characterization

Powder X-ray diffraction (PXRD) of the CT complexes were measured at room temperature on a STOE-STADIMP powder diffractometer equipped with an asymmetric curved Germanium monochromator (CuK$_{α1}$ radiation, λ=1.54056 Å) and one-dimensional silicon strip detector (MYTHEN2 1K from DECTRIS). The line focused Cu X-ray tube was operated at 40 kV and 40 mA. The diffraction data have been collected in a 2θ range of 2-50° over a period of 15 min. The temperature was controlled using an Oxford Cryosystems Cryostat (700 Series Cryostream Plus).

Figure 13:
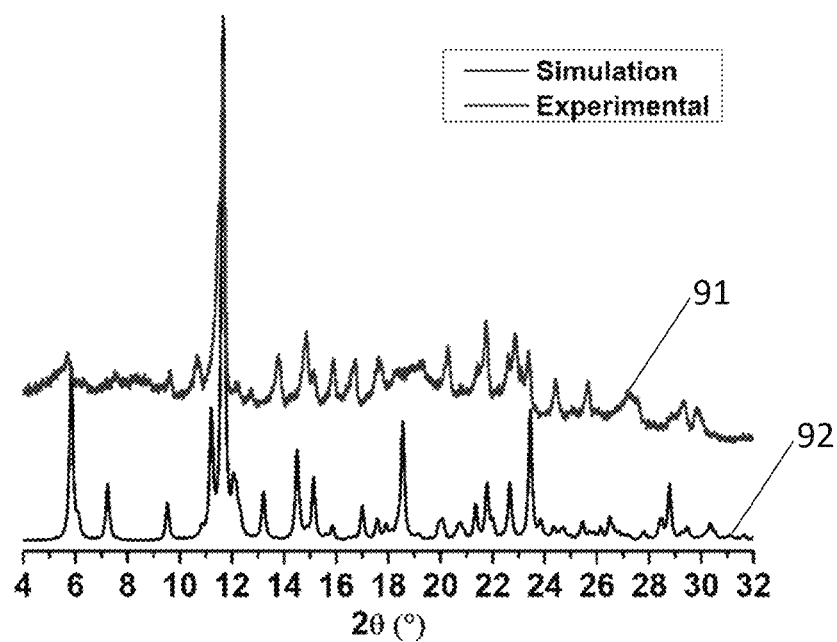
FIG. 13. Comparison of the experimental 91 and simulated 92 powder patterns of CT-A at 100 K FIG. 14. Variable temperature powder XRD profiles of CT-A heated from 100 to 400 K FIG. 15. Powder XRD profile of CT-B collected at room temperature showing its semi-crystalline nature as the results of the evaporation of the lattice CHCl$_3$ solvent FIG. 16. Variable temperature powder XRD profiles of CT-C heated from 130 to 400 K.
Figure 14:
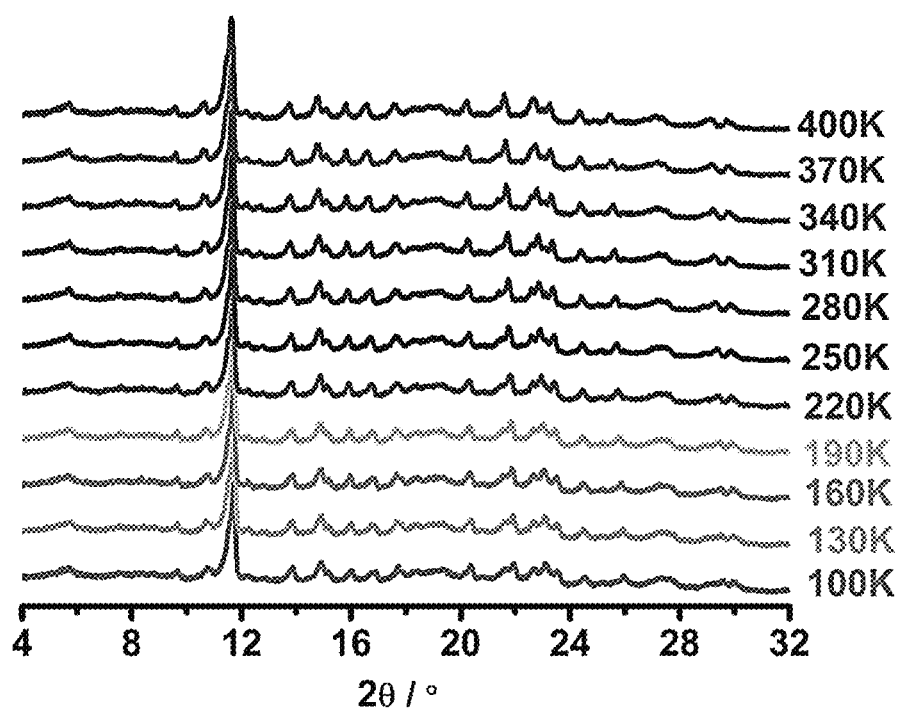
Figure 15:
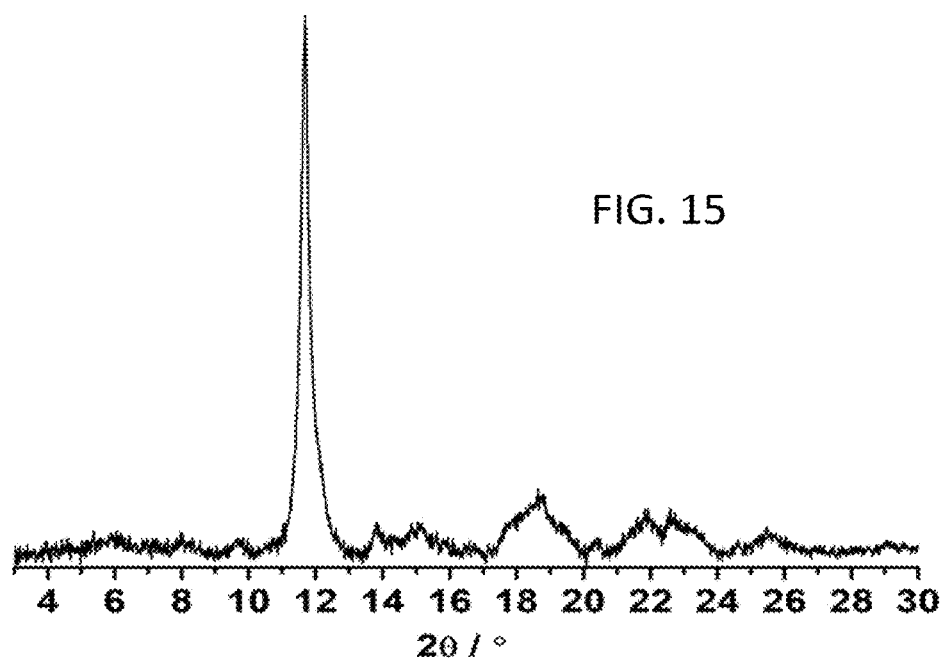
Figure 16:
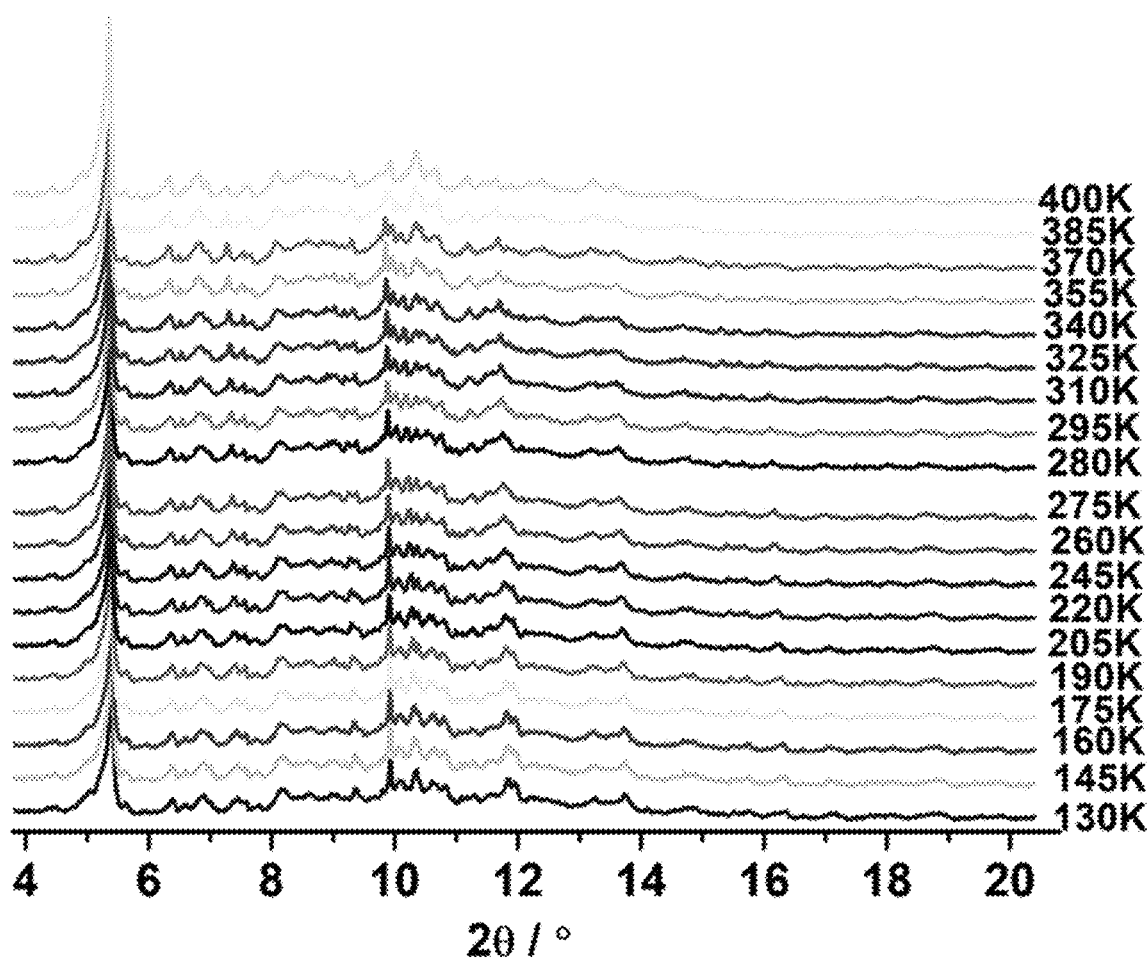

FIG. 13 shows a comparison of the experimental and simulated powder patterns of CT-A at 100 K. FIG. 14 shows variable temperature powder XRD profiles of CT-A heated from 100 to 400 K. FIG. 15 shows powder XRD profile of CT-B collected at room temperature showing its semi-crystalline nature as the results of the evaporation of the lattice CHCl$_3$ solvent. FIG. 16 shows variable temperature powder XRD profiles of CT-C heated from 130 to 400 K.

F. $^1$H NMR Spectroscopy

Titration of TTF to a solution of NDI-Δ in CD$_3$CN. $^1$H NMR Titration (FIG. 17A) was carried out by adding tetrathiafulvalene ([TTF] 11.4 mM, CD$_3$CN) to a solution (0.192 mM, CD$_3$CN) of NDI-Δ at room temperature. The chemical shifts of the NDI protons of the host were observed and used to determine the association constants (K$_a$) from the curve illustrated in FIG. 17B. The data have been fitted using an in-house program and the binding constant for the complex has been determined. The K$_a$ value for the 1:1 complex formed between NDI-Δ and TTF was found to be 1.8±0.02 M$^{-1}$ in MeCN.

Figure 18A:
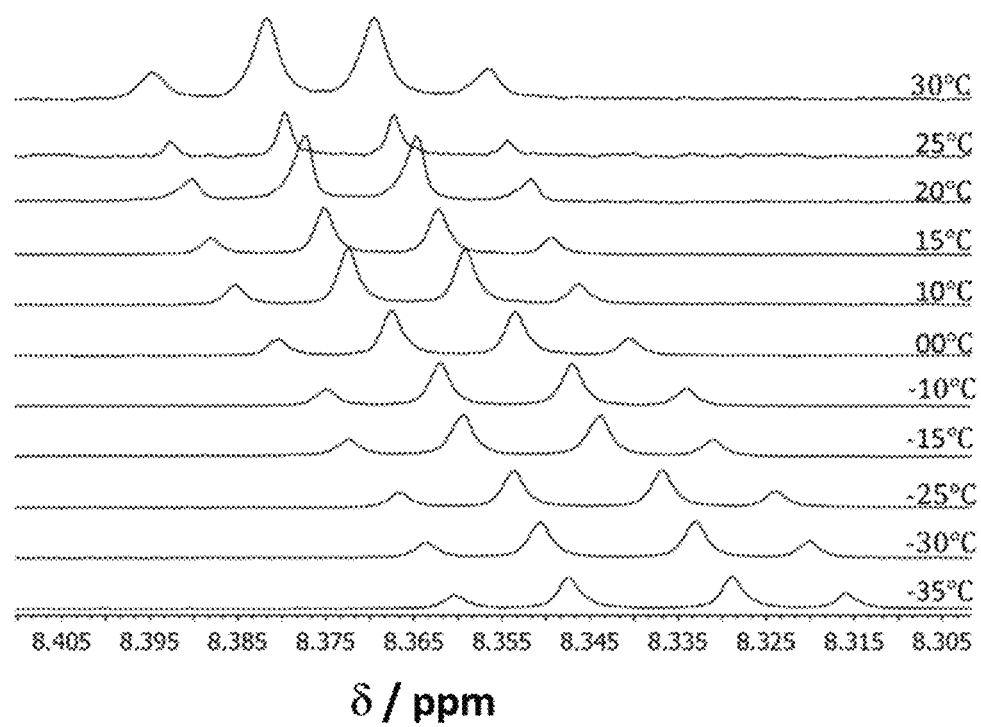
FIG. 18A-18B.
Figure 18B:
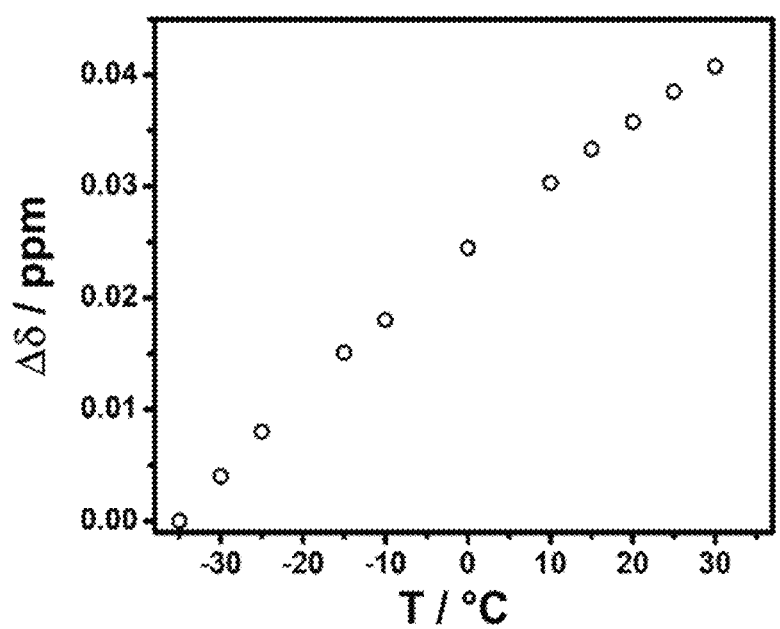

Variable Temperature $^1$H NMR of NDI-Δ:TTF in CD$_3$CN. The titration solution of NDI-Δ: TTF mixture has been studies by $^1$H NMR at different temperatures. As the temperature decrease, the aromatic peaks of the NDI shift upfield indicative of the inclusion of the TTF inside the NDI-Δ cavity. (FIG. 18A-18B)

Titration of TTF to NDI-Δ in CD$_2$Cl$_2$. The $^1$H NMR titration (FIG. 17A-17B) was carried out by adding tetrathiafulvalene ([TTF] 7.73 mM, CD$_2$Cl$_2$) to a solution (0.35 mM, CD$_2$Cl$_2$) of NDI-Δ at room temperature. The proton peaks of the NDI unit do not shift which is indicative of the non-inclusion of the TTF within the NDI-Δ cavity.

Figure 20:
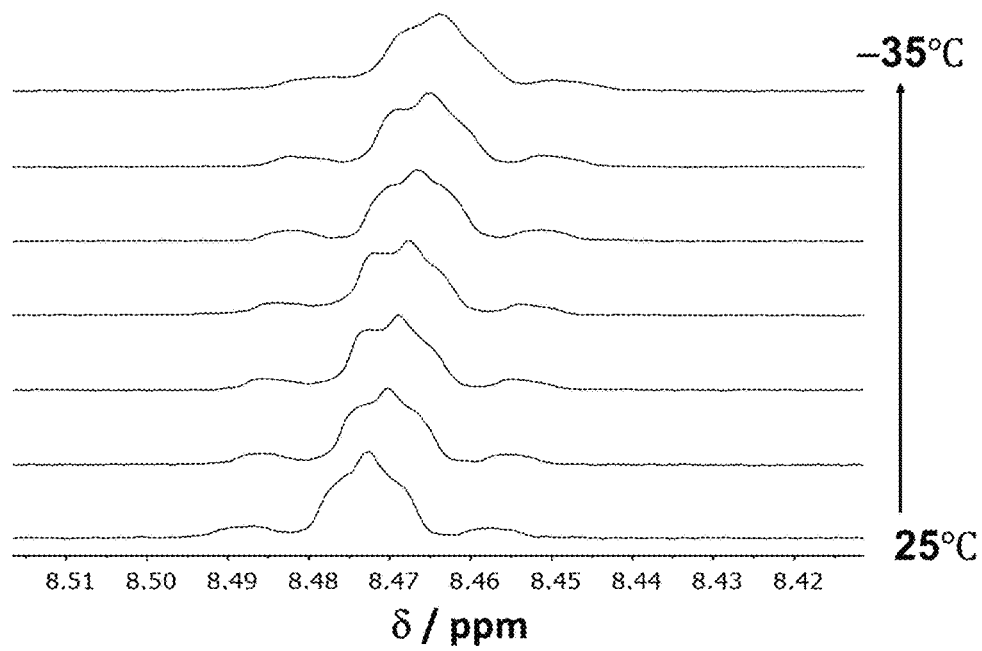
FIG. 20. Variable temperature of $^1$H NMR (600 MHz, CD$_2$Cl$_2$) titration curve of NDI-Δ with TTF.

Variable Temperature $^1$H NMR of NDI-Δ:TTF in CD$_2$Cl$_2$. The titration solution of NDI-Δ:TTF mixture in CD$_2$Cl$_2$ has been studies by $^1$H NMR at different temperatures (FIG. 20). As the temperature decrease, the aromatic peaks of the NDI slightly shift upfield indicative of the inclusion of the TTF inside the cavity of NDI-Δ.

Titration of TTF in CDCl$_3$. The $^1$H NMR titration (FIG. 21) was carried out by adding tetrathiafulvalene ([TTF] 22.5 mM, CHCl$_3$) to a solution (0.48 mM, CHCl$_3$) of NDI-Δ at room temperature. The proton peaks of the NDI unit do not shift which is indicative of the non-inclusion of the TTF within the NDI-Δ cavity.

Figure 22:
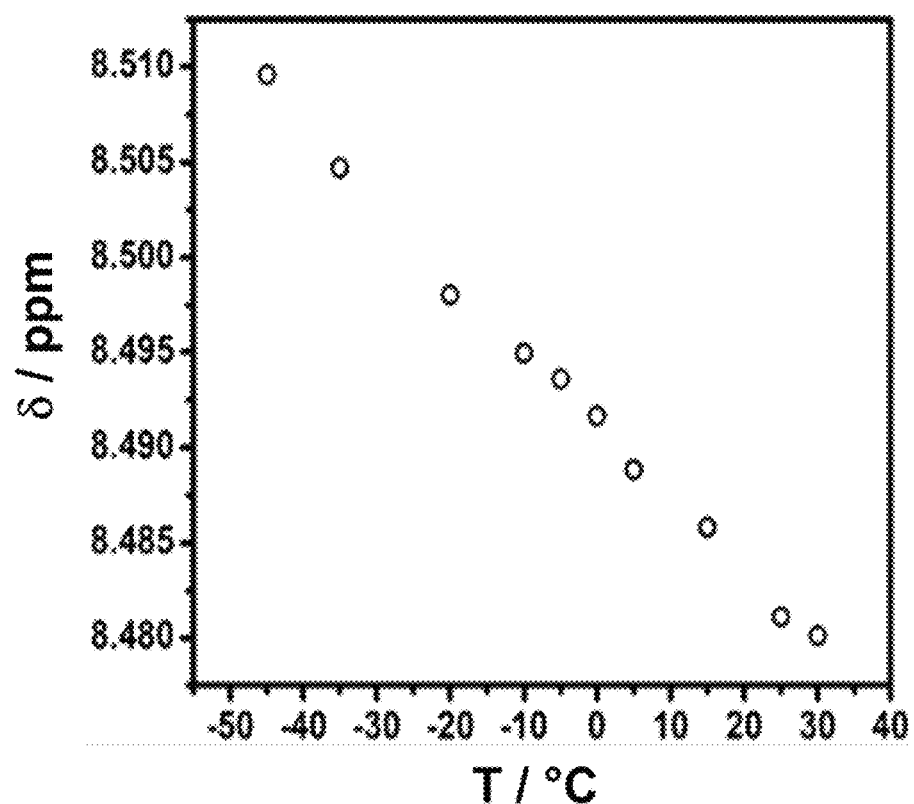
FIG. 22. A plot of the chemical shifts of the aromatic NDI protons as a function of temperature ($^1$H NMR, 600 MHz, CDCl$_3$).

Variable Temperature $^1$H NMR of NDI-Δ:TTF in CDCl$_3$. The titration solution of NDI-Δ:TTF mixture in CDCl$_3$ has been studied by $^1$H NMR spectroscopy at different temperatures. As the temperature decrease, the aromatic peaks of the NDI shift downfield indicative of the existence of hydrogen bonding between solvent and the aromatic protons of the NDI units (FIG. 22).

Titration of CHCl$_3$ to NDI-Δ in CD$_3$CN. The $^1$H NMR titration (FIG. 23A) was carried out by adding chloroform ([CHCl$_3$] 4.06 mM, MeCN) to a solution (0.396 mM, MeCN) of NDI-Δ at room temperature shifts of the NDI protons of the host were observed and used to determine the association constants ($K_a$), from the curve illustrated in FIG. 23B. The data have been fitted using an in-house program and the binding constant for the complex has been determined. The $K_a$ value for the 1:1 complex formed between NDI-Δ and CHCl$_3$ was found to be 15±0.08 M$^1$ in CD$_3$CN.

Figure 24:
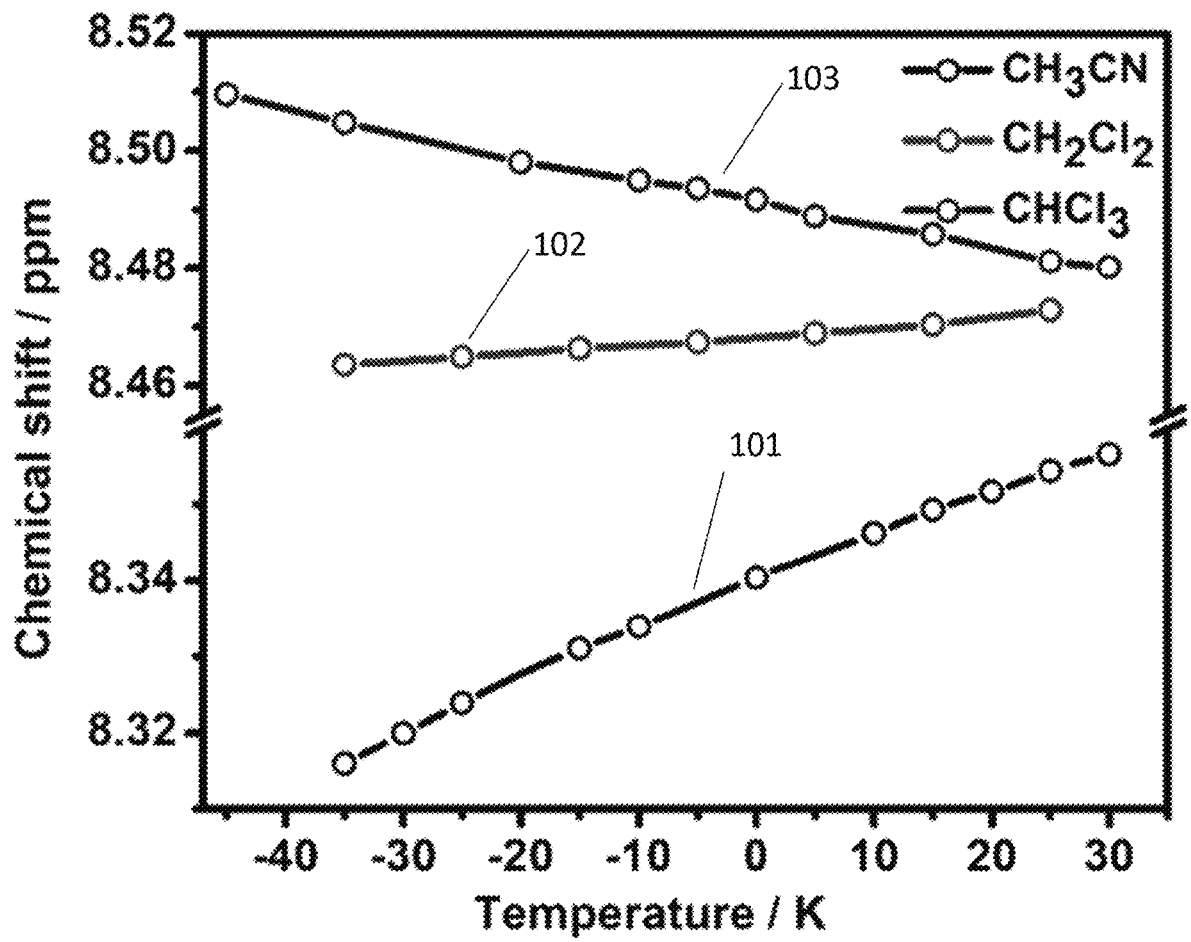
FIG. 24. $^1$H NMR spectroscopic data of NDI-Δ:TTF mixture in different solvent: CH$_3$CN 101, CH$_2$Cl$_2$ 102, and CHCl$_3$ 103. Plot of the variation of the chemical shift of the aromatic protons of the NDI units with a change in temperature in different solvents.

FIG. 24 shows the difference of the chemical shift of the aromatic protons of the NDI units at different temperatures for the NDI-Δ:TTF solutions (MeCN, CHCl$_3$ and CH$_2$Cl$_2$). In MeCN, as the temperature decrease, the NDI aromatic protons shift upfield as the result of the shielding of the aromatic NDI protons with an electron donor TTF. This supports the formation of the TTF⊂NDI-Δ adduct. In CH$_2$Cl$_2$ similar chemical shift trend is observed (slight upfield shift with a decrease of temperature) as well although is smaller than in MeCN. This is as well conclusive of the weaker binding of the TTF to the NDI-Δ in CH$_2$Cl$_2$. In CHCl$_3$, the NDI aromatic protons shift downfield which indicates the de-shielding of the aromatic protons through strong hydrogen bonding with CHCl$_3$. All these results support the competition between the CT interactions between the NDI-Δ and TTF and [Cl . . . π(NDI)] and [Cl . . . H(NDI)] interactions.

G. Absorption Spectroscopy Studies

Solution UV/Vis/NIR absorption spectra were recorded using a UV-3600Plus Shimadzu spectrophotometer. The temperature of cuvette cell was controlled using a Fisher scientific temperature controller. Preparation of thin films for solid-state studies was carried out by dispersing microcrystalline powder suspended in a solution of hexane, then drop-casted on a surface of a quartz slide. After solvent evaporation, green thin films of microcrystalline powder of CT-A, CT-B or CT-C are formed.

Figure 25:
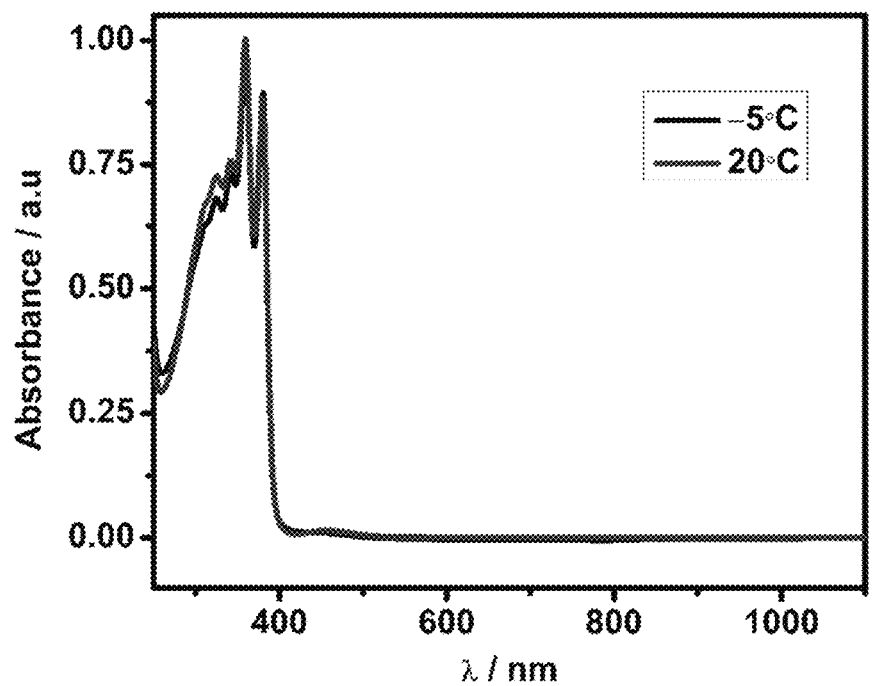
FIG. 25. Absorption spectra of TTF ⊂ NDI-Δ in CHCl$_3$ at 20 and −5° C.
Figure 26:
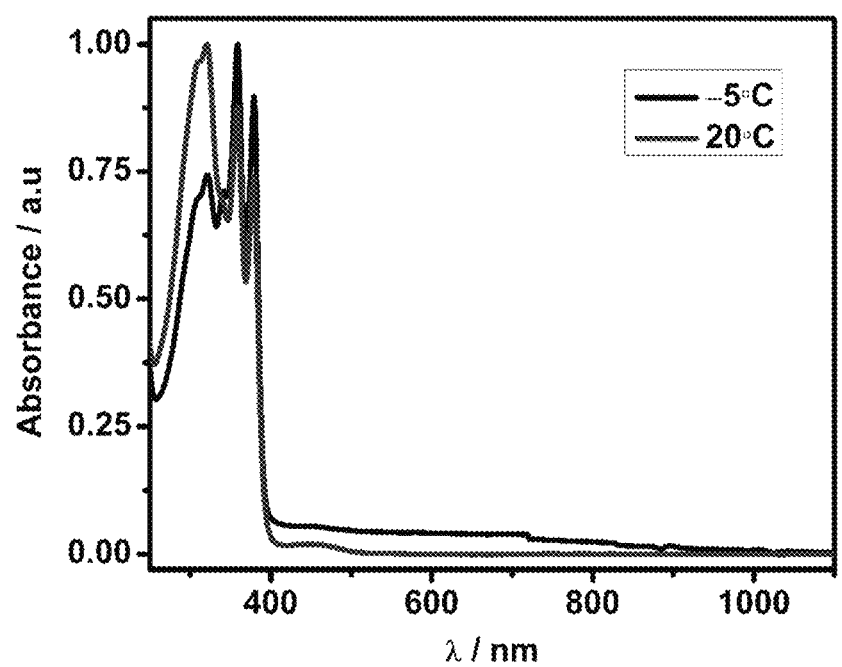
FIG. 26. Absorption spectra of TTF ⊂ NDI-Δ in CH$_2$Cl$_2$ at 20 and −5° C.

Absorption spectra of TTF⊂NDI-Δ in CHCl$_3$ (FIG. 25) and CH$_2$Cl$_2$ (FIG. 26) at 20 and -5° C. are shown.

H. EPR Studies

The spectra were acquired at X-band (9.5 GHz) with a Bruker Elexsys E580 spectrometer, an EN801 resonator, and an ENI A-500 RF power amplifier. Applied RF powers ranged from 200 to 400 W across the 7 MHz scanned range and the microwave power ranged from 2 to 20 mW. EPR Spectra were recorded with 0.010 mT modulation amplitude. The EPR measurements were carried out on the NDI-Δ: TTF charger transfer (CT) complexes as well Ref-NDI: TTF complex. The EPR and spectra were fit in MATLAB using EasySpin v4.5.5.

EPR Measurements at both X-band (9.5 GHz) and W-band (94 GHz) were carried out using a Bruker Elexsys E680-X/W EPR spectrometer outfitted with a split-ring resonator (ER-4118X-MS5) at X-band and a cylindrical resonator (EN-680-1021H) at W-band.

I. Magnetic Studies

Magnetic measurements of CT-A were made on a Quantum Design MPMS XL SQUID magnetometer in dc mode in applied field of 1 Tesla in the temperature range 1.8-300 K. Magnetic studies were performed on microcrystalline powder of CT-A sealed in a polypropylene bag under N$_2$, which was tightly rolled, placed inside a ¼ in. diameter drinking straw, and transferred to the magnetometer under a flow of argon to prevent introduction of 02 to the sample. Magnetization measurements were performed at 2, 5, and 10 K from 0 to 5 Tesla. Susceptibility measurements were conducted from 1.8 to 300 K at field of 1 Tesla. All data was corrected for diamagnetic contributions from the sample and sample holder by estimation based on Pascal's constants.[8]

Magnetic measurements of CT-A were measured on a Quantum Design MPMS SQUID magnetometer in dc mode in applied fields 10000 Oe in a temperature range 2-300 K. Magnetic moment vs field has been measured at 2, 5 and 10K. The magnetic susceptibility in the high-temperature region indicates the analogous paramagnetic arising from the spin-112 residing on each D$^+$ and A$^-$ radical, but its monotonous increase on cooling represents the absence of the spin peierls transition. The χT product in FIG. 31 (bottom) is lower than the expected value for a S=½ system which denotes either a partial charge transfer or the existence of strong antiferromagnetic interactions.

J. DFT and TDDFT Calculations

DFT Calculations. DFT Calculations on NDI-Δ and TTF were performed on optimized-structures using the B3LYP/6-31G*+ level with Jaguar software.[3] Geometry optimizations were performed without symmetry constraints and solvation energies were calculated using the Poisson-Boltzmann solvation model (PBF) for MeCN, CHCl$_3$ and CH$_2$Cl$_2$ in the Jaguar software.[3] Time-dependent DFT calculations (TDDFT) on TTF⊂NDI-Δ, has been conducted using single point calculations at the B3LYP/6-31G*+, while TD-DFT on TTF-Δ$^{2+\cdot}$ and TTF-Δ$^{+\cdot}$ have been performed using single point calculations at the UB3LYP/6-31G*+, using Jaguar software.[3] The molecular orbitals were generated with Maestro interface.

Gas Phase Geometry Optimized Calculations. All DFT calculations were first performed on gas optimized structures using the B3LYP/6-31G*+ level with Jaguar software.[3] Geometry optimizations were performed without symmetry constraints. Then For each solvent (MeCN, CHCl$_3$ and CH$_2$Cl$_2$) calculations has been performed using B3LYP/6-31G*+ with the corresponding PBF solvent model in Jaguar software.[3] Frontier orbitals for NDI-Δ and TTF are shown in FIG. 34.

Time-Dependent DFT Calculations

Complex CT-A: Single-Point Energy TD-DFT Calculations of TTF⊂NDI-Δ

Single-point energy TD-DFT calculations have been conducted on the TTF⊂NDI-Δ Host/Guest complex at the B3LYP/6-31G*+ level using Jaguar,[3] considering a total of 150 excited states to reach to the upper end of the absorption spectrum (200 nm). Three transition are associated to the CT behavior and these are tabulated in Table 4. These transitions involve both the TTF and the NDI-Δ components.

Complex CT-C: Single-Point Energy TD-DFT Calculations of TTF-A$^{2+\cdot}$

Single-point energy TD-DFT calculations have been conducted on the TTF-Δ$^{2+\cdot}$ structure using the open-shell broken symmetry approach at the UB3LYP/6-31G*+ level using Jaguar,[3] considering a total of 300 excited states to reach to the upper end of the absorption spectrum (200 nm). 14 transitions were determined with oscillator strengths>0.05 and these are tabulated in Table 5. The one-electron frontier orbitals (α and β spins) relevant to the transition at 3479.62 and 2802.32 nm are presented in FIG. 37 and FIG. 38. These transitions involve both the α and β-spins and all the three TTF molecules contribute to these transitions.

Complex CT-C: Single-Point Energy TD-DFT Calculations of TTF-Δ$^{+\cdot}$

Single-point point energy TD-DFT calculations have been conducted on the TTF-Δ$^{+\cdot}$ structure using the open-shell broken symmetry approach at the UB3LYP/6-31G*+ level using Jaguar,[3] considering a total of 300 excited states to reach to the upper end of the absorption spectrum (205 nm). 20 transitions were determined with oscillator strengths >0.03 and these are tabulated in Table 8. Only one transition is calculated at 3947.16 nm significantly shifted to the red comparing to the experimental results (2500 nm).

K. Conductivity and Photoconductivity Studies

All conductivity measurements were performed on single crystals using previously reported protocol.[11] Single crystals of CT-A, CT-B and CT-C were selected using a Pelco vacuum pick-up system and placed across patterned Au electrodes thermally evaporated on Si wafers. The ends of the crystals were painted with Pelco conductive gold paste to secure a conducting pathway to the patterned electrodes. DC conductivity were performed at a Signatone probe station, in conjunction with an Agilent 4155C semiconductor parameter analyzer. Current output was measured at room temperature for DC voltage sweeps from 5 to +5 V. All conductivity and mobility measurements were carried out in a US FED STD 209E Class 100 (ISO 5) clean room.

All conductivity measurements were performed on single crystals using previously reported protocol.[11] Single crystals of CT-A, CT-B and CT-B were picked up using a Pelco vacuum pick-up system and placed across patterned Au electrodes thermally evaporated on Si wafers as described below. The ends of the crystals were painted with Pelco conductive gold paste to secure a conducting pathway to the patterned electrodes.

Four-inch Silicon Quest International Si wafers with a 300 nm oxide surface coating were used as substrates on which devices were fabricated. 2×2 cm squares were cut, scrubbed using soapy water, cleaned by ultrasonication in a 1:1:1 mixture of acetone/MeOH/iPrOH and blown dry in a stream of $N_2$ gas. The substrates were UV-ozone cleaned for 30 minutes before material was deposited onto the surface. Electrodes (spaced 50 μm apart) were patterned onto the surface of the wafer by thermally evaporating 50 nm of Au through a shadow mask at a pressure of $10^{-6}$ mbar. DC conductivity were performed at a Signatone probe station, in conjunction with an Agilent 4155C semiconductor parameter analyzer. Current output was measured at room temperature for DC voltage sweeps from 5 to +5 V. All conductivity and mobility measurements were carried out in a US FED STD 209E Class 100 (ISO 5) clean room.

Figure 40:
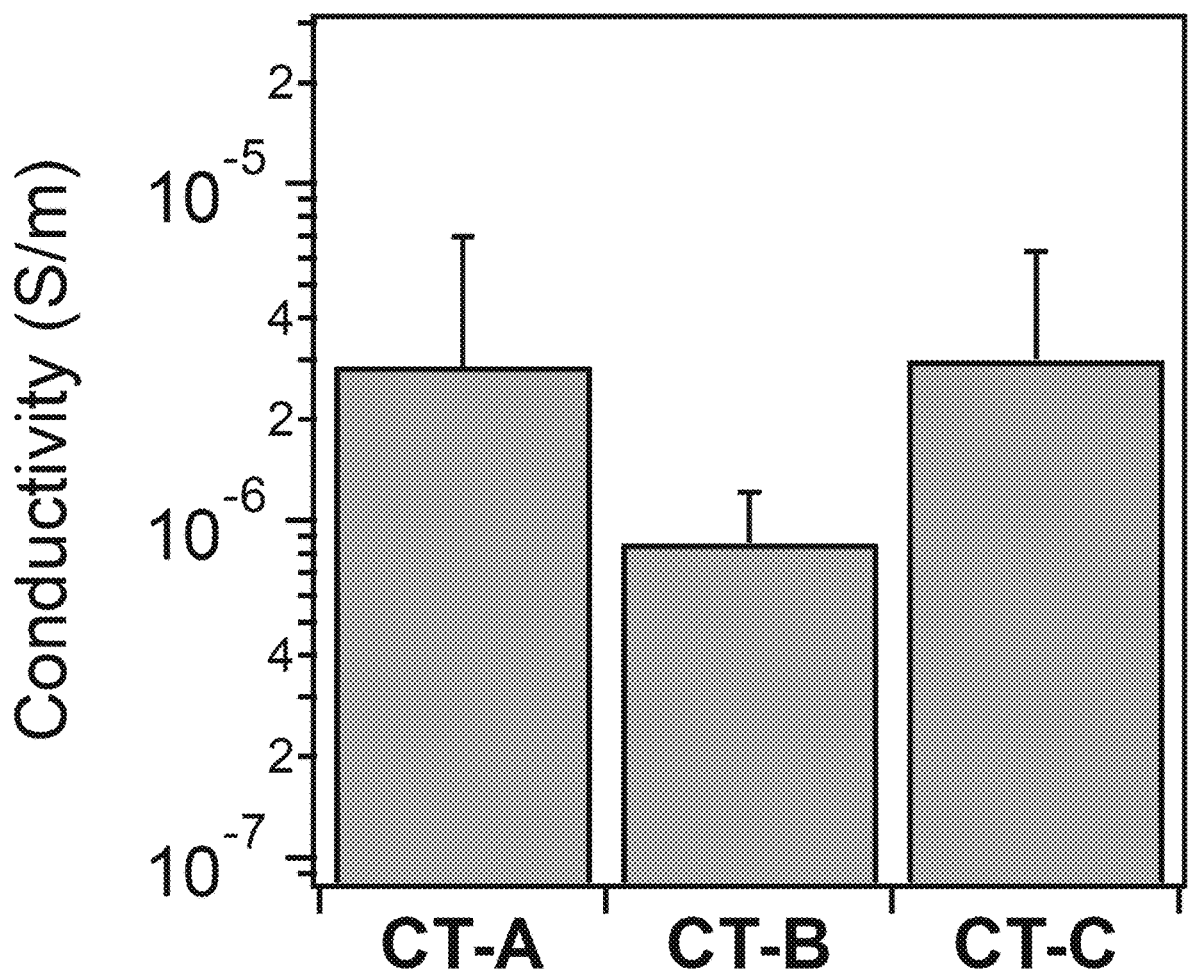
FIG. 40. Two-probe conductivity of CT-A, CT-B and CT-C single crystals

Conductivities of the single crystals (FIG. 40) were calculated from the ohmic region of the I-V curve. Details of the geometries for all measured crystals are listed in Table 9.

TABLES

TABLE 1

Summary of Crystallographic Data for the Three Polymorphs of NDI-Δ Crystallized from MeCN/Et$_2$O

| Parameters | α-NDI-Δ | β-NDI-Δ | γ-NDI-Δ |
|---|---|---|---|
| Formula | $C_{60}H_{42}N_6O_{12}\cdot 4(C_2H_3N)\cdot 0.5(C_4H_{10}O)$ | $C_{60}H_{42}N_6O_{12}\cdot (C_4H_{10}O)$ | $(C_{60}H_{42}N_6O_{12})\cdot (C_4H_{10}O)\cdot (C_2H_3N)$ |
| FW | 1240.27 | 1113.13 | 875.77 |
| Temp. (K) | 100 (2) | 100 (2) | 100 (2) |
| Crystal system | Monoclinic | Triclinic | Hexagonal |
| Space group | $P2_1$ | P1 | $P6_2$ |
| a/Å | 15.9512 (11) | 8.731 (3) | 34.8534 (11) |
| b/Å | 15.0324 (11) | 18.330 (6) | 34.8534 (11) |
| c/Å | 25.0891 (17) | 18.881 (6) | 8.5499 (4) |
| α/° | 90 | 62.204 (7) | 90 |
| β/° | 90.488 (2) | 85.045 (8) | 90 |
| γ/° | 90 | 77.442 (7) | 120 |
| V/Å$^3$ | 6015.8 (7) | 2608.7 (4) | 8830.8 (7) |
| Z | 4 | 2 | 8 |
| $D_c$/mg · m$^{-3}$ | 1.369 | 1.413 | 1.302 |
| Unique reflns | 34154 | 21111 | 9124 |
| Reflns [I > 2σ(I)] | 28348 | 7972 | 7558 |
| $R_{int}$ | 0.041 | 0.181 | 0.055 |
| S | 1.03 | 0.97 | 1.025 |
| $R_1$ (I > 2σ(I)) | 0.053 | 0.10 | 0.0706 |
| $wR_2$ (all) | 0.148 | 0.2365 | 0.1908 |
| $\Delta\rho_{max}$, $\Delta\rho_{min}$ (e Å$^{-3}$) | 1.36, −1.33 | 0.34, −0.36 | 0.89, −0.47 |

TABLE 2

Summary of Crystallographic Data for the NDI-Δ:TTF Cocrystals

| Parameters | CT-A | CT-B | CT-C |
|---|---|---|---|
| Formula | $C_{60}H_{42}N_6O_{12} \cdot 2.5(C_6H_4S_4)$ | $(C_{60}H_{42}N_6O_{12}) \cdot 1.5(C_6H_4S_4) \cdot 7(CHCl_3)$ | $C_{60}H_{42}N_6O_{12} \cdot 3(C_6H_4S_4) \cdot CH_2Cl_2$ |
| FW | 1550.83 | 2181.02 | 1736.91 |
| Temp. (K) | 103 (2) | 100 (2) | 99.99 |
| Crystal system | Triclinic | Trigonal | Monoclinic |
| Space group | P-1 | P32$_1$ | P2$_1$/$n$ |
| a/Å | 15.8923 (10) | 19.1592 (4) | 18.1136 (10) |
| b/Å | 15.9624 (10) | 19.1592 (4) | 15.6480 (9) |
| c/Å | 16.7921 (11) | 15.4941 (4) | 27.3059 (15) |
| α/° | 69.423 (4) | 90 | 90 |
| β/° | 69.340 (4) | 90 | 91.229 |
| γ/° | 70.959 (4) | 90 | 90 |
| V/Å$^3$ | 3630.8 (4) | 4925.5 (2) | 7737.8 (7) |
| Z | 2 | 2 | 4 |
| $D_c$/mg·m$^{-3}$ | 1.419 | 1.571 | 1.491 |
| Unique reflns | 11083 | 8219 | 12570 |
| Reflns [I > 2σ(I)] | 10161 | 6643 | 10990 |
| $R_{int}$ | 0.042 | 0.08 | 0.1025 |
| S | 1.015 | 1.02 | 1.045 |
| $R_1$ (I > 2 σ(I)) | 0.1993 | 0.074 | 0.1947 |
| $wR_2$ (all) | 0.4648 | 0.208 | 0.378 |
| $\Delta\rho_{max}$, $\Delta\rho_{min}$ (e Å$^{-3}$) | 1.17, −0.94 | 0.91, −0.81 | 0.78, −0.55 |

TABLE 3

DFT computed orbital energies (eV) of NDI-Δ and TTF optimized geometries based on B3LYP/6-31G*+ calculations

| NDI-Δ | $E_{HOMO}$ | $E_{LUMO}$ (eV) | Solvent Energy (kcal/mol) | TTF | $E_{HOMO}$ (eV) | $E_{LUMO}$ (eV) | Solvent Energy (kcal/mol) | ΔE(eV) |
|---|---|---|---|---|---|---|---|---|
| MeCN | −7.26 | −3.85 | −37.28 | | −5.07 | −1.34 | −5.81 | 1.22 |
| CHCl$_3$ | −7.26 | −3.84 | −26.28 | | −5.00 | −1.28 | −4.27 | 1.16 |
| CH$_2$Cl$_2$ | −7.26 | −3.85 | −31.76 | | −5.02 | −1.29 | −5.02 | 1.17 |
| Gas Phase | −7.26 | −3.82 | / | | −4.82 | −1.14 | / | 1.00 |

TABLE 4

Contributions to the CT transitions

| Wavelength (nm) | Excitation | X coeff. | f | Transition dipole moment (Debye) |
|---|---|---|---|---|
| 1558.46 | 322 → 323 | 0.99866 | 0.003 | 1.08 |
| 1257.35 | 322 → 324 | 0.99640 | 0.014 | 1.93 |
| 1067.75 | 322 → 325 | 0.99569 | 0.012 | 1.67 |

TABLE 5

UB3LYP/6-311G*+ computed transitions for TTF-Δ$^{2+\cdot}$ with oscillator strengths (f) greater than 0.05.

| Transition | Wavelength(nm) | f | Transition dipole moment (Debye) |
|---|---|---|---|
| 3 | 3479.62 | 0.0651 | 6.94 |
| 4 | 2802.32 | 0.0683 | 6.38 |
| 8 | 563.46 | 0.1297 | 3.94 |
| 9 | 547.51 | 0.0735 | 2.92 |
| 45 | 355.25 | 0.1489 | 3.35 |
| 48 | 343.94 | 0.0951 | 2.63 |
| 49 | 342.83 | 0.0848 | 2.48 |
| 52 | 338.03 | 0.2666 | 4.37 |
| 63 | 321.26 | 0.1013 | 2.63 |
| 66 | 316.98 | 0.0842 | 2.38 |
| 67 | 316.76 | 0.0752 | 2.25 |
| 80 | 294.70 | 0.0804 | 2.24 |
| 93 | 279.82 | 0.0924 | 2.34 |
| 99 | 273.05 | 0.1009 | 2.42 |

TABLE 6

Contributions to the 3479.62 nm excitation.

| Excitation | X coeff. | Excitation | Y coeff. |
|---|---|---|---|
| α(154) → α(156) | −0.10079 | α(155) → α(156) | −0.88467 |
| α(155) → α(156) | 1.11315 | β(154) → β(156) | 0.18115 |
| β(154) → β(156) | −0.26965 | β(155) → β(156) | −0.75906 |
| β(155) → β(156) | 1.03532 | | |

TABLE 7

Contributions to the 2802.32 nm excitation.

| Excitation | X coeff. | Excitation | Y coeff. |
|---|---|---|---|
| $\alpha(154) \rightarrow \alpha(156)$ | −0.92934 | $\alpha(154) \rightarrow \alpha(156)$ | 0.58500 |
| $\beta(154) \rightarrow \beta(156)$ | −0.92028 | $\beta(154) \rightarrow \beta(156)$ | 0.63928 |
| $\beta(155) \rightarrow \beta(156)$ | −0.28995 | $\beta(155) \rightarrow \beta(156)$ | 0.21823 |

TABLE 8

UB3LYP/6-311G** computed transitions for TTF-$\Lambda^{+\cdot}$ with oscillator strengths (f) greater than 0.03

| Transition | Wavelength (nm) | f | Transition dipole moment (Debye) |
|---|---|---|---|
| 2 | 3947.16 | 0.0423 | 5.96 |
| 3 | 597.69 | 0.0376 | 2.18 |
| 4 | 582.60 | 0.0687 | 2.92 |
| 47 | 342.28 | 0.0838 | 2.47 |
| 51 | 334.98 | 0.0750 | 2.31 |
| 53 | 328.34 | 0.0613 | 2.06 |
| 55 | 326.01 | 0.1337 | 3.04 |
| 56 | 325.53 | 0.0556 | 1.96 |
| 57 | 323.72 | 0.1299 | 2.99 |
| 59 | 322.58 | 0.0517 | 1.88 |
| 60 | 322.48 | 0.1159 | 2.82 |
| 73 | 304.86 | 0.0482 | 1.76 |
| 74 | 303.82 | 0.0479 | 1.75 |
| 77 | 300.60 | 0.0306 | 1.39 |
| 80 | 296.55 | 0.1008 | 2.52 |
| 86 | 287.95 | 0.0398 | 1.56 |
| 89 | 284.63 | 0.1168 | 2.65 |
| 98 | 275.54 | 0.0359 | 1.45 |
| 108 | 270.19 | 0.0346 | 1.41 |
| 115 | 266.42 | 0.0646 | 1.91 |

TABLE 9

Geometries of all single crystals used for electronic measurements

| | CT-A | CT-B | CT-C |
|---|---|---|---|
| Length between electrodes (L) (µm) | 740.4 | 1072.4 | 791.3 |
| Electrode width (W) (µm) | 73.0 | 145.1 | 123.9 |
| Average film thickness (t) (nm) | 58.6 | 103.6 | 63.1 |
| Devices measured | 4 | 3 | 7 |

REFERENCES

References of the Background and Detailed Description (1) (a) Grabar, A. *The Art of The World: Art of the Byzantine Empire*; Greystone Press: New York, 1967. (b) Grunbaum, B.; Shephard, G. C. *Tilings and Patterns*; W. H. Freeman & Co.: New York, N.Y., USA, 1986. (c) Chavey, D. Tilings by Regular Polygons 2. A Catalog of Tilings. *Comput Math Appl.* 1989, 17, 147-165.

(2) (a) Kepler, J. *Harmonices mundi; Johannes Planck*; Linzs, 1619.

(3) Millan, J. A.; Ortiz, D.; van Anders, G.; Glotzer, S. C. Self-Assembly of Archimedean Tilings with Enthalpically and Entropically Patchy Polygons. *ACS Nano.* 2014, 8, 2918-2928.

(4) Shechtman, D.; Blech, I.; Gratias, D.; Cahn, J. W. Metallic Phase with Long-Range Orientational Order and No Translational Symmetry. *Phys. Rev. Lett.* 1984, 53, 1951-1953. (b) Levine, D.; Steinhardt, P. J. Quasicrystals: A New Class of Ordered Structures. *Phys. Rev. Lett.* 1984, 53, 2477-2480.

(5) Ueda, K.; Dotera, T.; Gemma, T. Photonic Band Structure Calculations of Two-Dimensional Archimedean Tiling Patterns. *Phys. Rev. B.* 2007, 75, 195122.

(6) Ramirez, A. P. Strongly Geometrically Frustrated Magnets. *Annu. Rev. Mater. Sci.* 1984, 24, 453-480.

(7) Tsai, A. P.; Yoshimura, M. Highly Active Quasi-Crystalline Al—Cu—Fe Catalyst for Steam Reforming of Methanol. *Appl. Catal. A.* 2001, 214, 237-241.

(8) (a) Zhang, F.; Liu, Y.; Yan, H. Complex Archimedean Tiling Self-Assembled from DNA Nanostructures. *J. Am. Chem. Soc.* 2013, 135, 7458-7461. (b) Zhang, F.; Jiang, S.; Li, W.; Hunt, A.; Liu, Y.; Yan, H. Self-Assembly of Complex DNA Tessellations by Using Low-Symmetry Multi-Arm DNA Tiles. *Angew. Chem. Int. Ed.* 2016, 128, 9006-9009. (c) Matthies, M.; Agarwal, N. P.; Poppleton, E.; Joshi, F. M.; Šulc, P.; Schmidt, T. L. Triangulated Wireframe Structures Assembled Using Single-Stranded DNA Tiles. *ACS Nano.* 2019, 13, 1839-1848.

(9) Tschierske, C. Liquid Crystal Engineering—New Complex Mesophase Structures and Their Relations to Polymer Morphologies, Nanoscale Patterning and Crystal Engineering. *Chem. Soc. Rev.* 2007, 36, 1930-1970.

(10) Talapin, D. V.; Shevchenko, E. V.; Bodnarchuk, M. I.; Ye, X.; Chen, J.; Murray, C. B. Quasicrystalline Order in Self-Assembled Binary Nanoparticle Superlattices. *Nature* 2009, 461, 964-967.

(11) (a) Asari, T.; Arai, S.; Takano, A.; Matsushita, Y. Archimedean Tiling Structures from ABA/CD Block Copolymer Blends Having Intermolecular Association with Hydrogen Bonding. *Macromolecules* 2006, 39, 2232-2237.

(12) Shen, Y.; Deng, K.; Yang, S.; Qin, B.; Cheng, S.; Zhu, N.; Ding, J.; Zhao, D.; Liu, J.; Zeng, Q.; Wang, C. Triangular-Shaped Molecular Random Tiling and Molecular Rotation in Two-Dimensional Glassy Networks. *Nanoscale* 2014, 6, 7221-7225.

(13) Destoop, I.; Ghijsens, E.; Katayama, K.; Tahara, K.; Mali, K. S.; Tobe, Y.; De Feyter, S. Solvent-Induced Homochirality in Surface-Confined Low-Density Nanoporous Molecular Networks. *J. Am. Chem. Soc.* 2012, 134, 19568-19571.

(14) Iritani, K.; Ikeda, M.; Yang, A.; Tahara, K.; Hirose, K.; Moore, J. S.; Tobe, Y. Hexagonal Molecular Tiling by Hexagonal Macrocycles at the Liquid/Solid Interface: Structural Effects on Packing Geometry. *Langmuir* 2017, 33, 12453-12462.

(15) Xu, S.-Q.; Zhan, T.-G.; Wen, Q.; Pang, Z.-F.; Zhao, X. Diversity of Covalent Organic Frameworks (COFs): A 2D COF Containing Two Kinds of Triangular Micropores of Different Sizes. *ACS Macro Lett.* 2016, 5, 99-102.

(16) Ng, C.-F.; Chow, H.-F.; Mak, T. C. W. Organic Molecular Tessellations and Intertwined Double Helices Assembled by Halogen Bonding. *Cryst Eng Comm.* 2019, 21, 1130-1136.

(17) Ferraris, J. P.; Poehler, T. O.; Bloch, A. N.; Cowan, D. O. Synthesis of the Highly Conducting Organic Salt: Tetramethyltetrathiofulvalenium—Tetracyano-Quinodimethanide. *Tetrahedron Lett.* 1973, 14, 2553-2556.

(18) Yamada, J.-i.; Akutsu, H. New Trends in the Synthesis of π-Electron Donors for Molecular Conductors and Superconductors. *Chem. Rev.* 2004, 104, 5057-5084

(19) (a) Girlando, A.; Painelli, A.; Bewick, S. A.; Soos, Z. G. Charge Fluctuations and Electron-Phonon Coupling in Organic Charge-Transfer Salts with Neutral-Ionic and Peierls Transitions. *Synth. Met.* 2004, 141, 129-138. (b) Horiuchi, S.; Tokura, Y. Organic Ferroelectrics. *Nat. Mater.* 2008, 7, 357-366.

(20) (a) Kagawa, F.; Horiuchi, S.; Matsui, H.; Kumai, R.; Onose, Y.; Hasegawa, T.; Tokura, Y. Electric-Field Control of Solitons in a Ferroelectric Organic Charge-Transfer Salt. *Phys. Rev. Lett.* 2010, 104, 227602. (b) Kobayashi, K.; Horiuchi, S.; Kumai, R.; Kagawa, F.; Murakami, Y.; Tokura, Y. Electronic Ferroelectricity in a Molecular Crystal with Large Polarization Directing Antiparallel to Ionic Displacement. *Phys. Rev. Lett.* 2012, 108, 237601. (c) Horiuchi, S.; Kobayashi, K.; Kumai, R.; Ishibashi, S. Ionic Versus Electronic Ferroelectricity on Donor-Acceptor Molecular Sequence. *Chem. Lett.* 2014, 43, 26-35.

(21) Tayi, A. S.; Shveyd, A. K.; Sue, A. C.-H.; Szarko, J. M.; Rolczynski, B. S.; Cao, D.; Kennedy, T. J.; Sarjeant, A. A.; Stern, C. L.; Paxton, W. F.; Wu, W.; Dey, S. K.; Fahrenbach, A. C.; Guest, J. R.; Mohseni, H.; Chen, L. X.; Wang, K. L.; Stoddart, J. F.; Stupp, S. I. Room-Temperature Ferroelectricity in Supramolecular Networks of Charge-Transfer Complexes. *Nature* 2012, 488, 485-489.

(22) Novoselov, K. S. Electric Field Effect in Atomically Thin Carbon Films. *Science.* 2004, 306, 666-669.

(23) Xiufeng, S.; Jinlian, H.; Haibo, Z. Two-Dimensional Semiconductors: Recent Progress and Future Perspectives. *J. Mater. Chem. C* 2013, 1, 2952-2969.

(24) Eftekhari, A. Tungsten Dichalcogenides (W52, WSe2, and WTe2): Materials Chemistry and Applications. *J. Mater. Chem. A* 2017, 5, 18299-18325.

(25) (a) Xia, F.; Wang, H.; Xiao, D.; Dubey, M.; Ramasubramaniam, A. Two-Dimensional Material Nanophotonics, *Nat. Photonics* 2014, 8, 899-907. (b) Yu, L.; Lee, Y-H.; Ling, X.; Santos, J. G. S.; Shin, Y. C.; Lin, Y.; Dubey, M.; Kaxiras, E.; Kong, J.; Wang, H.; Palacios, T. Graphene/$MoS_2$ Hybrid Technology for Large-Scale Two-Dimensional Electronics. *Nano Lett.* 2014, 14, 3055-3063.

(26) (a) Hana, Y.; Ge, Y.; Chao, Y.; Wang, C.; Wallace, G. G. Recent Progress in 2D Materials for Flexible Supercapacitors. *J. Energy Chem.* 2018, 27, 57-72. (b) Akinwande, D.; Petrone, N.; Hone, J. Two-Dimensional Flexible Nanoelectronics. *Nat. Commun.* 2014, 5, 5678.

(27) (a) WiArthner, F.; Stolte, M. Naphthalene and Perylene Diimides for Organic Transistors. *Chem. Commun.* 2011, 47, 5109-5115. (b) Zhan, X.; Facchetti, A.; Barlow, S.; Marks, T. J.; Ratner, M. A.; Wasielewski, M. R.; Marder, S. R. Rylene and Related Diimides for Organic Electronics. *Adv. Mater.* 2011, 23, 268-284. (c) Jones, B. A.; Facchetti, A.; Wasielewski, M. R.; Marks, T. J. Tuning Orbital Energetics in Arylene Diimide Semiconductors. Materials Design for Ambient Stability of n-Type Charge Transport. *J. Am. Chem. Soc.* 2007, 129, 15259-15278.

(28) Hong, J.; Ha, Y. H.; Cha, H.; Kim, R.; Kim, Y. J.; Park, C. E.; Durrant, J. R.; Kwon, S.-K.; An, T. K.; Kim, Y-H. All-Small-Molecule Solar Cells Incorporating NDI-Based Acceptors: Synthesis and Full Characterization. *ACS Appl. Mater. Interfaces* 2017, 9, 44667-44677.

(29) (a) Mukhopadhyay, P.; Iwashita, Y.; Shirakawa, M.; Kawano, S; Fujita, N.; Shinkai, S. Spontaneous Colorimetric Sensing of the Positional Isomers of Dihydroxynaphthalene in a 1D Organogel Matrix. *Angew. Chem. Int. Ed.* 2006, 45, 1592-1595. (b) Gu, P.-Y.; Wang, Z.; Liu, G.; Nie, L.; Ganguly, R.; Li, Y.; Zhang, Q. Synthesis, Physical Properties, and Sensing Behaviour of a Novel Naphthalenediimide Derivative Dyes. *Pigm.* 2016, 131, 224-230.

(30) (a) Al Kobaisi, M.; Bhosale, S. V.; Latham, K.; Raynor, A. M.; Bhosale, S. V. Functional Naphthalene Diimides: Synthesis, Properties, and Applications. *Chem. Rev.* 2016, 116, 11685-11796, (b) Wu, Z. H.; Huang, Z. T.; Guo, R. X.; Sun, C. L.; Chen, L. C.; Sun, B.; Shi, Z. F.; Shao, X.; Li, H.; Zhang, H. L. 4,5,9,10-Pyrene Diimides: A Family of Aromatic Diimides Exhibiting High Electron Mobility and Two-Photon Excited Emission. *Angew. Chem., Int. Ed.* 2017, 56, 13031-13035.

(31) Chen, D.; Avestro, A.-J.; Chen, Z.; Sun, J.; Wang, S.; Xiao, M.; Erno, Z.; Algaradah, M. M.; Nassar, M. S.; Amine, K.; Meng, Y; Stoddart, J. F. A Rigid Naphthalenediimide Triangle for Organic Rechargeable Lithium-Ion Batteries. *Adv. Mater.* 2015, 27, 2907-2912.

(32) Schneebeli, S. T.; Frasconi, M.; Liu, Z.; Wu, Y.; Gardner, D. M.; Strutt, N. L.; Cheng, C.; Carmieli, R.; Wasielewski, M. R.; Stoddart, J. F. Electron Sharing and Anion-π Recognition in Molecular Triangular Prisms. *Angew. Chem. Int. Ed.* 2013, 52, 13100-13104.

(33) Mizuno, A.; Shuku, Y.; Suizu, R.; Matsushita, M.; Tsuchiizu, M.; Malieru, D. R.; Illas, F.; Robert, V.; Awaga, K. Discovery of the K4 Structure Formed by a Triangular 7C Radical Anion. *J. Am. Chem. Soc.* 2015, 137, 7612-7615.

(34) Wu, Y.; Krzyaniak, M. D.; Stoddart, J. F.; Wasielewski, M. R. Spin Frustration in the Triradical Trianion of a Naphthalenediimide Molecular Triangle. *J. Am. Chem. Soc.* 2017, 139, 2948-2951.

(35) Egli, M.; Gessner, R. V. Stereoelectronic Effects of Deoxyribose O4' on DNA Conformation. *Proc. Natl. Acad. Sci. U.S.A.* 1995, 92, 180-184.

(36) Fang, X.; Yuan, X.; Song, Y-B.; Wang, J-D.; Lin, M-J. Cooperative Lone Pairn and Coordination Interactions in Naphthalene Diimide Coordination Networks. *Cryst Eng Comm.* 2014, 16, 9090-9095.

(37) Liu, Z.; Liu, G.; Wu, Y.; Cao, D.; Sun, J.; Schneebeli, S. T.; Nassar, M. S.; Mirkin, C. A.; Stoddart, J. F. Assembly of Supramolecular Nanotubes from Molecular Triangles and 1,2-Dihalohydrocarbons *J. Am. Chem. Soc.* 2014, 136, 47, 16651-16660.

(38) (a) Kitaigorodskii, I. *Organic Chemical Crystallography*; Consultants Bureau: New York, 1961. (b) Bernstein, J. *Polymorphism in Molecular Crystals*; Oxford University Press: Oxford, U K, 2007.

(39) Lu, C.; Li, Y.; Wang, L.-M.; Yan, H.-J.; Chen, L.; Wang, D. Rational Design of Two-Dimensional Covalent Tilings Using a $C_6$-Symmetric Building Block via On-Surface Schiff Base Reaction. *Chem. Commun.* 2019, 55, 1326-1329.

(40) Ostroverkhova, O. Organic Optoelectronic Materials: Mechanisms and Applications. *Chem. Rev.* 2016, 116, 13279-13412

(41) (a) Guinonneau, P.; Kepert, C. J.; Bravic, G.; Chasseau, D.; Truter, M. R.; Kurmoo, M.; Day, P. Determining the Charge Distribution in BEDT-TTF Salts. *Synth. Met.* 1997, 86, 1973. (b) Umland, T. C.; Allie, S.; Kuhlman, T.; Coppens, P. Relation Between Geometry and Charge Transfer in Low-Dimensional Organic Salts. *J. Phys. Chem.* 1988, 92, 6456.

(42) Wartelle, C.; Viruela, R.; Viruela, P. M.; Sauvage, F. X.; Salle, M.; Orti, E.; Levillain, E.; Le Derf, F. First Signals of Electrochemically Oxidized Species of TTF and TTM- TTF: A Study by in situ Spectroelectrochemical FTIR and DFT Calculations. *Phys. Chem. Chem.* 2003, 5, 4672-4679.

(43) Matsuzaki, S.; Kuwata, R.; Toyoda, K. Raman Spectra of Conducting TCNQ Salts; Estimation of the Degree of Charge Transfer from Vibrational Frequencies. *Solid State Commun.* 1980, 33, 403-405.

(44) (a) Yamamoto, S.; Pirillo, J.; Hijikata, Y.; Zhang, Z.; Awaga, K. Nanopore-Induced Host-Guest Charge Transfer Phenomena in a Metal-Organic Framework. *Chem. Sci.* 2018, 9, 3282-3289.

(45) Cai, S-L.; Zhang, Y-B.; Pun, A. B.; He, B.; Yang, J.; Toma, F. M.; Sharp, I. D.; Yaghi, O. M.; Fan, J.; Zheng, S-R.; Zhang, W-G.; Liu, Y. Tunable Electrical Conductivity in Oriented Thin Films of Tetrathiafulvalene-Based Covalent Organic Framework. *Chem. Sci.* 2014, 5, 4693-4700.

(46) Zhang, J.; Sun, B.; Wang. Q.; Zou. L. Novel Multi-Stimuli Responsive Molecules Based on Photochromic Bithienylethenes Containing the Tetrathiafulvalene Unit. *RSC Adv.* 2016, 6, 16598-16601.

(47) Montoro, T.; Tardajos, G.; Guerrero, A.; Torres, D-M.; Salgado, C.; Fernandez, I.; Barcina, J. O. σ-Hole 7C and Lone Pair 7C Interactions in Benzylic Halides. *Org. Biomol. Chem.* 2015, 13, 6194-6202.

(48) Cao, D.; Amelia, M.; Klivansky, L. M.; Koshkakaryan, G.; Khan, S. I.; Semeraro, M.; Silvi, S.; Venturi, M.; Credi, A.; Liu, Y. Probing DonorAcceptor Interactions and Co-Conformational Changes in Redox Active Desymmetrized [2]Catenanes. *J. Am. Chem. Soc.* 2010, 132, 1110-1122.

(49) Zhao, Y-L.; Trabolsia, A.; Stoddart, J. F. A Bistable Pretzelane. *Chem. Commun.* 2009, 4844-4846.

(50) La Porte. N. T.; Martinez, J. F.; Chaudhuri, S.; Hedstrm, S.; Batista, V. S.; Wasielewski. M. R. Photoexcited Radical Anion Super-Reductants for Solar Fuels Catalysis. *Coord. Chem. Rev.* 2018, 361, 98-119.

(51) Guo, Z.; Panda, D. K.; Gordillo, Monica A.; Khatun, A.; Wu, H.; Zhou, W.; Saha, S. Lowering Band Gap of an Electroactive Metal-Organic Framework via Complementary Guest Intercalation. *ACS Appl. Mater. Interfaces* 2017, 9, 32413-32417.

(52) Mercier, N.; Giffard, M.; Pilet, G.; Allain, M.; Hudhomme, P.; Mabon, G.; Levillain, E.; Gorgues, A.; Riou, A. $(TTF)_2[TTF(CO_2H)_2(CO_2)_2]$: A Wholly TTF Material Containing TTF Radical Cations and TTF Derived Anions. *Chem. Commun.* 2001, 2722-2723.

(53) Spruell, J. M.; Coskun, A.; Friedman, D. C.; Forgan, R. S.; Sarjeant, A. A.; Trabolsi, A.; Fahrenbach, A. C.; Barin, G.; Paxton, W. F.; Dey, S. K.; Olson, M. A.; Benitez, D.; Tkatchouk, E.; Colvin, M. T.; Carmielli, R.; Caldwell, S. T.; Rosair, G. M.; Hewage, S. G.; Duclairoir, F.; Seymour, J. L.; Slawin, A. M. Z.; Goddard III, W. A.; Wasielewski, M. R.; Cooke, G.; Stoddart, J. F. Highly Stable Tetrathiafulvalene Radical Dimers in [3]Catenanes. *Nat. Chem.* 2010, 2, 870-879.

References of the Examples (1) (a) Schneebeli, S. T.; Frasconi, M.; Liu, Z. C.; Wu, Y. L.; Gardner, D. M.; Strutt, N. L.; Cheng, C. Y.; Carmieli, R.; Wasielewski, M. R.; Stoddart, J. F. Electron Sharing and Anion-π Recognition in Molecular Triangular Prisms. *Angew. Chem. Int. Ed.* 2013, 52, 13100-13104. (b) Liu, Z.; Liu, G.; Wu, Y.; Cao, D.; Sun, J.; Schneebeli, T. S.; Nassar, M. S.; Mirkin, A. C.; Stoddart, F. J. Assembly of Supramolecular Nanotubes from Molecular Triangles and 1,2-Dihalohydrocarbons *J. Am. Chem. Soc.* 2014, 136, 47, 16651-16660.

(2) Shukla, D.; Nelson, S. F.; Freeman, D. C.; Rajeswaran, M.; Ahearn, W. G.; Meyer, D. M.; Carey, J. T., Thin-Film Morphology Control in Naphthalene-Diimide-Based Semiconductors: High Mobility n-Type Semiconductor for Organic Thin-Film Transistors. *Chem. Mater.* 2008, 20, 7486-7491.

(3) Jaguar, version 9.8; Schrodinger Inc.: New York, 2017. Bochevarov, A. D.; Harder, E.; Hughes, T. F.; Greenwood, J. R.; Braden, D. A.; Philipp, D. M.; Rinaldo, D.; Halls, M. D.; Zhang, J.; Friesner, R. A. *Int. J. Quantum Chem.* 2013, 113, 2110-2142.

(4) Bruker (2008). APEX2 (Version 2008.1-0). Bruker AXS Inc., Madison, Wis., USA.

(5) Bruker (2001). SAINT-V6.28A. Data Reduction Software.

(6) Sheldrick, G. M. (1996). SADABS. Program for Empirical Absorption Correction. University of Gottingen, Germany.

(7) Bain, G. A.; Berry J. F. Diamagnetic Corrections and Pascal's Constants, *J. Chem. Educ.*, 2008, 85, 532-536.

(8) Dolomanov, O. V.; Bourhis, L. J.; Gildea, R. J.; Howard, J. A. K.; Puschmann, H., OLEX2: A Complete Structure Solution, Refinement and Analysis Program. *J. Appl. Crystallogr.* 2009, 42, 339-341.

(9) Sheldrick, G., SHELXT—Integrated Space-Group and Crystal-Structure Determination. *Acta. Cryst. A* 2015, 71, 3-8.

(10) Sheldrick, G. M. Crystal structure refinement with SHELXL, *Acta. Cryst.* C. 2015, 71, 3-8.

(11) Barnes, J. C.; Dale, E. J.; Prokofjevs, A.; Narayanan, A.; Gibbs-Hall, I. C.; Juriček, M.; Stern, C. L.; Sarjeant, A. A.; Botros, Y. Y.; Stupp, S. I.; Stoddart, J. F. Semiconducting Single Crystals Comprising Segregated Arrays of Complexes of C60. *J. Am. Chem. Soc.*, 2015, 137, 2392-2399.

The invention claimed is:

1. A crystalline composition comprising a plurality of tessellated rigid triangular macrocycles in a two-dimensional plane, wherein the rigid triangular macrocycle is NDI-Δ.

2. The crystalline composition of claim 1, wherein the crystalline composition has hexagonal symmetry in a plane.

3. The crystalline composition of claim 1, wherein each rigid triangular macrocycle of the crystalline composition interacts via face-to-face [π . . . π] interactions with three other rigid triangular macrocycles in the two-dimensional plane.

4. The crystalline composition of claim 1, wherein the crystalline composition has a molecular packing arrangement defined by space group P1 and has a molecular packing arrangement defined by unit cell dimensions a=8.7±0.1 Å, b=18.3±0.1 Å, c=18.9±0.1 Å, α=62.2±0.1°, β=85.0±0.1°, and γ=77.4±0.1°.

5. The crystalline composition of claim 1, wherein the crystalline composition has a molecular packing arrangement defined by space group $P6_2$ and has a molecular packing arrangement defined by unit cell dimensions a=34.5±0.1 Å, b=34.5±0.1 Å, c=8.5±0.1 Å, α=90.0±0.1°, β=90.0±0.1°, and γ=90.0±0.1°.

6. The crystalline composition of claim 1 further comprising a plurality of π-electron donors.

7. The crystalline composition of claim 6, wherein the π-electron donor is tetrathiafulvalene.

8. The crystalline composition of claim 6, wherein the rigid triangular macrocycle and the π-electron donor form a host-guest inclusion complex.

9. The crystalline composition of claim 8, wherein the crystalline composition has a molecular packing arrangement defined by space group P-1 and has a molecular packing arrangement defined by unit cell dimensions a=15.9±0.1 Å, b=16.0±0.1 Å, c=16.8±0.1 Å, α=69.4±0.1°, β=69.3±0.1°, and γ=71.0±0.1°.

10. The crystalline composition of claim 6, wherein the crystalline composition comprises two crystallographically distinct rigid triangular macrocycles.

11. The crystalline composition of claim 10, wherein crystalline composition has (i) a first layer comprising the rigid triangular macrocycle and the π-electron donor and (ii) a second layer comprising the rigid triangular macrocycle and lacking the π-electron donor.

12. The crystalline composition of claim 10, wherein the crystalline composition has a molecular packing arrangement defined by space group $P32_1$ and has a molecular packing arrangement defined by unit cell dimensions a=19.2±0.1 Å, b=19.2±0.1 Å, c=15.5±0.1 Å, α=90.0±0.1°, β=90.0±0.1°, and γ=90.0±0.1°.

13. The crystalline composition of claim 12, wherein the crystalline composition comprises a supramolecular triangle formed from π-electron donors.

14. The crystalline composition of claim 13, wherein the three π-electron donors of the supramolecular triangle have mixed-valence character.

15. The crystalline composition of claim 13, wherein the crystalline composition has a molecular packing arrangement defined by space group $P2_1/n$ and has a molecular packing arrangement defined by unit cell dimensions a=18.1±0.1 Å, b=15.6±0.1 Å, c=27.3±0.1 Å, α=90.0±0.1°, β=91.2±0.1°, and γ=90.0±0.1°.

16. A method for the preparation of a crystalline composition, the method comprising providing a solution comprising a rigid triangular macrocycle and a solvent;

and diffusing a precipitant or evaporating the solvent under conditions sufficient for the formation a crystalline composition comprising a plurality of tessellated rigid triangular macrocycles in a two-dimensional plane.

17. The method of claim 16, wherein the rigid triangular macrocycle is NDI-Δ.

18. The method of claim 16, wherein the solution further comprises a π-electron donor and wherein the crystalline composition comprises the plurality of tessellated rigid triangular macrocycles in a two-dimensional plane and a plurality of π-electron donors.

19. The method of claim 18, wherein the π-electron donor is tetrathiafulvalene.

* * * * *